(12) United States Patent
Yamaguchi et al.

(10) Patent No.: US 9,046,773 B2
(45) Date of Patent: *Jun. 2, 2015

(54) ACTINIC RAY-SENSITIVE OR RADIATION-SENSITIVE RESIN COMPOSITION, PATTERN FORMING METHOD USING THE SAME, POLYMERIZABLE COMPOUND AND POLYMER COMPOUND OBTAINED BY POLYMERIZING THE POLYMERIZABLE COMPOUND

(75) Inventors: Shuhei Yamaguchi, Shizuoka (JP); Yuko Yoshida, Shizuoka (JP); Akinori Shibuya, Shizuoka (JP); Michihiro Shirakawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 507 days.

This patent is subject to a terminal disclaimer.

(21) Appl. No.: 12/409,825

(22) Filed: Mar. 24, 2009

(65) Prior Publication Data

US 2009/0246695 A1  Oct. 1, 2009

(30) Foreign Application Priority Data

| Mar. 26, 2008 | (JP) | 2008-082237 |
| Mar. 26, 2008 | (JP) | 2008-082238 |
| Dec. 26, 2008 | (JP) | 2008-334108 |
| Dec. 26, 2008 | (JP) | 2008-334109 |
| Mar. 11, 2009 | (JP) | 2009-058580 |
| Mar. 11, 2009 | (JP) | 2009-058581 |

(51) Int. Cl.
| G03F 7/039 | (2006.01) |
| G03F 7/075 | (2006.01) |
| G03F 7/20 | (2006.01) |
| G03F 7/30 | (2006.01) |
| G03F 7/004 | (2006.01) |

(52) U.S. Cl.
CPC ............ *G03F 7/0397* (2013.01); *G03F 7/0046* (2013.01); *G03F 7/0758* (2013.01); *G03F 7/30* (2013.01); *G03F 7/0045* (2013.01); *G03F 7/2041* (2013.01)

(58) Field of Classification Search
None
See application file for complete search history.

(56) References Cited

U.S. PATENT DOCUMENTS

| 7,232,642 | B2 | 6/2007 | Takemoto et al. | |
| 8,450,041 | B2* | 5/2013 | Yamaguchi | 430/270.1 |
| 8,460,850 | B2* | 6/2013 | Sato et al. | 430/270.1 |
| 8,546,063 | B2* | 10/2013 | Tsubaki et al. | 430/296 |
| 8,617,785 | B2* | 12/2013 | Yamaguchi | 430/270.1 |
| 8,617,788 | B2* | 12/2013 | Kato et al. | 430/270.1 |
| 2003/0099901 | A1 | 5/2003 | Hatakeyama et al. | |
| 2005/0260525 | A1 | 11/2005 | Takemoto et al. | |
| 2007/0105045 | A1 | 5/2007 | Iwato et al. | |
| 2007/0178405 | A1 | 8/2007 | Kanda et al. | |
| 2007/0218401 | A1 | 9/2007 | Ando et al. | |
| 2008/0026331 | A1 | 1/2008 | Hasegawa et al. | |
| 2008/0268370 | A1* | 10/2008 | Tanaka et al. | 430/270.1 |
| 2008/0305429 | A1* | 12/2008 | Saegusa et al. | 430/270.1 |
| 2008/0311515 | A1* | 12/2008 | Mimura et al. | 430/285.1 |
| 2008/0319160 | A1 | 12/2008 | Inoue et al. | |
| 2009/0233242 | A1 | 9/2009 | Hasegawa et al. | |
| 2010/0216072 | A1* | 8/2010 | Tada et al. | 430/285.1 |
| 2010/0297555 | A1* | 11/2010 | Koyama et al. | 430/270.1 |
| 2012/0115085 | A1 | 5/2012 | Kanda et al. | |

FOREIGN PATENT DOCUMENTS

| EP | 1764647 A2 | 3/2007 |
| EP | 1925979 A1 | 5/2008 |
| JP | 2005-352466 A | 12/2005 |
| JP | 2007-156450 A | 6/2007 |
| JP | 2007-249192 A | 9/2007 |
| JP | 2007-304537 A | 11/2007 |
| JP | 2008-31298 A | 2/2008 |
| JP | 2008-129388 A | 6/2008 |
| JP | 2009-221111 A | 10/2009 |
| WO | 2007/037213 A1 | 4/2007 |
| WO | WO2009/035045 A1 * | 3/2009 |
| WO | 2009-107327 A1 | 9/2009 |

OTHER PUBLICATIONS

Extended European Search Report for Application No. 09156138.1 dated Jan. 18, 2010.
Office Action dated Oct. 25, 2010 in counterpart European Application No. 09156138.1.
Extended European Search Report dated May 24, 2012 issued by the European Patent Office in counterpart European Application No. 12159635.7.
Office Action dated Oct. 16, 2012 in Japanese Application No. JP 2009-058581.
Office Action dated Apr. 23, 2013, issued by the Japanese Patent Office in counterpart Japanese Application No. 2009-058580.
Office Action dated Oct. 22, 2013, issued by the Japanese Patent Office in counterpart Japanese Application No. 2009-058580.
Office Action dated Oct. 29, 2013 issued by the Taiwanese Patent Office in counterpart Taiwanese Patent Application No. 098109654.
Notification dated Oct. 22, 2013 and Information Offer Form dated Sep. 19, 2013 in Japanese Patent Application No. 2009-058581.
Office Action dated May 7, 2014, issued by the Taiwanese Patent Office in Taiwanese Application No. 098109654.

* cited by examiner

*Primary Examiner* — Sin Lee
(74) *Attorney, Agent, or Firm* — Sughrue Mion, PLLC

(57) ABSTRACT

An actinic ray-sensitive or radiation-sensitive resin composition and a pattern forming method using the composition are provided, the composition including (A) a resin containing a repeating unit having a group represented by formula (1) as defined in the specification, the resin being capable of increasing a solubility of the resin in an alkali developer by an action of an acid, and (B) a compound capable of generating an acid upon irradiation with an actinic ray or radiation; and a polymerizable compound represented by formula (M-1) as defined in the specification and a polymer compound obtained by polymerizing the polymerizable compound are provided.

18 Claims, 5 Drawing Sheets

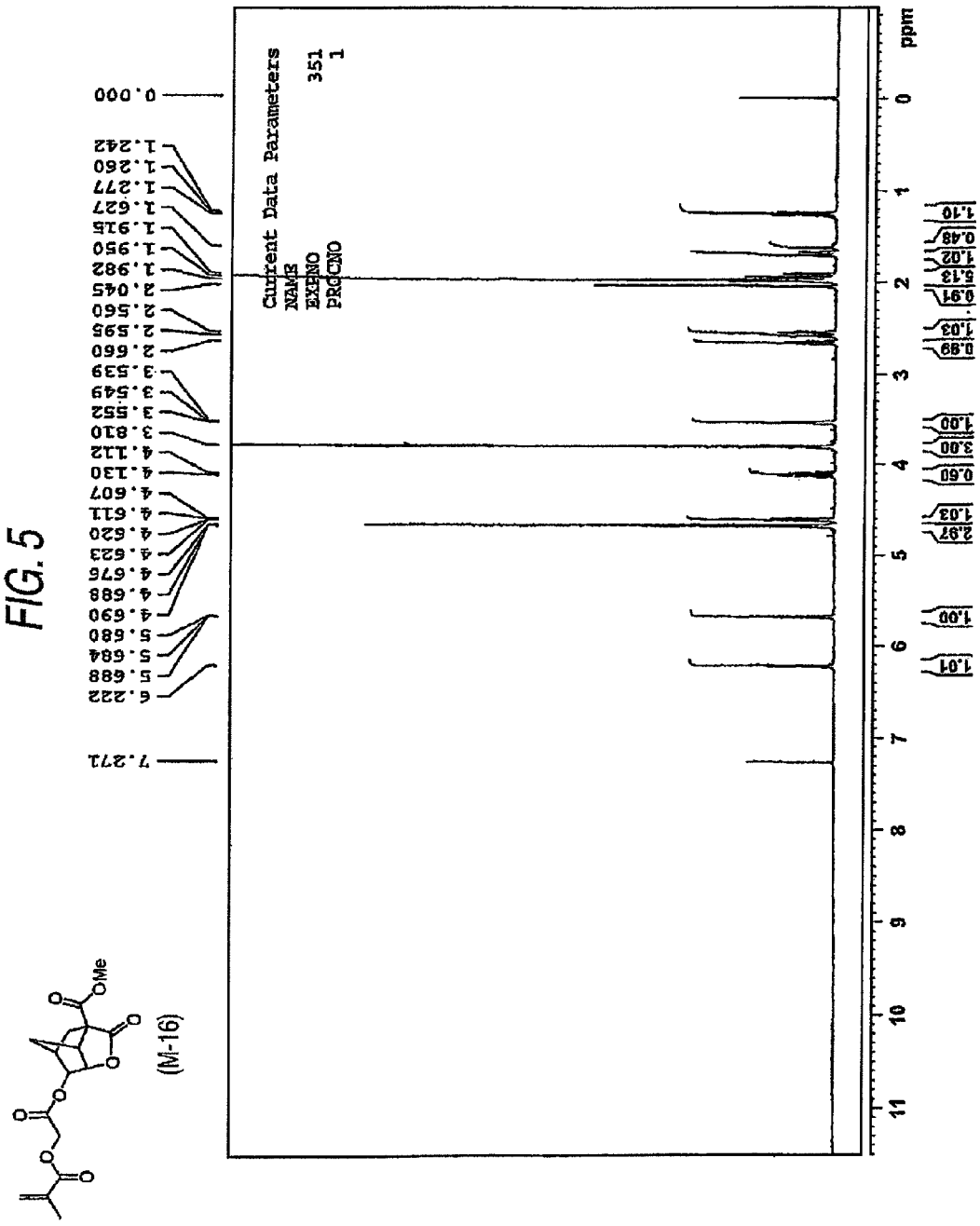

ACTINIC RAY-SENSITIVE OR RADIATION-SENSITIVE RESIN COMPOSITION, PATTERN FORMING METHOD USING THE SAME, POLYMERIZABLE COMPOUND AND POLYMER COMPOUND OBTAINED BY POLYMERIZING THE POLYMERIZABLE COMPOUND

BACKGROUND OF THE INVENTION

1. Field of the Invention

The present invention relates to an actinic ray-sensitive or radiation-sensitive resin composition that causes a reaction upon irradiation with an actinic ray or radiation to change in the property, and a pattern forming method using the composition. More specifically, the present invention relates to an actinic ray-sensitive or radiation-sensitive resin composition for use in the production process of a semiconductor such as IC, in the production of a circuit substrate of liquid crystal, thermal head or the like, in other photofabrication processes, or in the lithographic printing plate or acid-curable composition, and a pattern forming method using the composition.

The present invention also relates to a novel polymerizable compound useful as a raw material of a polymer compound for use in the production of a semiconductor such as IC, in the production of a circuit substrate of liquid crystal, thermal head or the like, or in other photofabrication processes, and a polymer compound having a unit corresponding to the polymerizable compound. More specifically, the present invention relates to a novel polymerizable compound useful as a raw material of a polymer compound for use in the process where a far ultraviolet ray or the like at 250 nm or less, preferably 220 nm or less, is used as the exposure light source or an electron beam or the like is used as the irradiation source, and a corresponding polymer compound.

2. Description of the Related Art

The chemical amplification resist forms a pattern on a substrate by generating an acid in the exposed area when irradiated with radiation such as far ultraviolet light and through a reaction using the acid as the catalyst, causing the area irradiated with actinic radiation and the non-irradiated area to change in the solubility for a developer.

In the case of using a KrF excimer laser as the exposure light source, a resin having small absorption in the region of 248 nm and having a basic skeleton of poly(hydroxystyrene) is primarily used as the main component and this is an excellent system capable of forming a good pattern with high sensitivity and high resolution as compared with conventional naphthoquinone-diazide/novolak resin systems.

In the case of using a light source of emitting light at shorter wavelengths, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, various resists containing an alicyclic hydrocarbon structure have been developed for use with an ArF excimer laser. However, in view of integrated performance as a resist, it is very difficult at present to find out an appropriate combination for the resin, photoacid generator, additive, solvent and the like used. Moreover, at the time of forming a fine pattern with a line width of 100 nm or less, improvements in terms of the line edge roughness performance and resolution of a line pattern are being demanded.

As already discovered, the line edge roughness performance can be enhanced by incorporating a repeating unit having a specific lactone structure into the above-described resin having an alicyclic hydrocarbon structure. For example, JP-A-2005-352466 (the term "JP-A" as used herein means an "unexamined published Japanese patent application") describes a resist composition using a resin containing a repeating unit having a spacer-type norbornane structure, and JP-A-2007-156450 describes a resist composition using a resin containing a repeating unit having a cyano group and a norbornane structure.

However, in view of integrated performance as a resist, suppression of pattern variation attributable to fluctuation in the focus position at the exposure (defocus latitude: DOF) and reduction in the development defect are demanded.

As described above, a polymer compound comprising a repeating unit having a spacer-type norbornane skeleton is described in JP-A-2005-352466 (the term "JP-A" as used herein means an "unexamined published Japanese patent application"), and a polymer compound comprising a repeating unit having a cyano group and a norbornane structure is described in International Publication No. 07/037213, pamphlet.

However, the repeating unit having a spacer-type norbornane skeleton has a problem in the affinity for a developer, whereas in the case where a cyano group is introduced into a norbornane structure, solubility in a solvent used for resists in general is insufficient.

SUMMARY OF THE INVENTION

The present invention has been made under these circumstances, and an object of the present invention is to provide an actinic ray-sensitive or radiation-sensitive resin composition improved in the DOF and development defect, a pattern forming method using the composition, a polymer compound which is used for fine pattern formation in the production of a semiconductor and excellent in the solvent solubility and affinity for developer, and a novel polymerizable compound for the production of the polymer compound.

The present invention is as follows.

(1) An actinic ray-sensitive or radiation-sensitive resin composition, comprising:

(A) a resin containing a repeating unit having a group represented by formula (1), the resin being capable of increasing a solubility of the resin in an alkali developer by an action of an acid; and (B) a compound capable of generating an acid upon irradiation with an actinic ray or radiation:

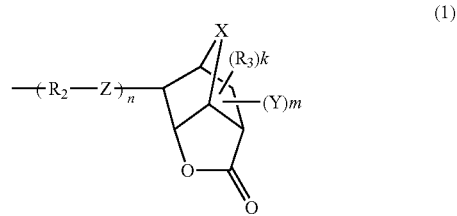

(1)

wherein $R_2$ represents a chain or cyclic alkylene group which may have a substituent, and when a plurality of $R_2$'s are present, the plurality of $R_2$'s are the same or different;

$R_3$ represents an alkyl group which may have a substituent or a cycloalkyl group which may have a substituent, and when a plurality of $R_3$'s are present, the plurality of $R_3$'s are the same or different, and two $R_3$'s may combine to form a ring;

X represents an alkylene group which may have a substituent, an oxygen atom or a sulfur atom;

Y represents an electron-withdrawing group, and when a plurality of Y's are present, the plurality of Y's are the same or different;

Z represents a single bond, an ether bond, an ester bond, an amide bond, a urethane bond or a urea bond, and when a plurality of Z's are present, the plurality of Z's are the same or different;

k is the number of substituents and represents an integer of 0 to 8;

n is the number of repetitions and represents an integer of 1 to 5; and m is the number of substituents and represents an integer of 1 to 7.

(2) The actinic ray-sensitive or radiation-sensitive resin composition as described in (1) above, wherein the resin as the component (A) contains a repeating unit represented by formula (2):

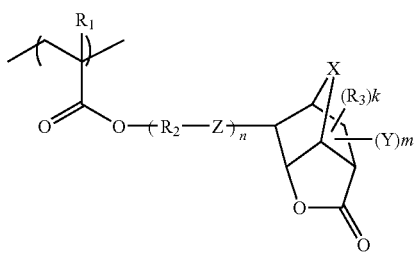

(2)

wherein $R_1$ represents a hydrogen atom, an alkyl group which may have a substituent, or a halogen atom;

$R_2$ represents a chain or cyclic alkylene group which may have a substituent, and when a plurality of $R_2$'s are present, the plurality of $R_2$'s are the same or different;

$R_3$ represents an alkyl group which may have a substituent or a cycloalkyl group which may have a substituent, and when a plurality of $R_3$'s are present, the plurality of $R_3$'s are the same or different, and two $R_3$'s may combine to form a ring;

X represents an alkylene group which may have a substituent, an oxygen atom or a sulfur atom;

Y represents an electron-withdrawing group, and when a plurality of Y's are present, the plurality of Y's are the same or different;

Z represents a single bond, an ether bond, an ester bond, an amide bond, a urethane bond or a urea bond, and when a plurality of Z's are present, the plurality of Z's are the same or different;

k is the number of substituents and represents an integer of 0 to 8;

n is the number of repetitions and represents an integer of 1 to 5; and m is the number of substituents and represents an integer of 1 to 7.

(3) The actinic ray-sensitive or radiation-sensitive resin composition as described in (1) or (2) above, wherein the resin as the component (A) contains a repeating unit represented by formula (3):

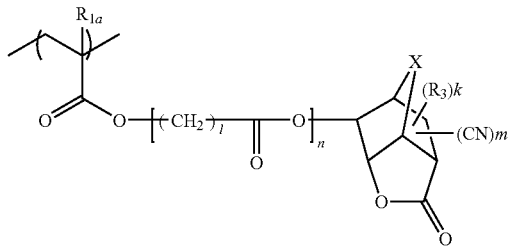

(3)

wherein $R_{1a}$ represents a hydrogen atom or an alkyl group which may have a substituent;

$R_3$ represents an alkyl group which may have a substituent or a cycloalkyl group which may have a substituent, and when a plurality of $R_3$'s are present, the plurality of $R_3$'s are the same or different, and two $R_3$'s may combine to form a ring;

X represents an alkylene group which may have a substituent, an oxygen atom or a sulfur atom;

k is the number of substituents and represents an integer of 0 to 8;

l is the number of repetitions and represents an integer of 1 to 5;

n is the number of repetitions and represents an integer of 1 to 5; and m is the number of substituents and represents an integer of 1 to 7.

(4) A pattern forming method, comprising:

forming a film from the actinic ray-sensitive or radiation-sensitive resin composition as described in any one of (1) to (3) above; and exposing and developing the film.

(5) A polymerizable compound represented by formula (M-1):

Formula (M-1):

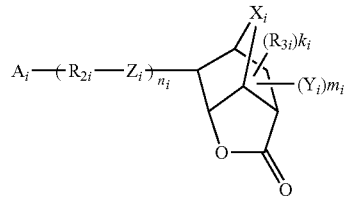

wherein $A_i$ represents a polymerizable site;

$R_{2i}$ represents a chain or cyclic alkylene group which may have a substituent, and when a plurality of $R_{2i}$'s are present, the plurality of $R_{2i}$'s are the same or different;

$R_{3i}$ represents an alkyl group which may have a substituent or a cycloalkyl group which may have a substituent, and when a plurality of $R_{3i}$'s are present, the plurality of $R_{3i}$'s are the same or different, and two $R_{3i}$'s may combine to form a ring;

$X_i$ represents an alkylene group which may have a substituent, an oxygen atom or a sulfur atom;

$Y_i$ represents an electron-withdrawing group, and when a plurality of $Y_i$'s are present, the plurality of $Y_i$'s are the same or different;

$Z_i$ represents a single bond, an ether bond, an ester bond, an amide bond, a urethane bond or a urea bond, and when a plurality of $Z_i$'s are present, the plurality of $Z_i$'s are the same or different;

$k_i$ is the number of substituents and represents an integer of 0 to 8;

$n_i$ is the number of repetitions and represents an integer of 1 to 5; and $m_i$ is the number of substituents and represents an integer of 1 to 7.

(6) The polymerizable compound as described in (5) above, which is represented by formula (M-2):

Formula (M-2):

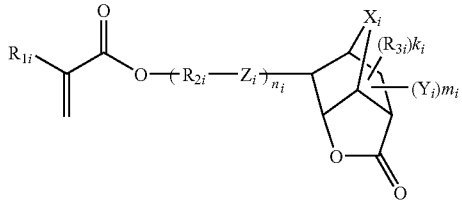

wherein $R_{1i}$ represents a hydrogen atom, an alkyl group which may have a substituent, or a halogen atom;

$R_{2i}$ represents a chain or cyclic alkylene group which may have a substituent, and when a plurality of $R_{2i}$'s are present, the plurality of $R_{2i}$'s are the same or different;

$R_{3i}$ represents an alkyl group which may have a substituent or a cycloalkyl group which may have a substituent, and when a plurality of $R_{3i}$'s are present, the plurality of $R_{3i}$'s are the same or different, and two $R_{3i}$'s may combine to form a ring;

$X_i$ represents an alkylene group which may have a substituent, an oxygen atom or a sulfur atom;

$Y_i$ represents an electron-withdrawing group, and when a plurality of $Y_i$'s are present, the plurality of $Y_i$'s are the same or different;

$Z_i$ represents a single bond, an ether bond, an ester bond, an amide bond, a urethane bond or a urea bond, and when a plurality of $Z_i$'s are present, the plurality of $Z_i$'s are the same or different;

$k_i$ is the number of substituents and represents an integer of 0 to 8;

$n_i$ is the number of repetitions and represents an integer of 1 to 5; and $m_i$ is the number of substituents and represents an integer of 1 to 7.

(7) The polymerizable compound as described in (5) or (6) above, which is represented by formula (M-3):

Formula (M-3):

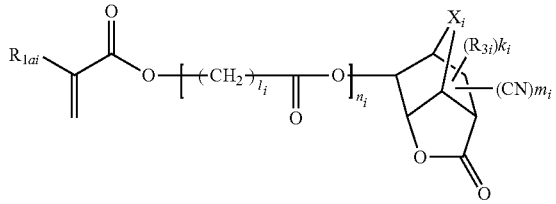

wherein $R_{1ai}$ represents a hydrogen atom, a methyl group, a hydroxymethyl group, a halogenated methyl group or a halogen atom;

$R_{3i}$ represents an alkyl group which may have a substituent or a cycloalkyl group which may have a substituent, and when a plurality of $R_{3i}$'s are present, the plurality of $R_{3i}$'s are the same or different, and two $R_{3i}$'s may combine to form a ring;

$X_i$ represents an alkylene group which may have a substituent, an oxygen atom or a sulfur atom;

$k_i$ is the number of substituents and represents an integer of 0 to 8;

$l_i$ is the number of repetitions and represents an integer of 1 to 5;

$n_i$ is the number of repetitions and represents an integer of 1 to 5; and $m_i$ is the number of substituents and represents an integer of 1 to 7.

(8) A polymer compound, which is obtained by polymerizing the polymerizable compound as described in any one of (5) to (7) above.

(9) The pattern forming method as described in (4) above, wherein the film formed from the actinic ray-sensitive or radiation-sensitive resin composition is exposed through an immersion medium.

BRIEF DESCRIPTION OF THE DRAWINGS

FIG. 5 is an NMR chart of Compound (M-16).

DETAILED DESCRIPTION OF THE INVENTION

Figure 1:
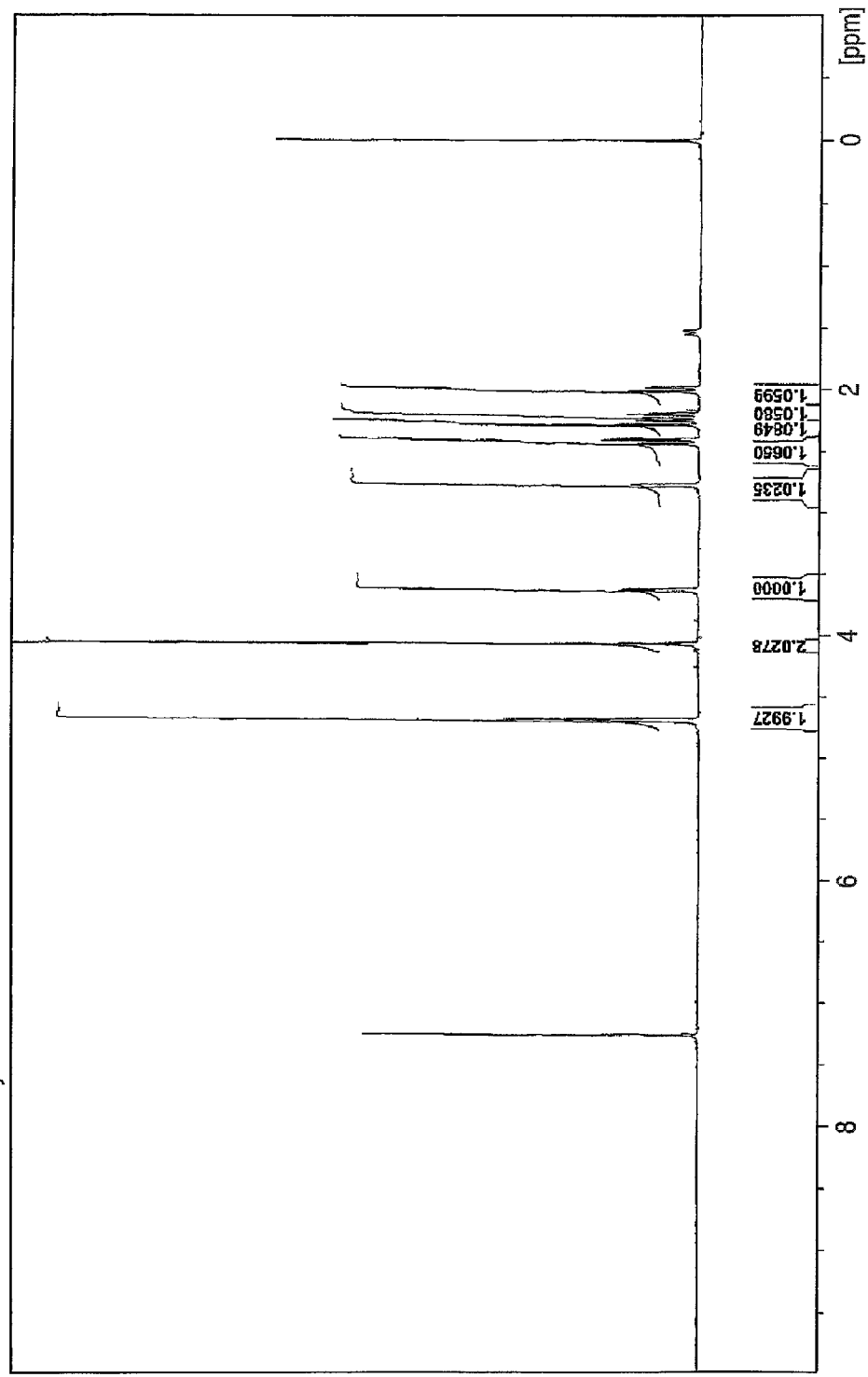
FIG. 1 is an NMR chart of Compound (M-2)
Figure 2:
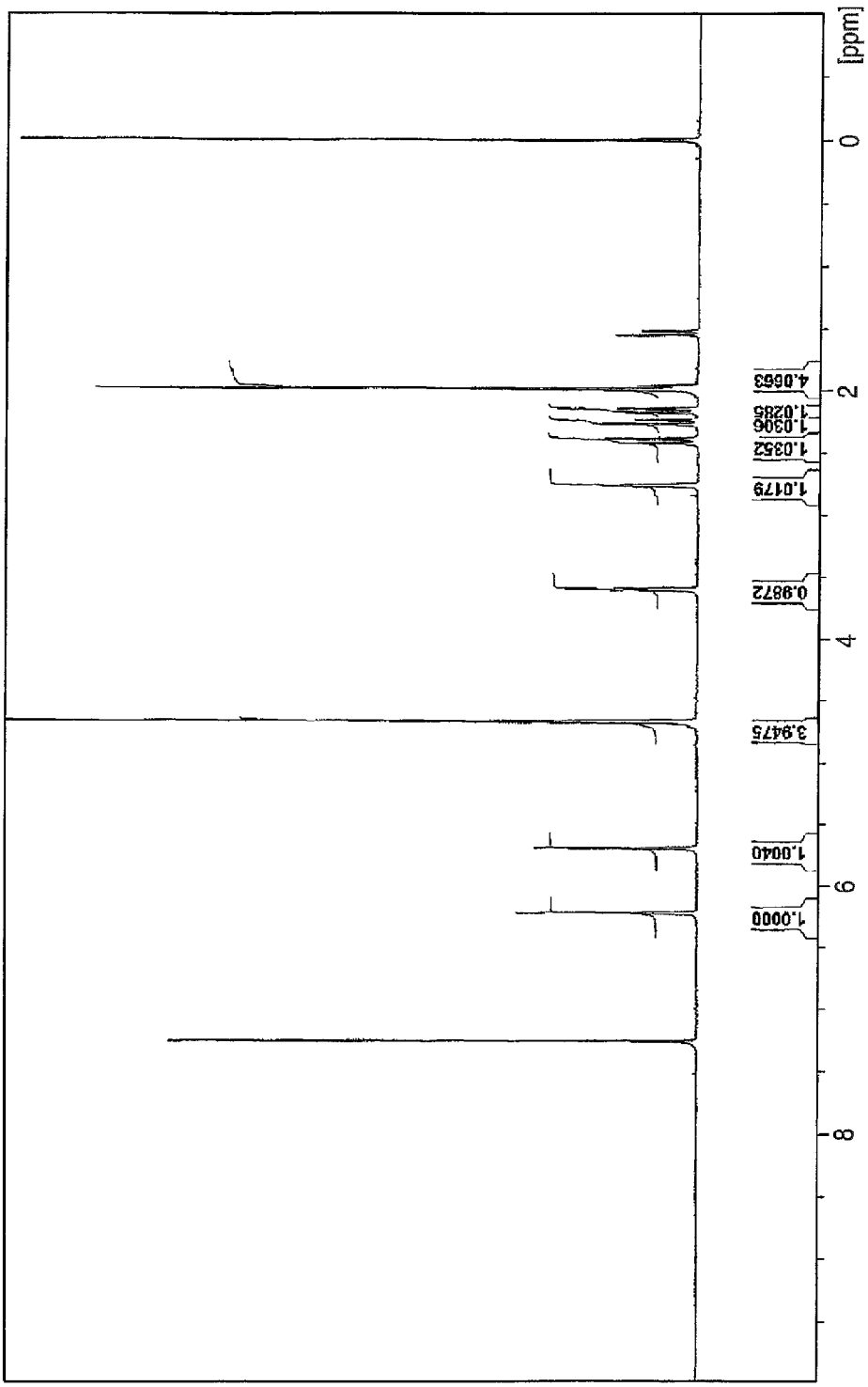
FIG. 2 is an NMR chart of Compound (M-3)
Figure 3:
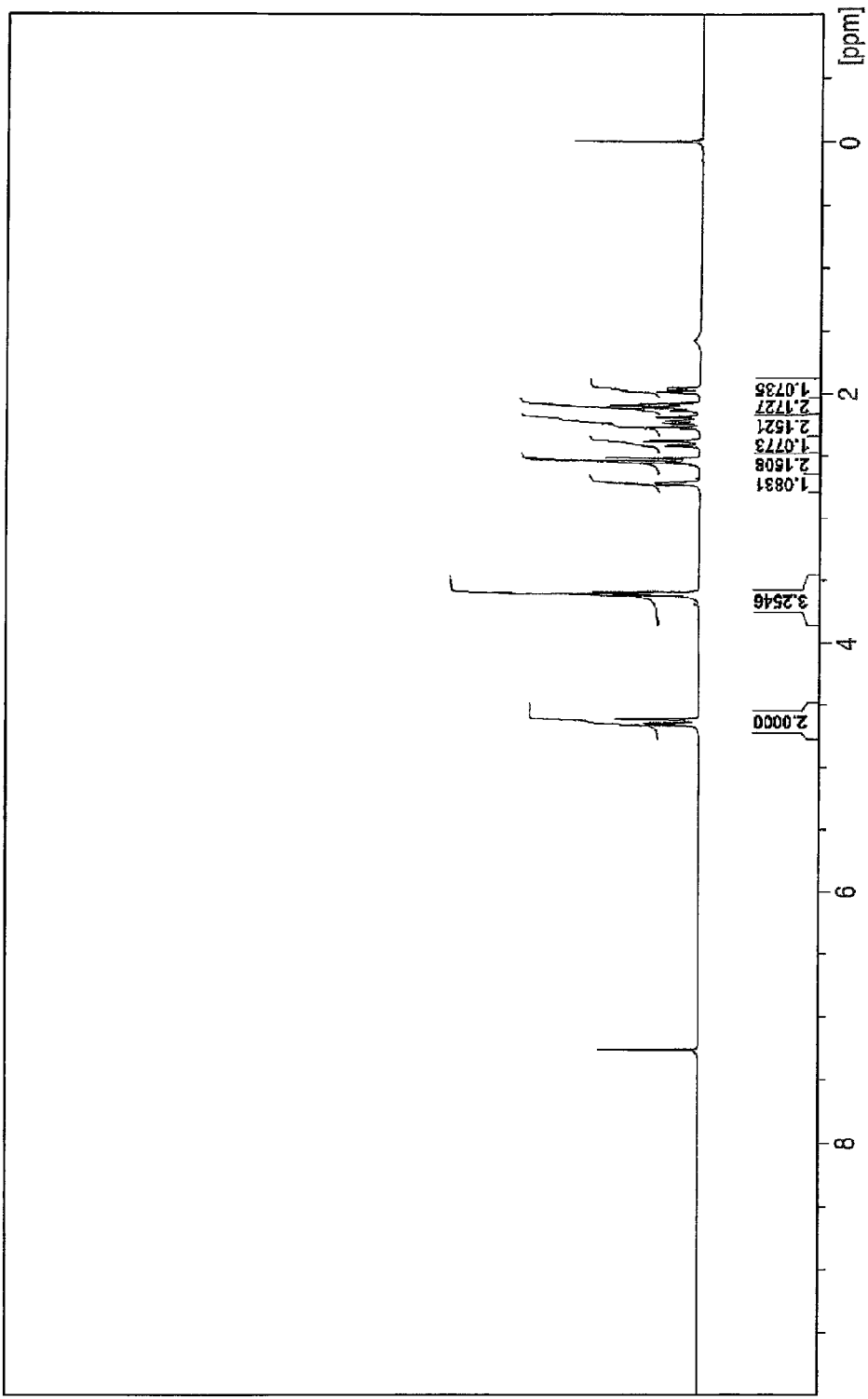
FIG. 3 is an NMR chart of Compound (M-11)
Figure 4:
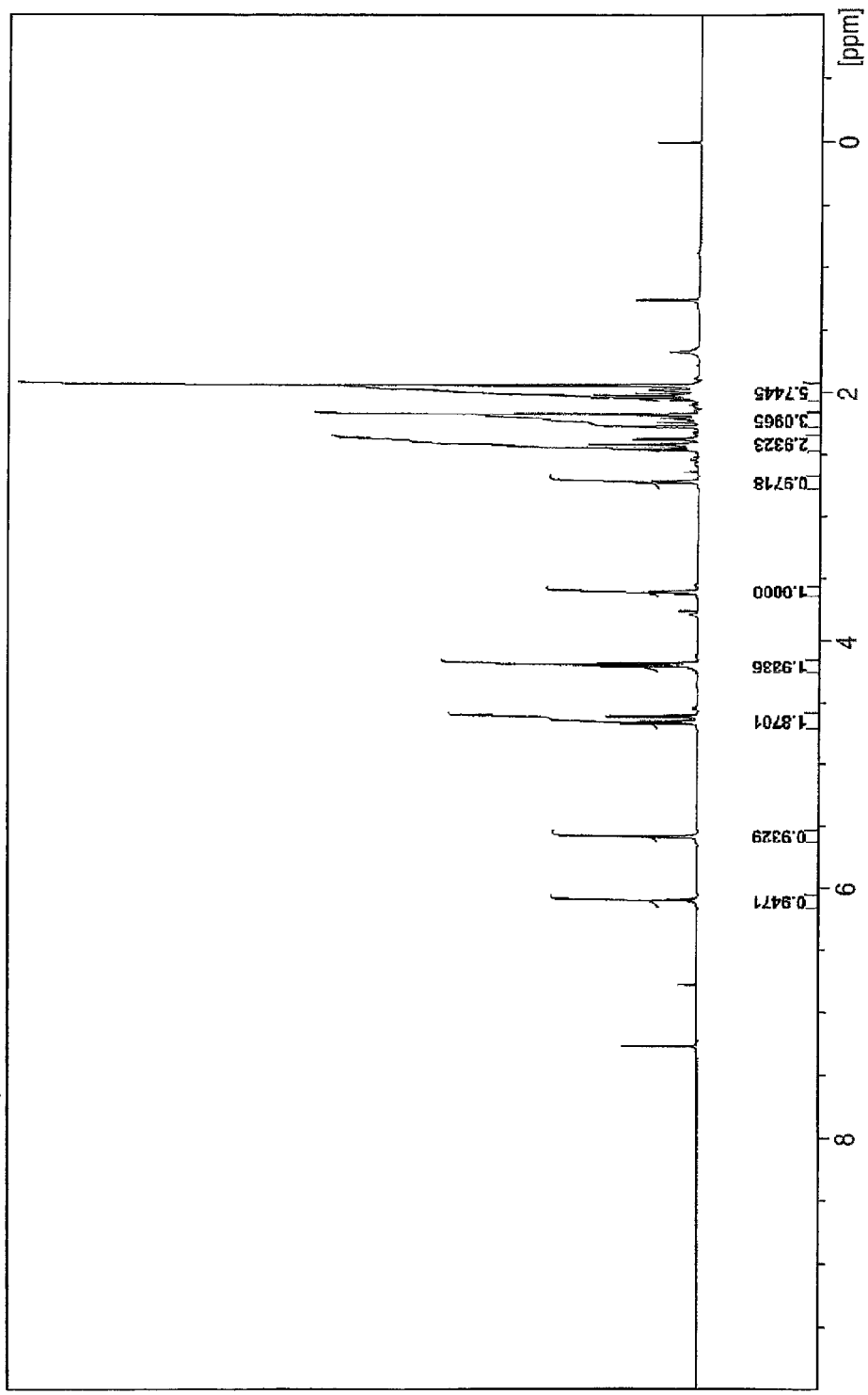
FIG. 4 is an NMR chart of Compound (M-12)

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin Containing a Repeating Unit Containing a Group having a Lactone Structure Represented by Formula (1) and Being Capable of Increasing the Solubility in an Alkali Developer by the Action of an Acid The resin as the component (A) is a resin capable of increasing the solubility in an alkali developer by the action of an acid, and this resin has a repeating unit containing a group having a lactone structure represented by formula (1) and at the same time, has a group capable of decomposing by the action of an acid to produce an alkali-soluble group (hereinafter, sometimes referred to as an "acid-decomposable group"), in the main or side chain of the resin or in both the main chain and the side chain (acid-decomposable resin).

The resin as the component (A) has a repeating unit containing a group having a lactone structure represented by the following formula (1):

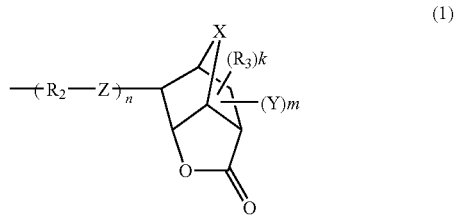

In formula (1), $R_2$ represents, when a plurality of $R_2$'s are present, each independently represents, a chain or cyclic alkylene group which may have a substituent.

$R_3$ represents, when a plurality of $R_3$'s are present, each independently represents, an alkyl group which may have a substituent, or a cycloalkyl group which may have a substituent, and when a plurality of $R_3$'s are present, two $R_3$'s may combine to form a ring.

X represents an alkylene group which may have a substituent, an oxygen atom or a sulfur atom.

Y represents, when a plurality of Y's are present, each independently represents, an electron-withdrawing group.

Z represents, when a plurality of Z's are present, each independently represents, a single bond, an ether bond, an ester bond, an amide bond, a urethane bond or a urea bond.

k is the number of substituents and represents an integer of 0 to 8.

n is the number of repetitions and represents an integer of 1 to 5.

m is the number of substituents and represents an integer of 1 to 7.

The group represented by $R_2$ is not particularly limited as long as it is a chain alkylene group or a cyclic alkylene group, but the chain alkylene group is preferably a chain alkylene group having a carbon number of 1 to 10, more preferably from 1 to 5, and examples thereof include a methylene group, an ethylene group and a propylene group. The cyclic alkylene group is preferably a cyclic alkylene group having a carbon number of 1 to 20, and examples thereof include cyclohexylene, cyclopentylene, norbornylene and adamantylene. The group represented by $R_2$ is preferably a chain alkylene, more preferably a methylene group. The chain alkylene group and cyclic alkylene group may have a substituent without any particular limitation. Examples of the substituent on the chain alkylene group and cyclic alkylene group include a halogen atom such as fluorine atom, chlorine atom and bromine atom, a mercapto group, a hydroxy group, an alkoxy group such as methoxy group, ethoxy group, isopropoxy group, a tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group. In the case where n is 2 or more, each group represented by $R_2$ may be independently the same as or different from every other groups.

The alkyl group represented by $R_3$ is preferably an alkyl group having a carbon number of 1 to 30, more preferably a linear or branched alkyl group having a carbon number of 1 to 15, and specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

The cycloalkyl group as $R_3$ is preferably a cycloalkyl group having a carbon number of 3 to 20 and may be polycyclic or may have an oxygen atom in the ring. Specific examples thereof include a cyclopropyl group, a cyclopentyl group, a cyclohexyl group, a norbornyl group and an adamantyl group.

The alkyl group and cycloalkyl group of $R_3$ may have a substituent. Examples of the substituent on the alkyl group and cycloalkyl group include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group. In the case where a plurality of $R_3$'s are present, two $R_3$'s may combine to form a ring (preferably a cycloalkylene group).

X represents an alkylene group which may have a substituent, an oxygen atom or a sulfur atom. The alkylene group which may have a substituent is preferably an alkylene group having a carbon number of 1 to 2, and examples thereof include a methylene group and an ethylene group. Examples of the substituent on the alkylene group include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group.

Examples of the electron-withdrawing group of Y include a cyano group, a nitro group, a carboxyl group, a hydroxy group, an alkyl halide group (preferably having a carbon number of 10 or less), an alkoxycarbonyl group (preferably having a carbon number of 10 or less), an alkylsulfonyl group (preferably having a carbon number of 10 or less) and an alkoxy group which may have a substituent. The alkoxy group is preferably an alkoxy group having a carbon number of 1 to 10, such as methoxy group, ethoxy group, isopropoxy group, tert-butoxy group and benzoyloxy group. Examples of the substituent on the alkoxy group include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group. Y is preferably a cyano group, a nitro group, a hydroxy group or an alkyl halide group, more preferably a cyano group. The substitution position of Y is most preferably a position shown below.

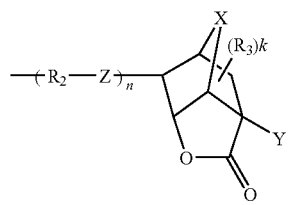

The group represented by Z is a single bond, an ether bond, an ester bond, an amide bond, a urethane bond or a urea bond, more preferably a single bond, an ether bond or an ester bond, still more preferably an ester bond. Z may be positioned on whichever side, endo side or exo side, of the norbornane skeleton.

k is the number of substituents and represents an integer of 0 to 8, preferably from 0 to 5, more preferably from 0 to 3. n is the number of repetitions and represents an integer of 1 to 5, preferably 1 or 2, and most preferably 1. m is the number of substituents and represents an integer of 1 to 7, preferably from 1 to 5, more preferably from 1 to 3, and most preferably 1.

The repeating unit containing a group having a lactone structure represented by formula (1) is preferably a repeating unit represented by the following formula (2):

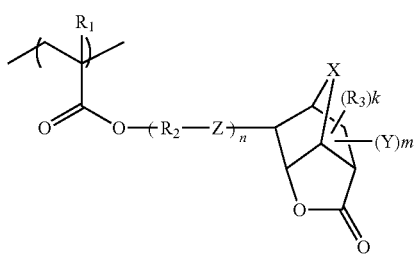

(2)

In formula (2), $R_1$ represents a hydrogen atom, an alkyl group which may have a substituent, or a halogen atom.

$R_2$ represents, when a plurality of $R_2$'s are present, each independently represents, a chain or cyclic alkylene group which may have a substituent.

$R_3$ represents, when a plurality of $R_3$'s are present, each independently represents, an alkyl group which may have a substituent, or a cycloalkyl group which may have a substituent, and when a plurality of $R_3$'s are present, two $R_3$'s may combine to form a ring.

X represents an alkylene group which may have a substituent, an oxygen atom or a sulfur atom.

Y represents, when a plurality of Y's are present, each independently represents, an electron-withdrawing group.

Z represents, when a plurality of Z's are present, each independently represents, a single bond, an ether bond, an ester bond, an amide bond, a urethane bond or a urea bond.

k is the number of substituents and represents an integer of 0 to 8.

n is the number of repetitions and represents an integer of 1 to 5.

m is the number of substituents and represents an integer of 1 to 7.

$R_2$, $R_3$, X, Y, Z, k, n and m in formula (2) have the same meanings as $R_2$, $R_3$, X, Y, Z, k, n and m in formula (1).

The alkyl group of $R_1$ is preferably an alkyl group having a carbon number of 1 to 5, more preferably a methyl group. The alkyl group may have a substituent. Preferred examples of the substituent on the alkyl group include a halogen atom, a hydroxyl group, and an alkoxy group such as methoxy group, ethoxy group, isopropoxy group, tert-butoxy group and benzyloxy group. The group particularly preferred as $R_1$ is a hydrogen atom, a methyl group, a hydroxymethyl group or a trifluoromethyl group.

The repeating unit containing a group having a lactone structure represented by formula (1) is more preferably a repeating unit represented by the following formula (3):

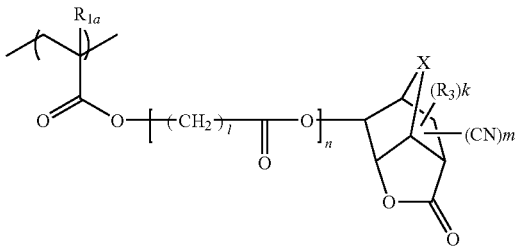

(3)

In formula (3), $R_{1a}$ represents a hydrogen atom or an alkyl group which may have a substituent.

When $R_{1a}$ is an alkyl group (preferably having a carbon number of 1 to 10), the alkyl group may have a substituent, and examples of the substituent include a halogen atom such as fluorine atom, chlorine atom and bromine atom, and a hydroxy group.

$R_{1a}$ is preferably an unsubstituted methyl group.

$R_3$ represents, when a plurality of $R_3$'s are present, each independently represents, an alkyl group which may have a substituent, or a cycloalkyl group which may have a substituent, and when a plurality of $R_3$'s are present, two $R_3$'s may combine to form a ring.

X represents an alkylene group which may have a substituent, an oxygen atom or a sulfur atom.

k is the number of substituents and represents an integer of 0 to 8.

l is the number of repetitions and represents an integer of 1 to 5.

n is the number of repetitions and represents an integer of 1 to 5.

m is the number of substituents and represents an integer of 1 to 7.

$R_3$, X, k, n and m in formula (3) have the same meanings as $R_3$, X, k, n and m in formula (1).

The halogenated methyl group of $R_{1a}$ is preferably a trifluoromethyl group.

The group particularly preferred as $R_{1a}$ is a hydrogen atom, a methyl group, a hydroxymethyl group or a trifluoromethyl group.

l is the number of repetitions of the methylene group and represents an integer of 1 to 5, preferably an integer of 1 to 3, more preferably 1.

The content of the repeating unit containing a group having a lactone structure represented by formula (1) is preferably from 15 to 70 mol %, more preferably from 20 to 50 mol %, still more preferably from 30 to 50 mol %, based on all repeating units in the polymer.

In view of developability, the repeating unit containing a group having a lactone structure is preferably in a range of ±20 mol % of the molar ratio (mol %) of the acid-decomposable repeating unit.

Specific examples of the repeating unit containing a group having a lactone structure represented by formula (1) are set forth below, but the present invention is not limited thereto.

In the following specific examples, $R_1$ represents a hydrogen atom, an alkyl group which may have a substituent, or a halogen atom and is preferably a hydrogen atom, a methyl group, a hydroxymethyl group, a trifluoromethyl group or a halogen atom.

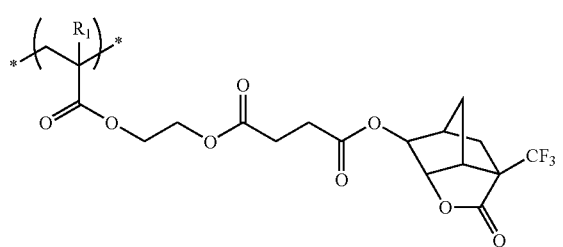
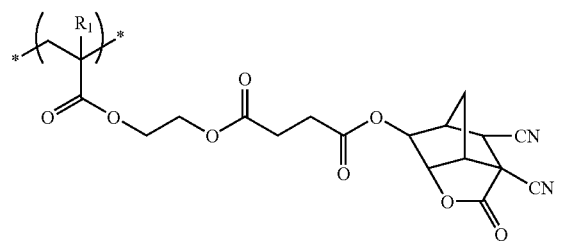
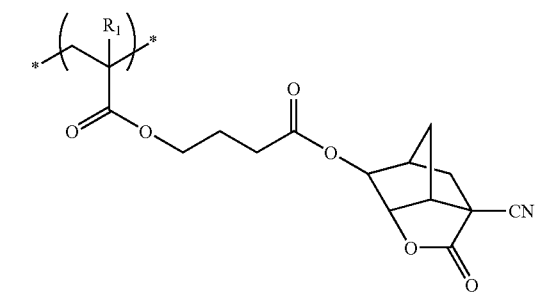
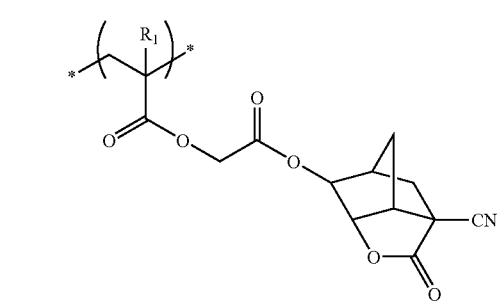
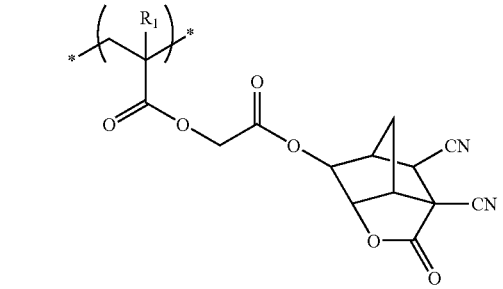
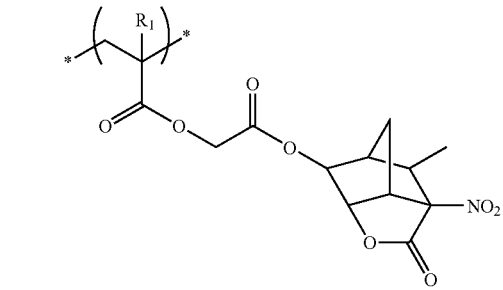
-continued
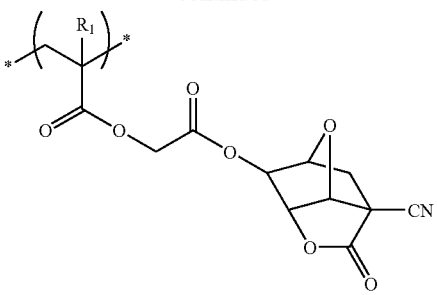
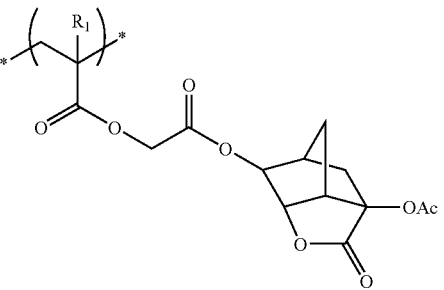
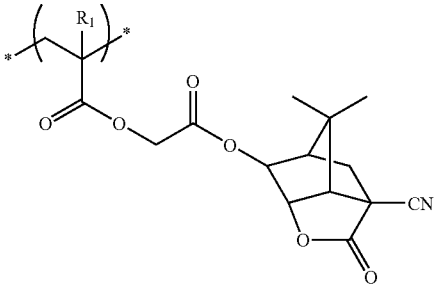
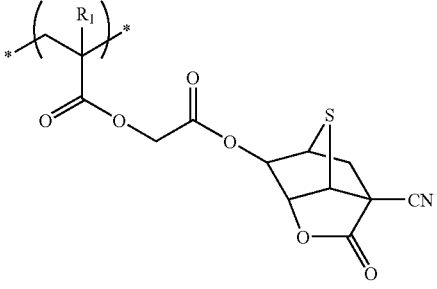
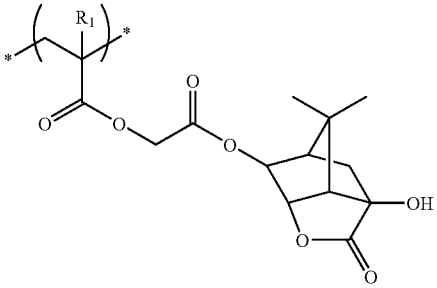
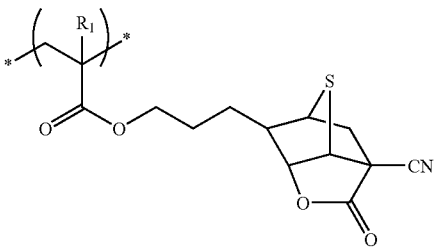

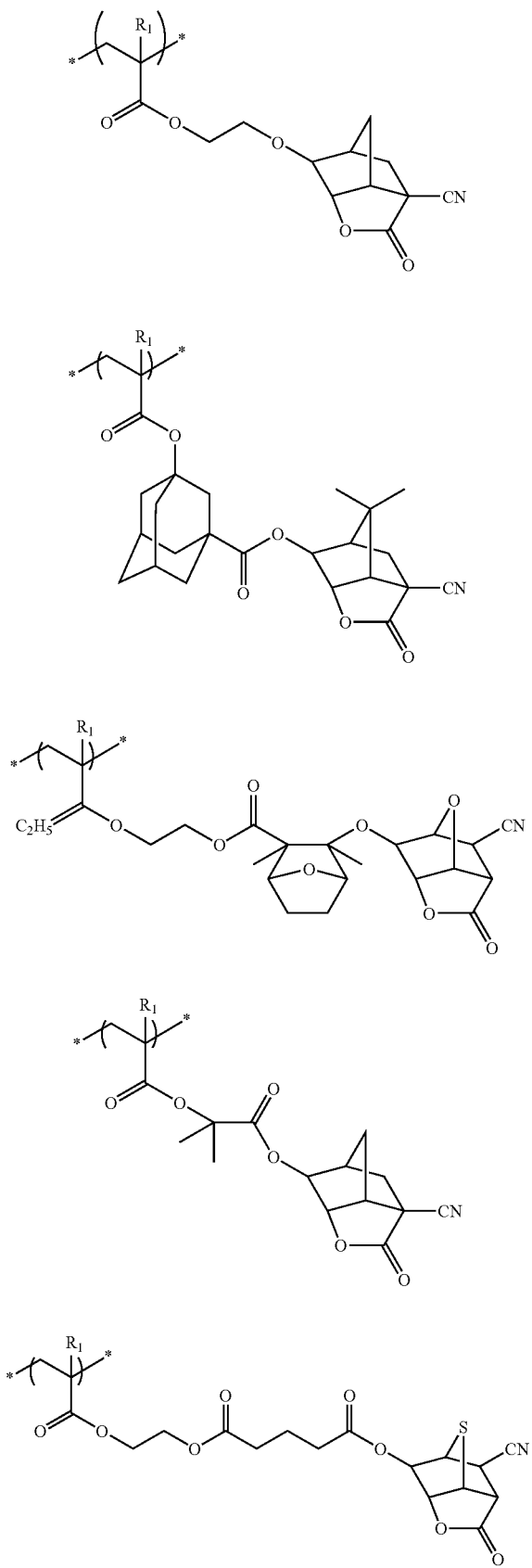
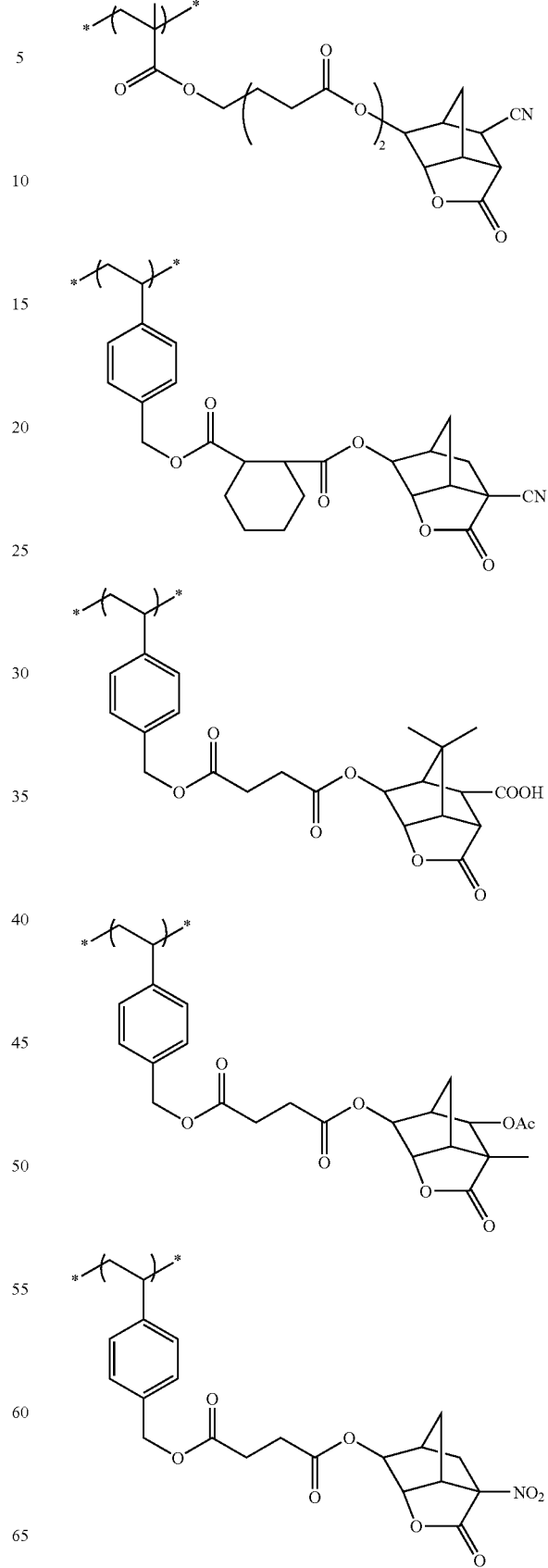

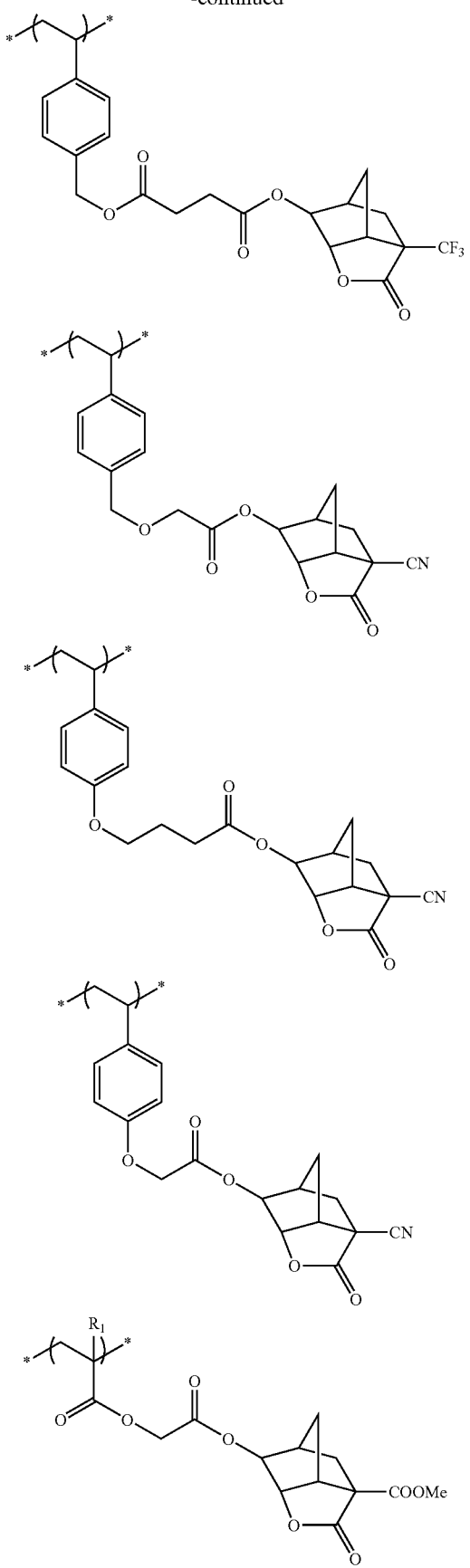
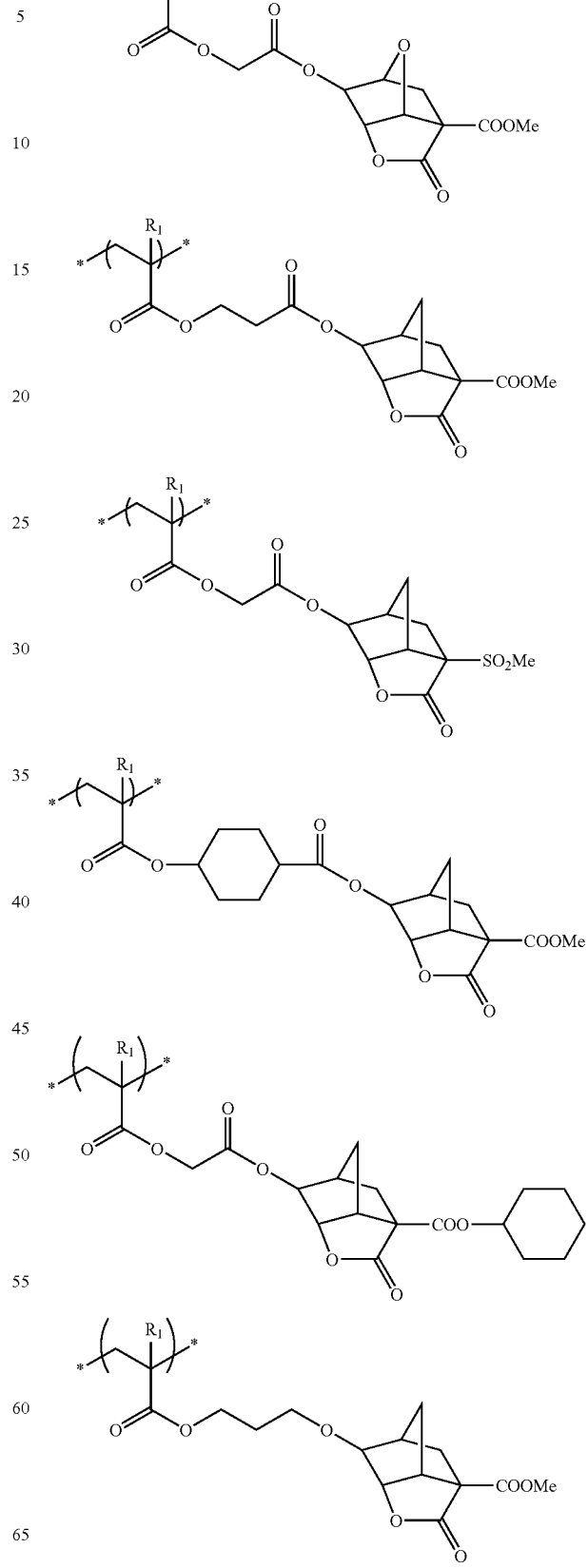

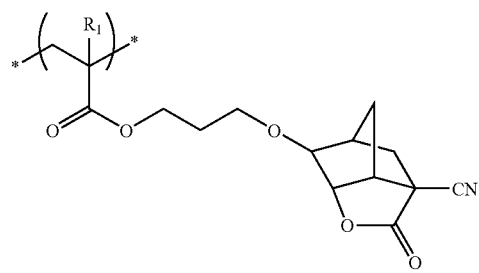
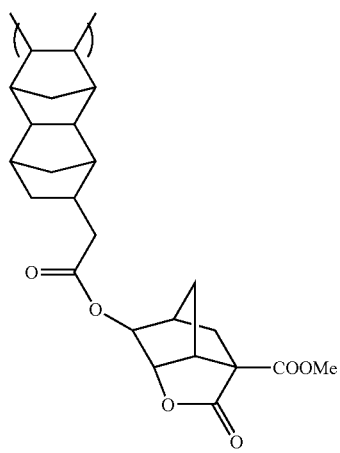
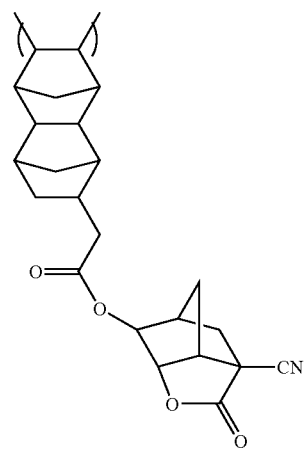
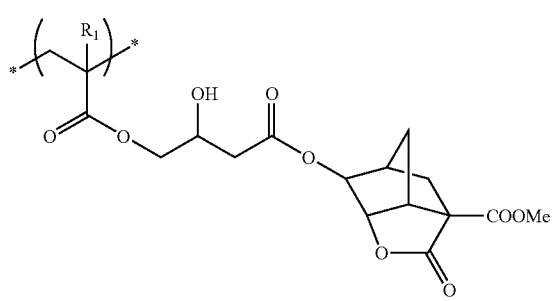
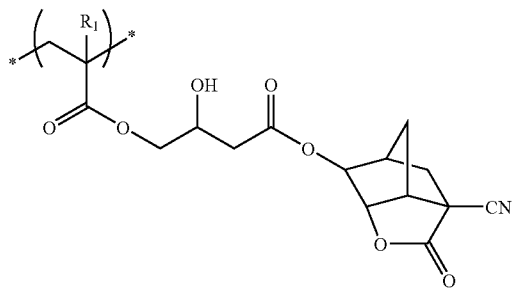
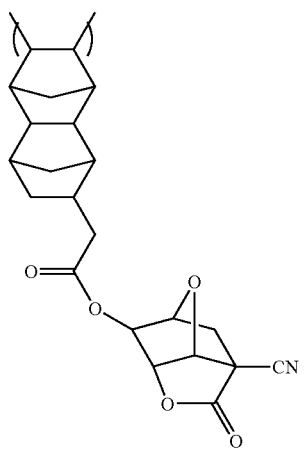
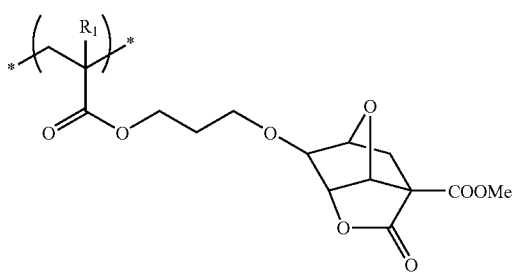
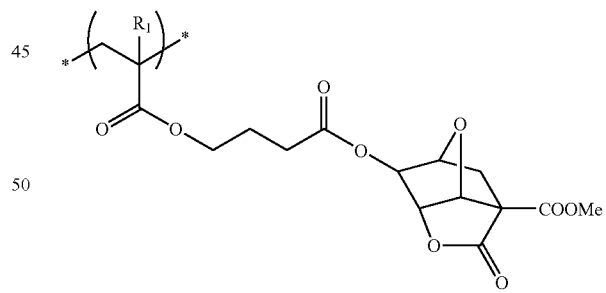
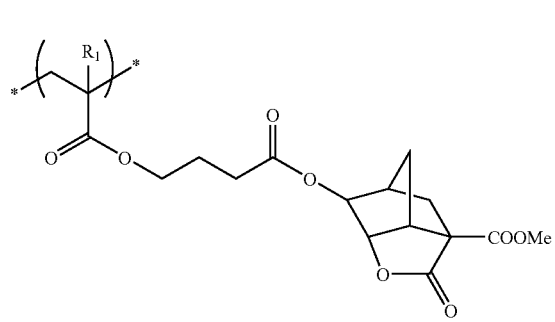

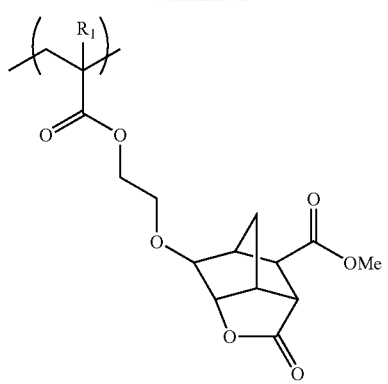
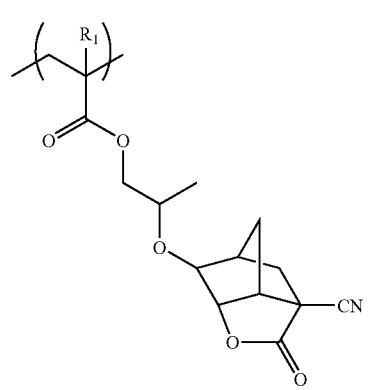
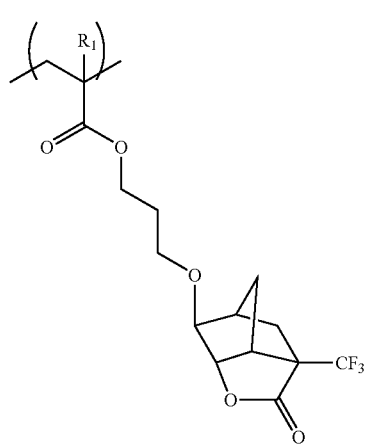
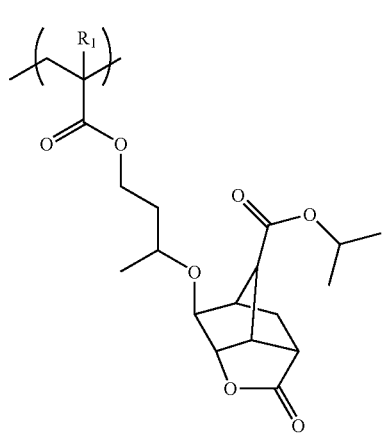
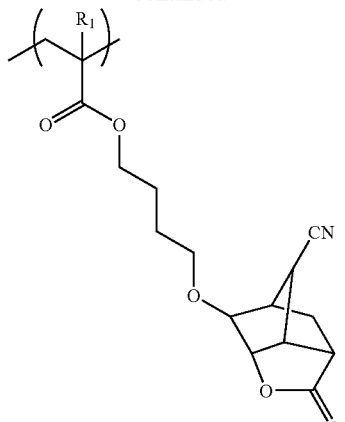
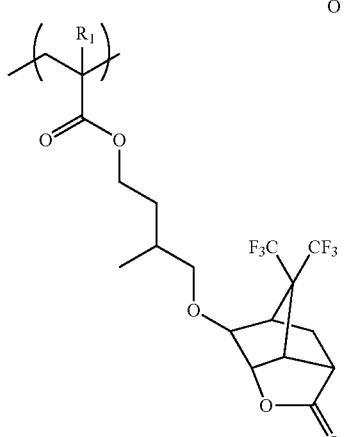
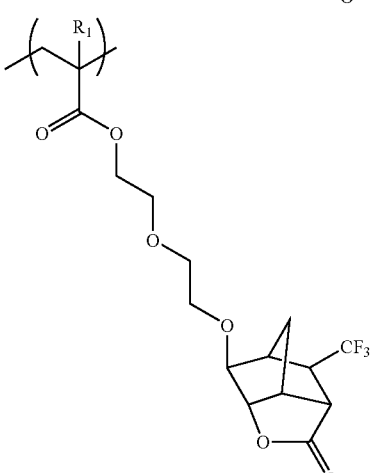
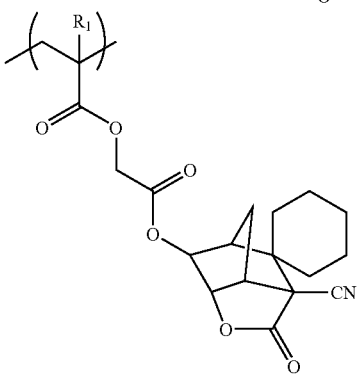

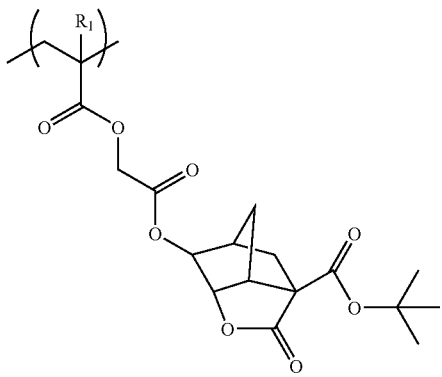
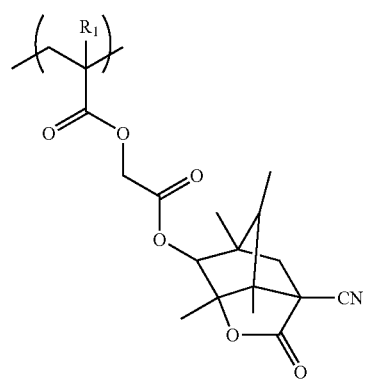
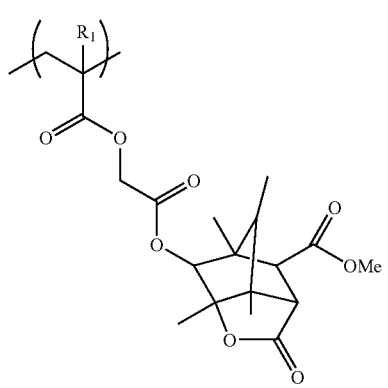
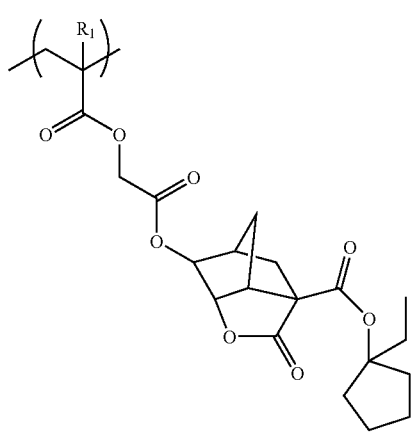
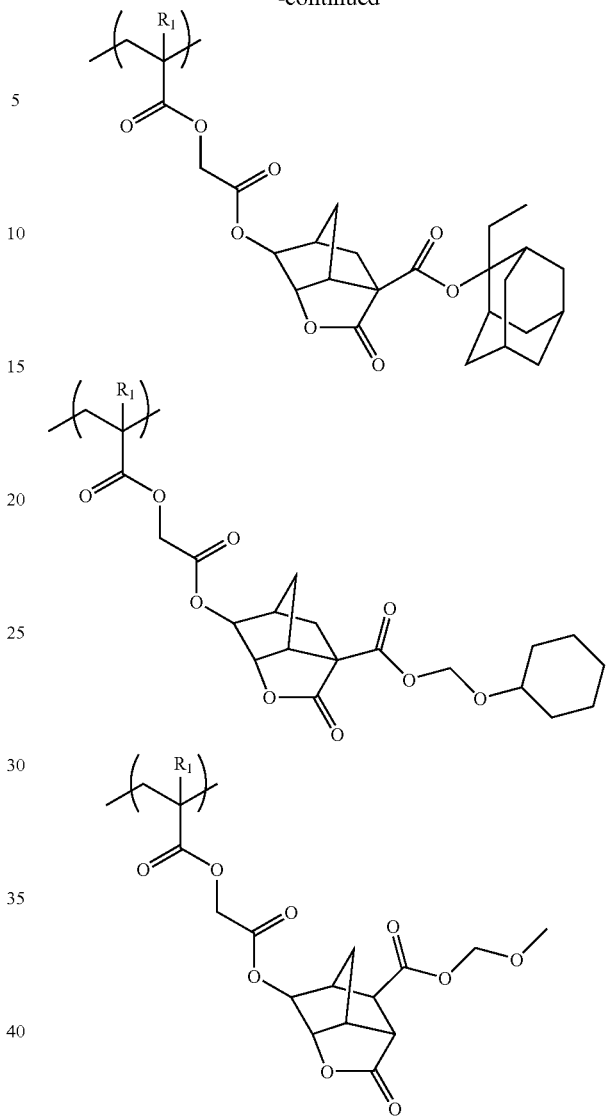

The repeating unit containing a group having a lactone structure represented by formula (1) includes a repeating unit containing a (meth)acrylic acid ester derivative, (meth)acrylamide derivative, vinyl ether derivative, olefin derivative, styrene derivative or the like having a structure of formula (1) and is preferably a repeating unit containing a (meth)acrylic acid ester derivative having a structure of formula (1).

In addition to the repeating unit containing a group having a lactone structure represented by formula (1), the resin as the component (A) may further contain a repeating unit having a lactone structure-containing group different from the group having a lactone structure represented by formula (1). As for the lactone group, any group may be used as long as it has a lactone structure, but a 5- to 7-membered ring lactone structure is preferred. The 5- to 7-membered ring lactone structure is preferably condensed with another ring structure in the form of forming a bicyclo or spiro structure. It is more preferred to contain a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13) and (LC1-

14). By virtue of using a lactone structure, the line edge roughness and development defect can be improved.
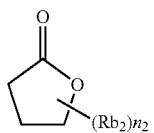
LC1-1
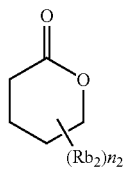
LC1-2
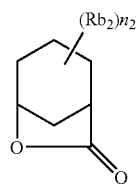
LC1-3
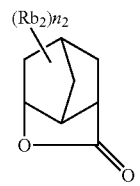
LC1-4
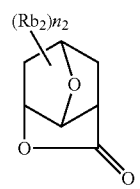
LC1-5
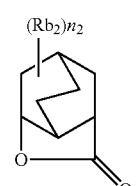
LC1-6
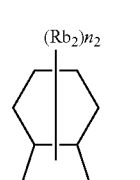
LC1-7
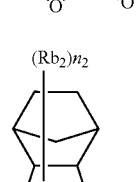
LC1-8
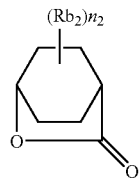
LC1-9
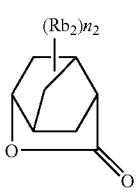
LC1-10
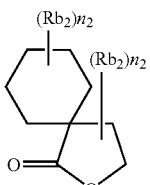
LC1-11
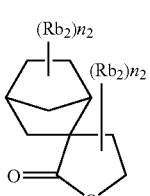
LC1-12
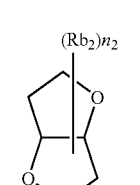
LC1-13
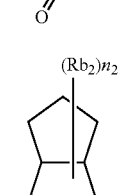
LC1-14
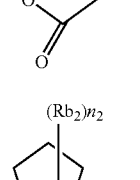
LC1-15
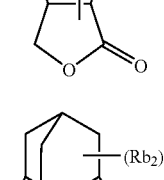
LC1-16

LC1-17

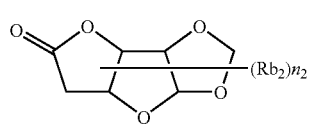

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Of these, an alkyl group having a carbon number of 1 to 4, a cyano group and an acid-decomposable group are more preferred. $n_2$ represents an integer of 0 to 4. When $n_2$ is an integer of 2 or more, the plurality of substituents ($Rb_2$) may be the same or different and also, the plurality of substituents ($Rb_2$) may combine together to form a ring.

The repeating unit having a lactone structure represented by any one of formulae (LC1-1) to (LC1-17) includes a repeating unit represented by the following formula (AI):

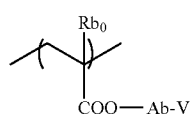

(AI)

In formula (AI), $Rb_0$ represents a hydrogen atom, a halogen atom or an alkyl group (preferably having a carbon number of 1 to 4). Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group comprising a combination thereof and is preferably a single bond or a divalent linking group represented by -$Ab_1$-$CO_2$—. $Ab_1$ is a linear or branched alkylene group or a monocyclic or polycyclic cycloalkylene group, preferably a methylene group, an ethylene group, a cyclohexylene group, an adamantylene group or a norbornylene group.

V represents a group having a structure represented by any one of formulae (LC1-1) to (LC1-17).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having the other lactone structure-containing group is preferably from 15 to 60 mol %, more preferably from 20 to 50 mol %, still more preferably from 30 to 50 mol %, based on all repeating units in the polymer.

Specific examples of the repeating unit having the other lactone structure-containing group are set forth below, but the present invention is not limited thereto.

(In the formulae, Rx is H, $CH_3$, $CH_2OH$ or $CF_3$.)

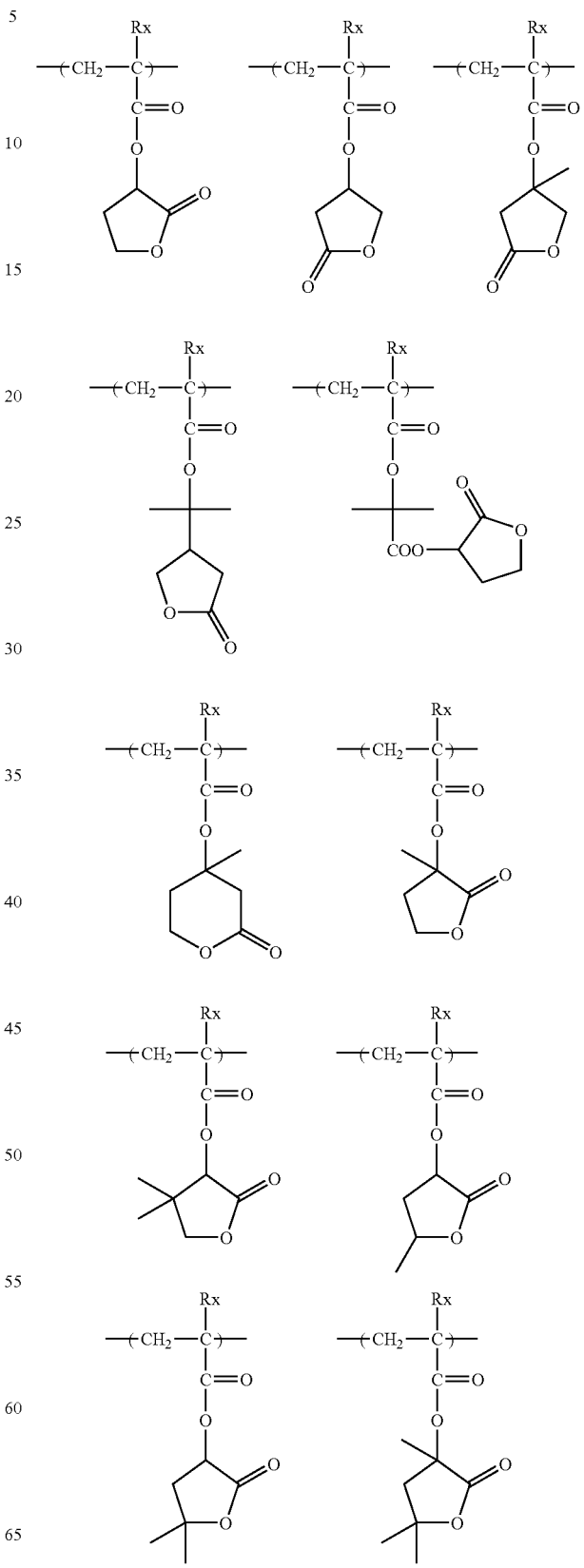

27
-continued
28
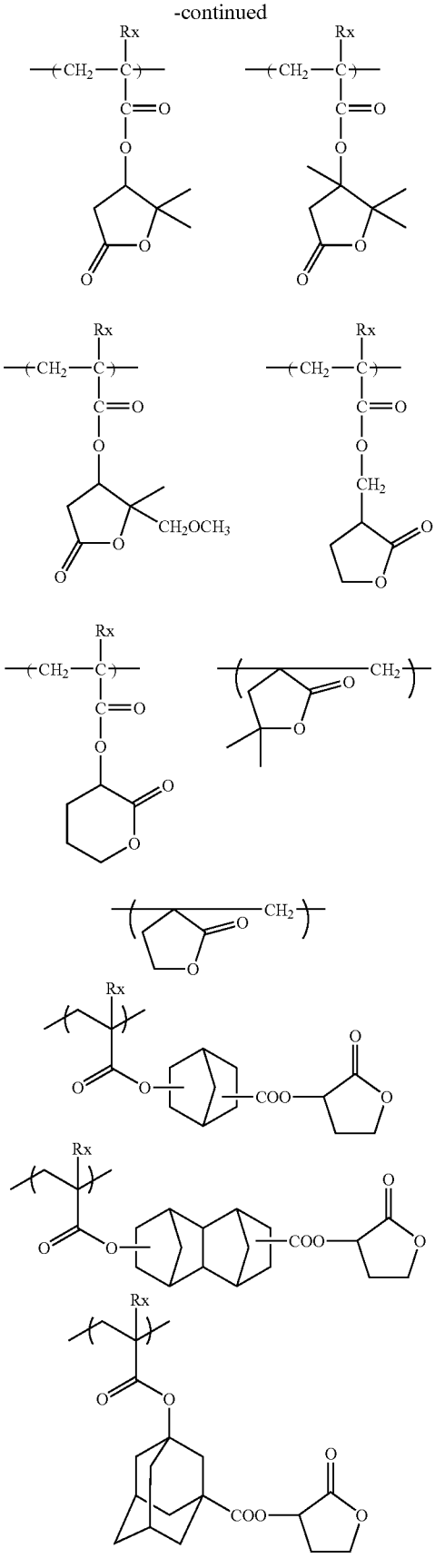
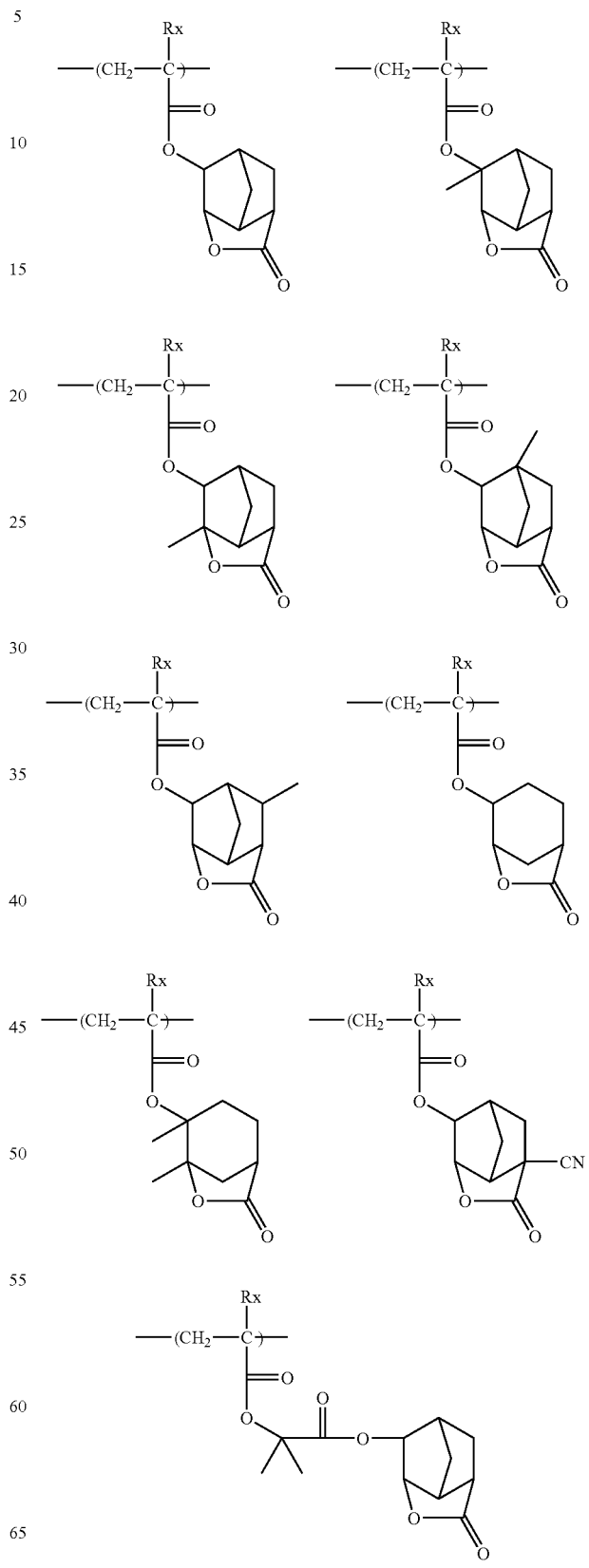
(In the formulae, Rx is H, CH₃, CH₂OH or CF₃.)

29
-continued
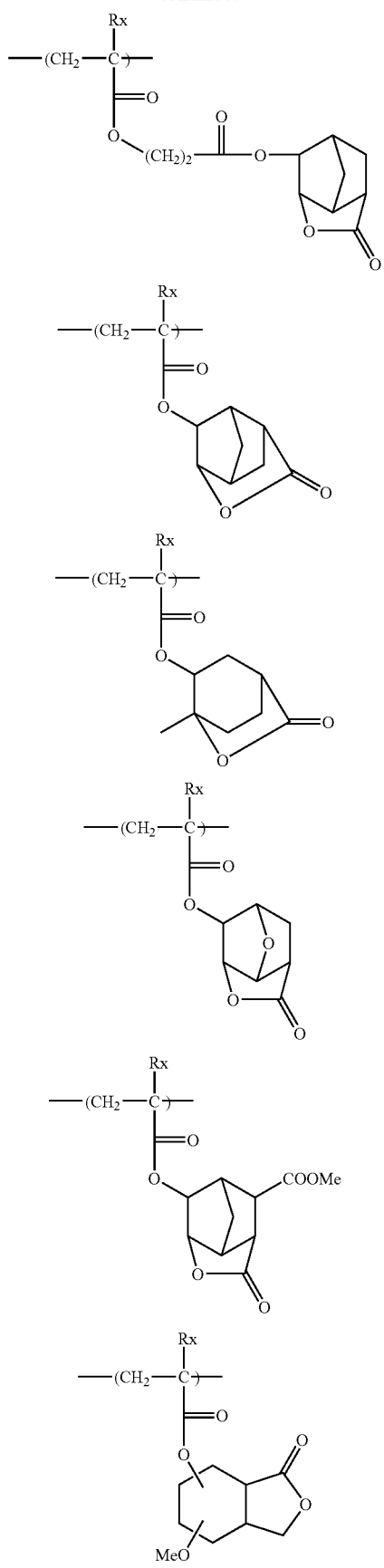
30
-continued
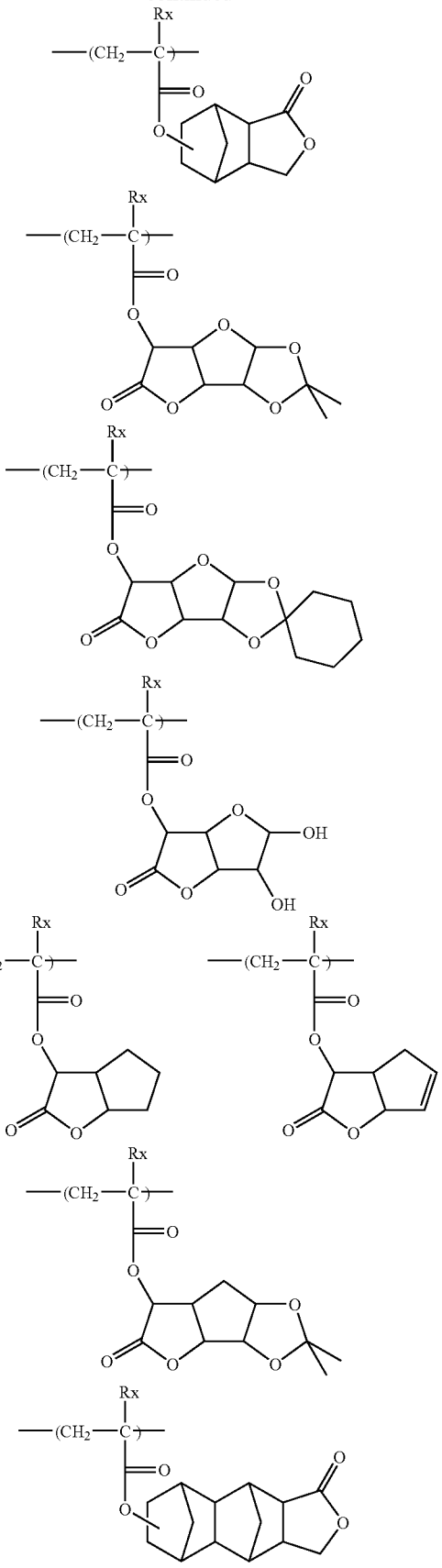

(In the formulae, Rx is H, CH₃, CH₂OH or CF₃.)
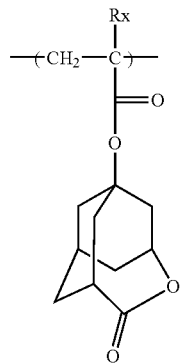
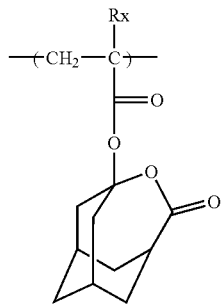
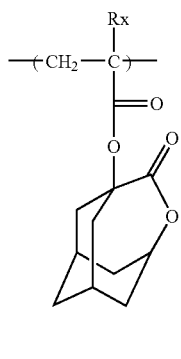
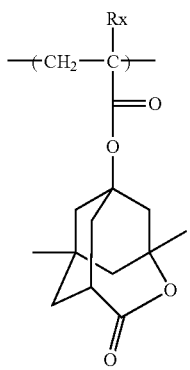
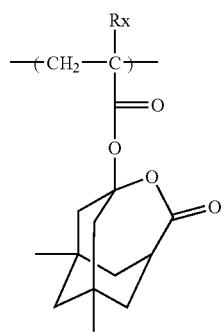
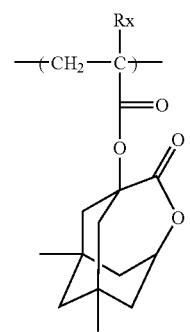
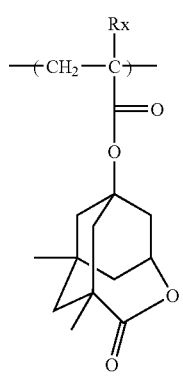
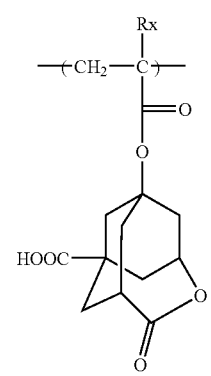
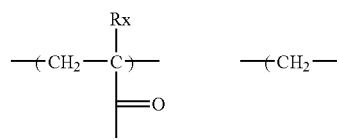
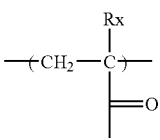
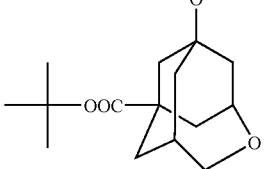
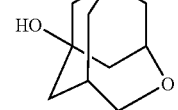
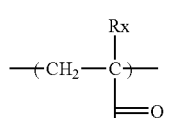
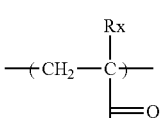
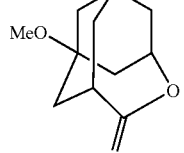
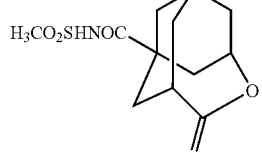
Preferred examples of the repeating unit containing a group having a lactone structure include the following repeating units. By selecting an optimal lactone structure, good performance is obtained in terms of pattern profile and iso-dense bias.
(In the formulae, Rx is H, CH₃, CH₂OH or CF₃.)
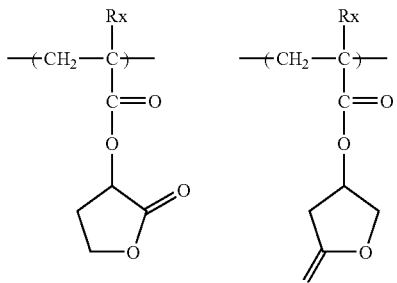
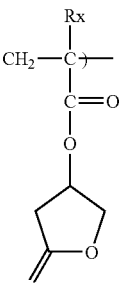
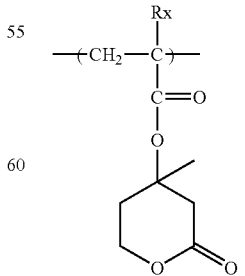
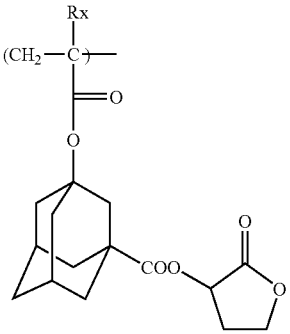

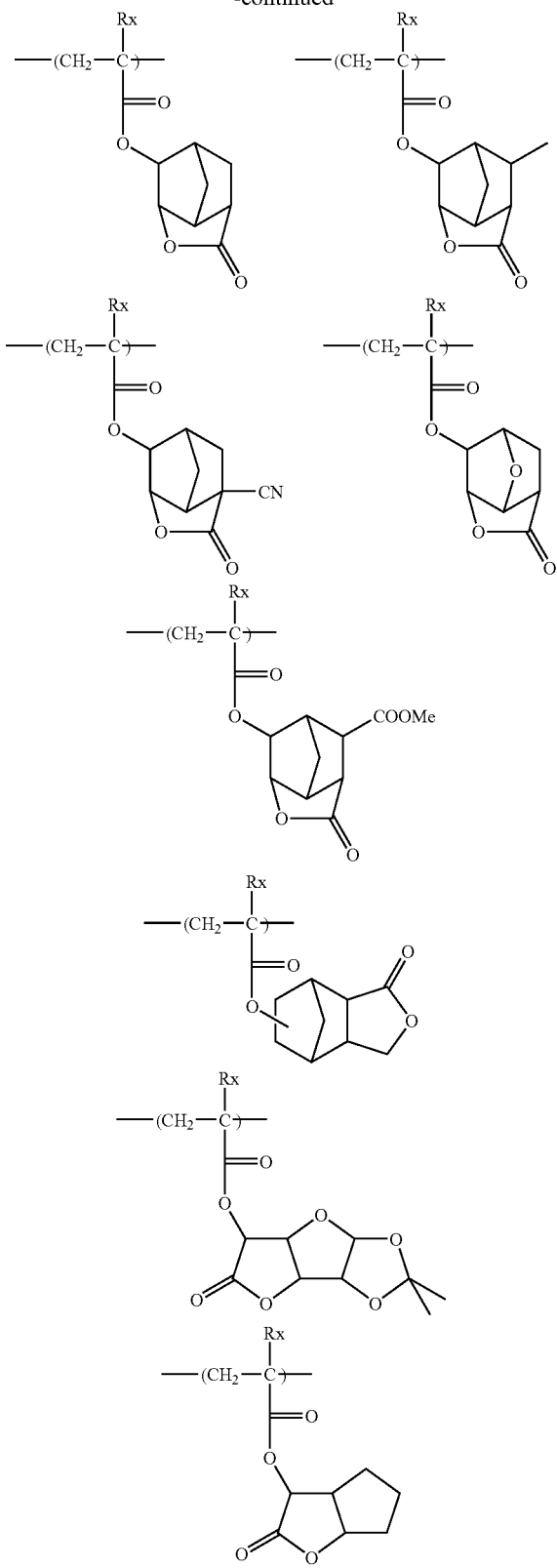

decomposable group"), in the main or side chain of the resin or in both the main chain and the side chain.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a carboxyl group, a fluorinated alcohol group (preferably hexafluoroisopropanol) and a sulfonic acid group.

The group preferred as the acid-decomposable group is a group where a hydrogen atom of the above-described alkali-soluble group is substituted with a group capable of leaving by the action of an acid.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$.

In the formulae, $R_{36}$ to $R_{39}$ each independently represents an alkyl group, a cycloalkyl group, an aryl group, an aralkyl group or an alkenyl group. $R_{36}$ and $R_{37}$ may combine together to form a ring.

$R_{01}$ and $R_{02}$ each independently represents a hydrogen atom, an alkyl group, a cycloalkyl group, an aryl group, an aralkyl group or an alkenyl group.

The acid-decomposable group is preferably, for example, a cumyl ester group, an enol ester group, an acetal ester group or a tertiary alkyl ester group, more preferably a tertiary alkyl ester group.

The resin as the component (A) preferably contains a repeating unit having an acid-decomposable group. The repeating unit having an acid-decomposable group is preferably a repeating unit represented by the following formula (A):

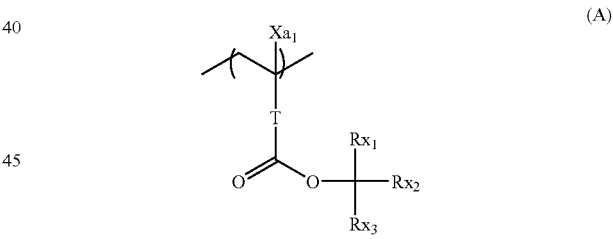

(A)

In formula (A), $Xa_1$ represents a hydrogen atom, a methyl group, a trifluoromethyl group or a hydroxymethyl group.

T represents a single bond or a divalent linking group.

$Rx_1$ to $Rx_3$ each independently represents an alkyl group (linear or branched) or a cycloalkyl group (monocyclic or polycyclic).

At least two members out of $Rx_1$ to $Rx_3$ may combine to form a cycloalkyl group (monocyclic or polycyclic).

Examples of the divalent linking group of T includes an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —$(CH_2)_3$— group.

The resin as the component (A) is a resin capable of increasing the solubility in an alkali developer by the action of an acid and contains a group capable of decomposing by the action of an acid to produce an alkali-soluble group ("acid- The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetraclododecanyl group and adamantyl group, more preferably a cyclopentyl group or a cyclohexyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described cycloalkyl group, particularly a cyclopentyl group or a cyclohexyl group, is preferred.

An embodiment where $Rx_1$ and $Rx_2$ are an alkyl group and $Rx_3$ is a cycloalkyl group is also preferred.

The content of the repeating unit having an acid-decomposable group is preferably from 20 to 50 mol %, more preferably from 25 to 45 mol %, based on all repeating units in the polymer.

Specific preferred examples of the repeating unit having an acid-decomposable group are set forth below, but the present invention is not limited thereto.

(In the formulae, Rx represents H, $CH_3$, $CF_3$ or $CH_2OH$, and Rxa and Rxb each represents an alkyl group having a carbon number of 1 to 4.)

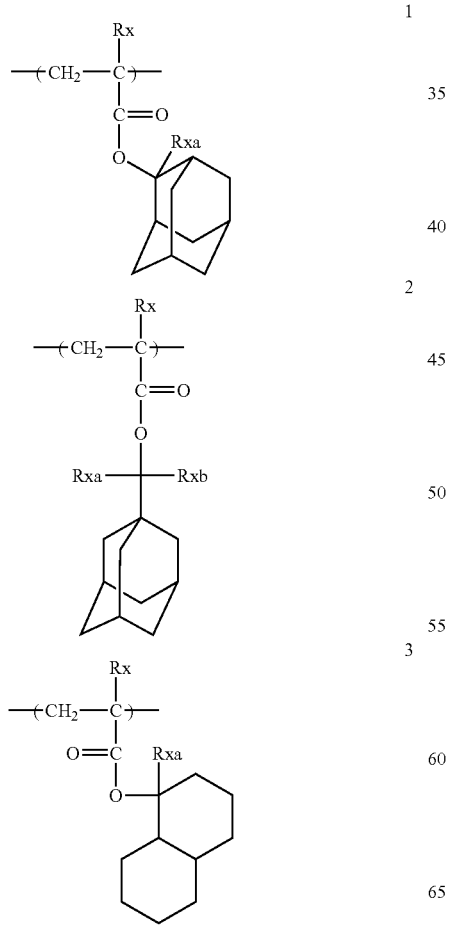

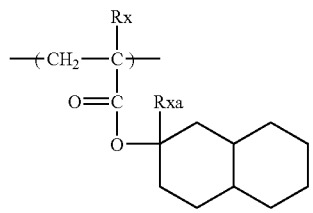

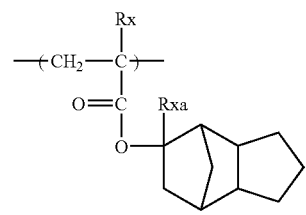

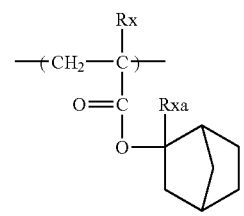

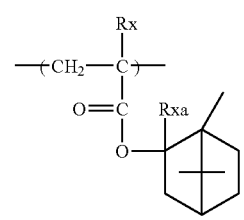

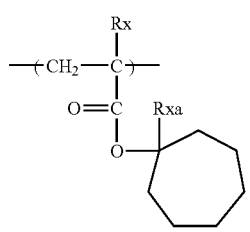

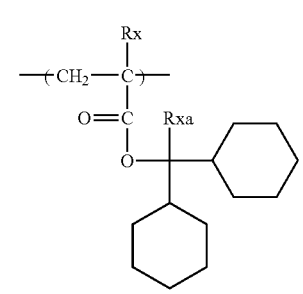

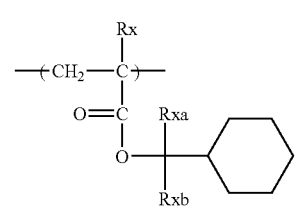

11
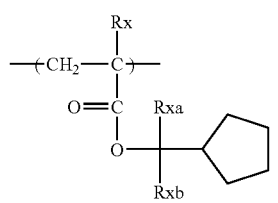
12
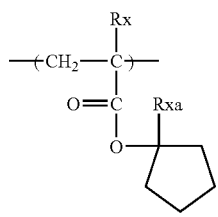
13
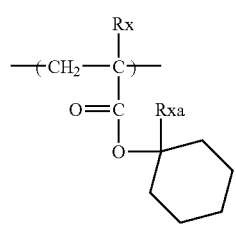
14
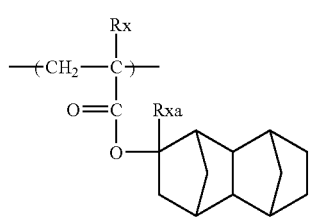
15
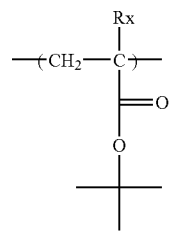
16
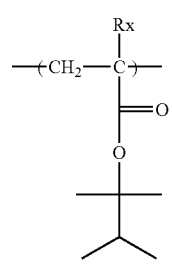
17
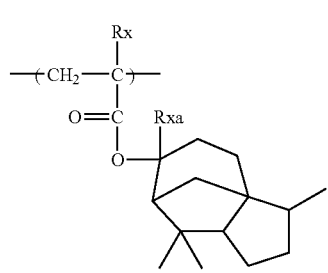
18
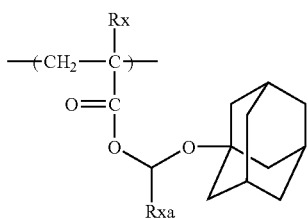
19
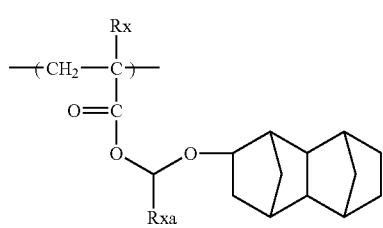
20
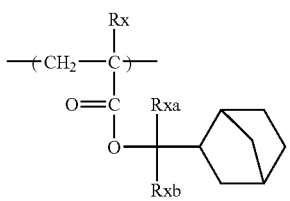
21
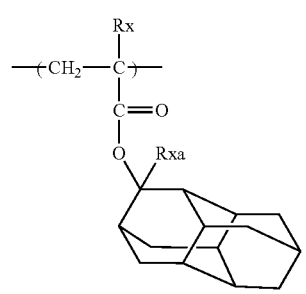
22
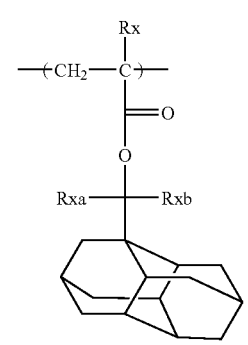
23
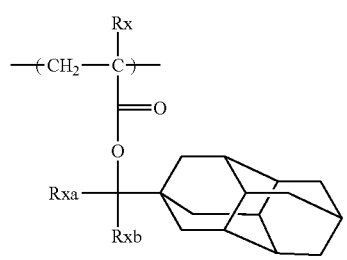

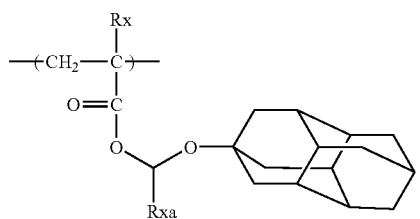
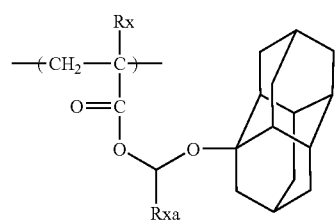
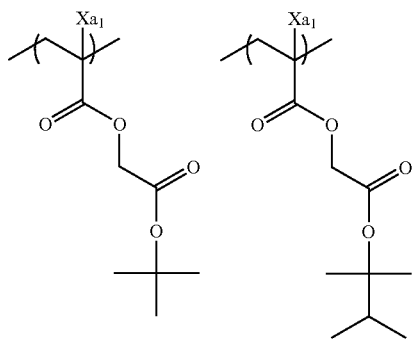
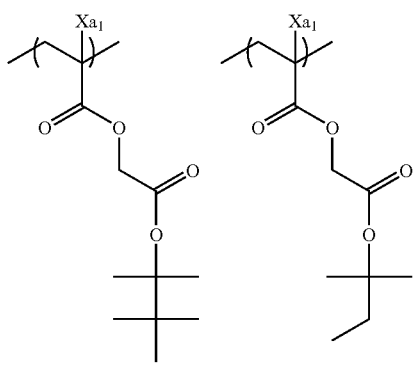
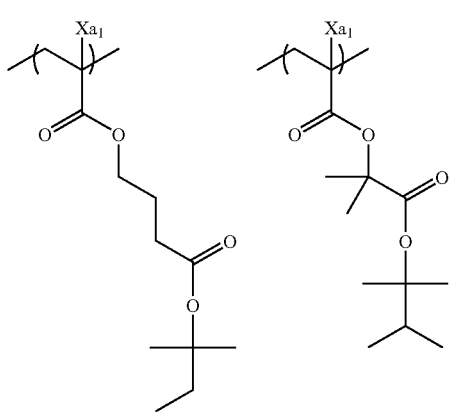
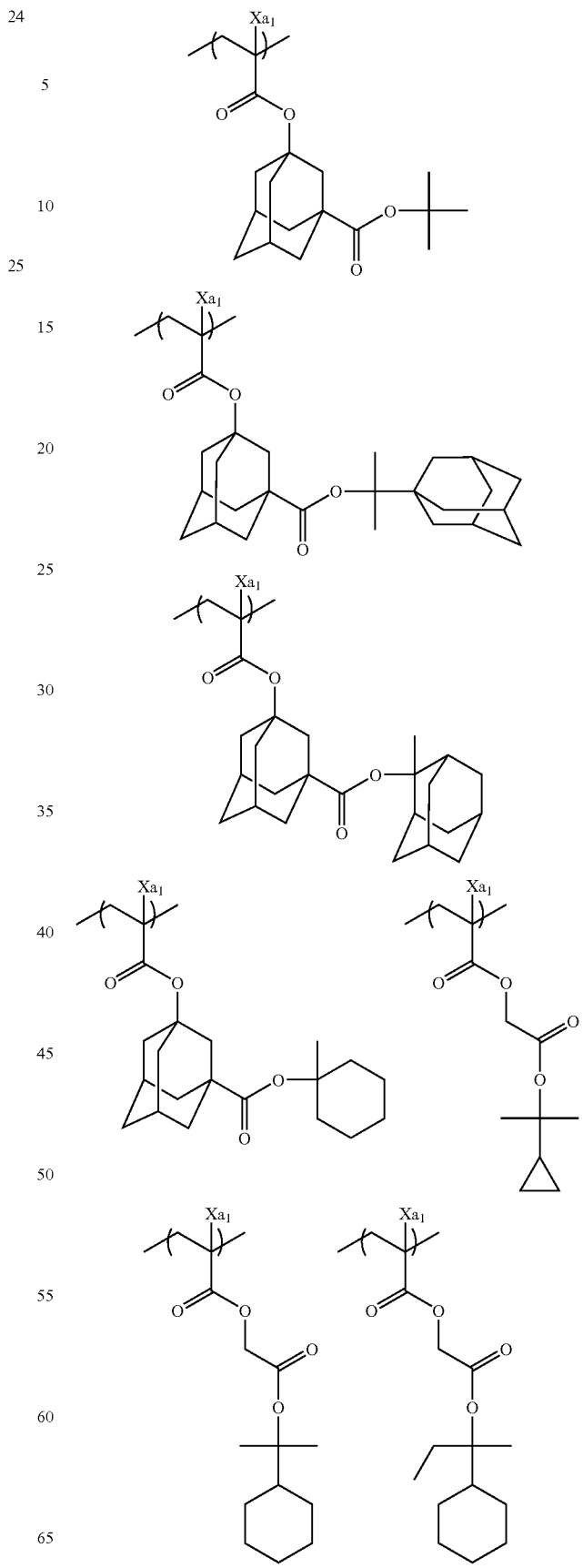

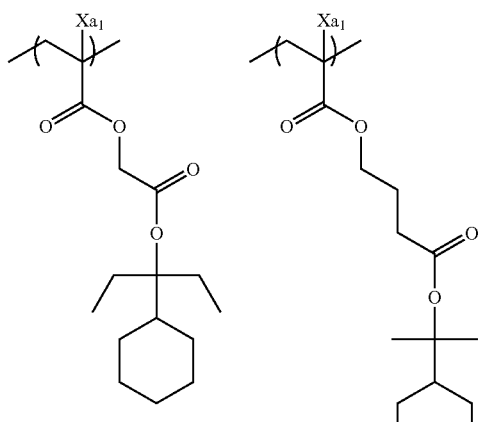
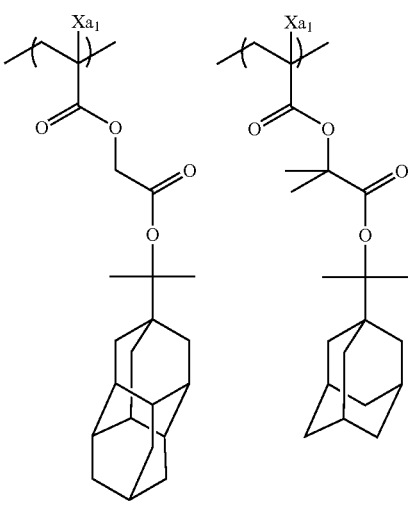
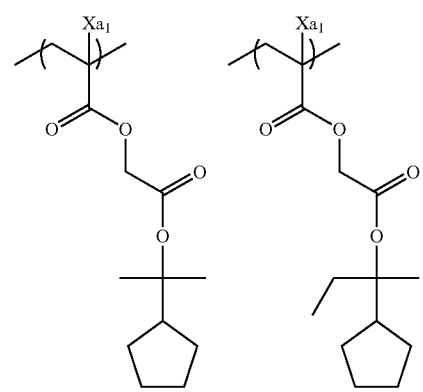
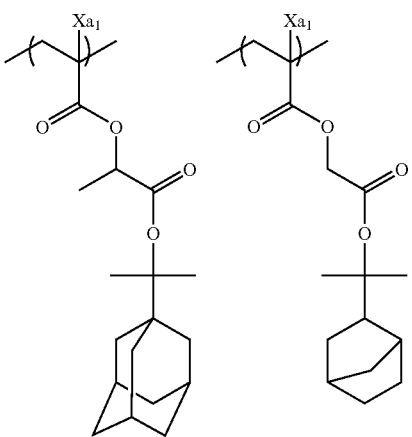
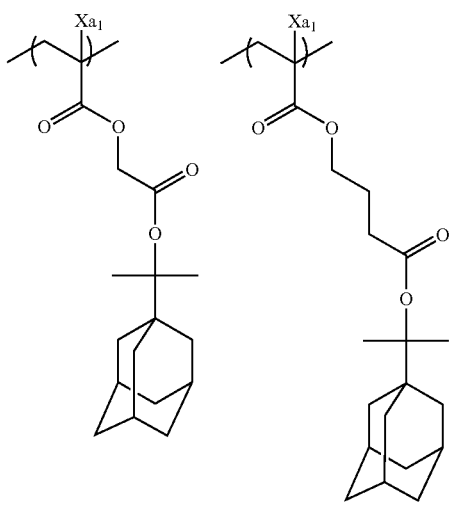
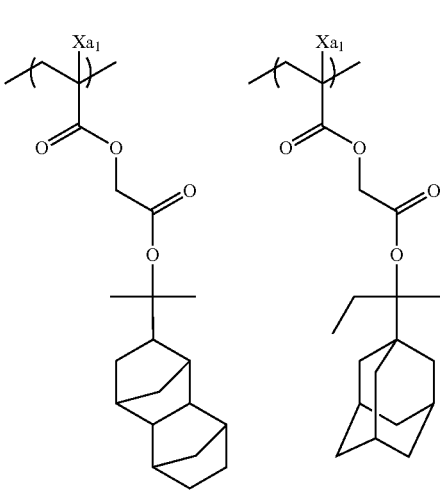

-continued
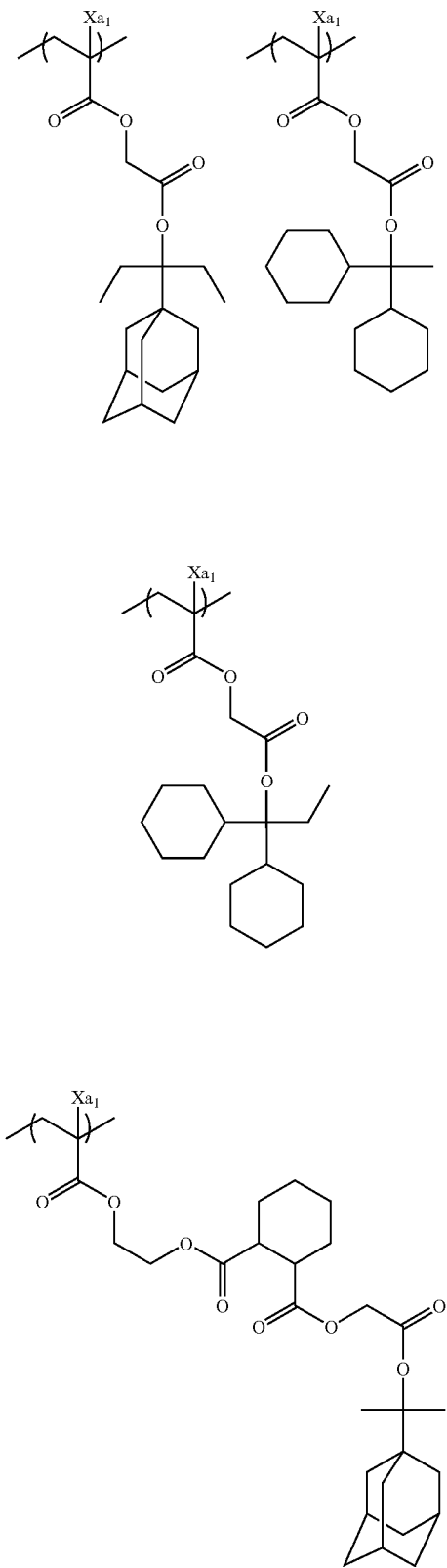
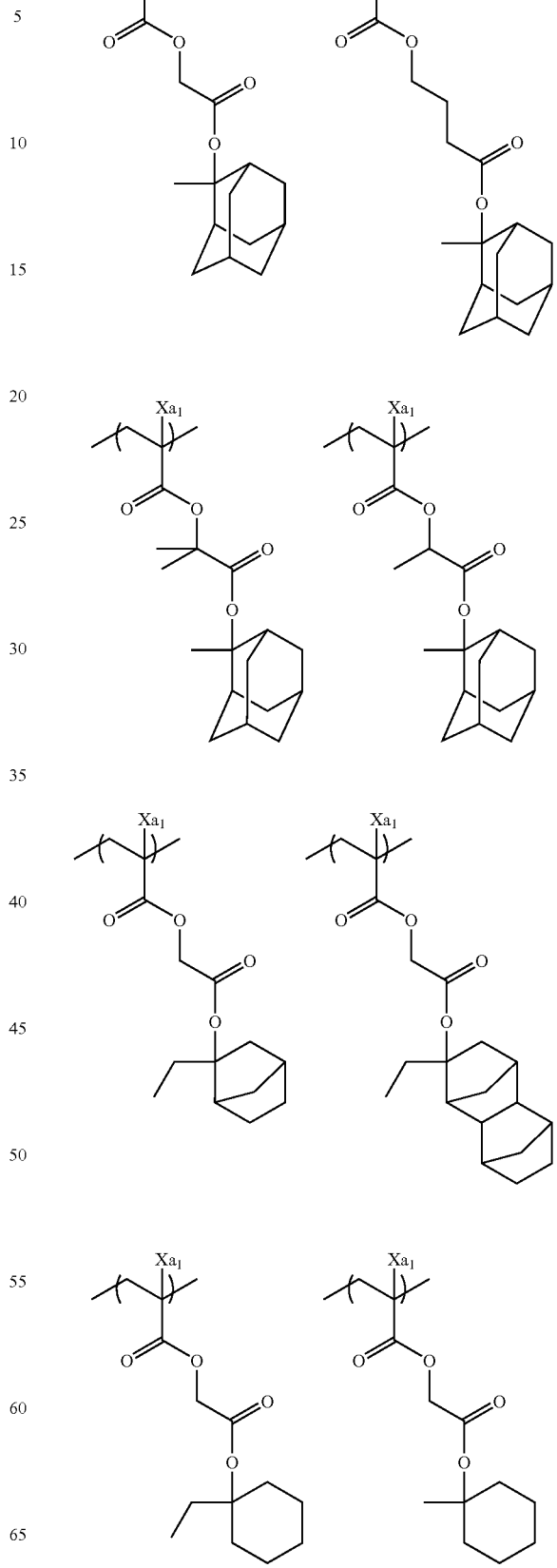

-continued

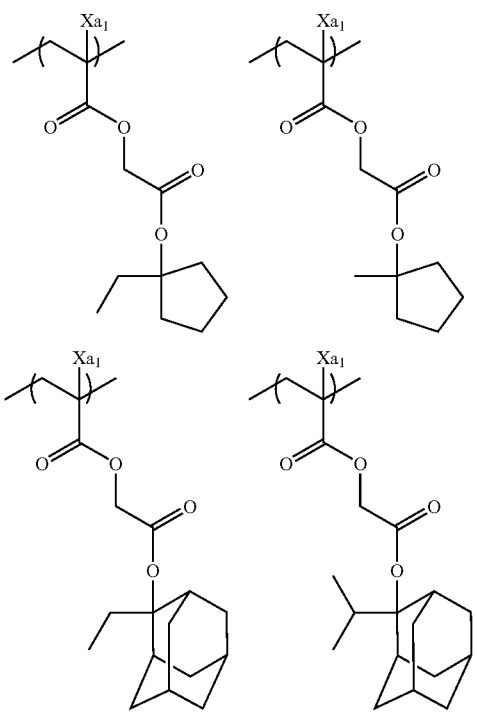

The resin as the component (A) preferably contains a repeating unit having a hydroxyl group or a cyano group. By virtue of this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

(VIIa)

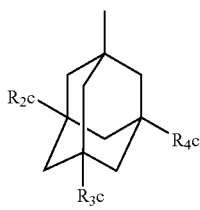

(VIIb)

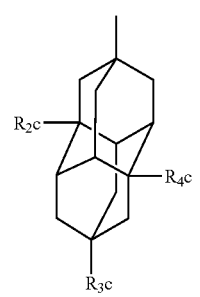

(VIIc)

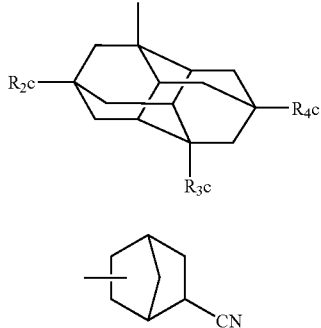

(VIId)

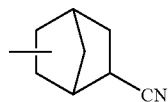

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a partial structure represented by any one of formulae (VIIa) to (VIId) includes repeating units represented by the following formulae (AIIa) to (AIId).

(AIIa)

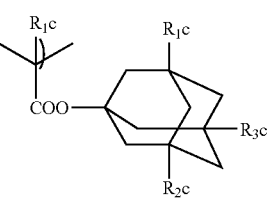

(AIIb)

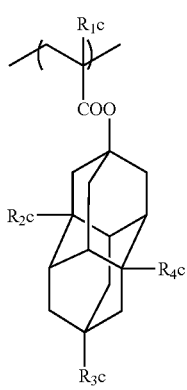

(AIIc)

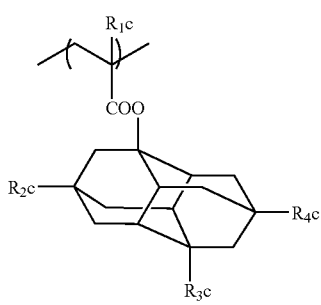

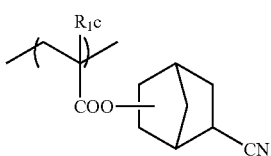

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the polymer.

Specific examples of the repeating unit having a hydroxyl group or a cyano group are set forth below, but the present invention is not limited thereto.

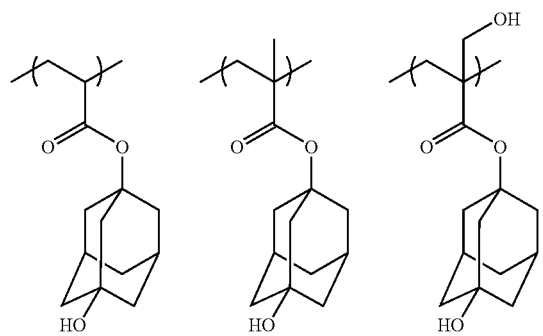

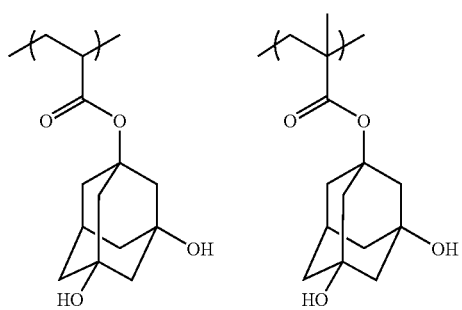

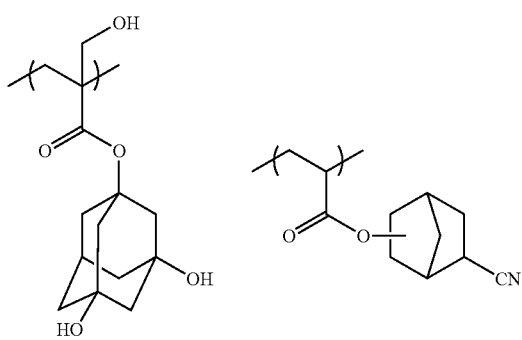

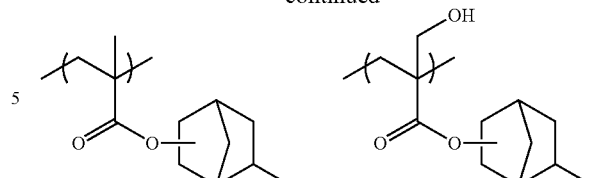

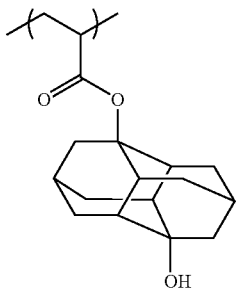
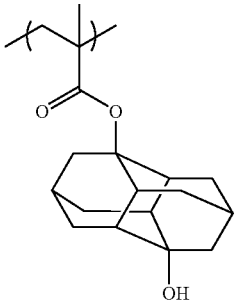

The resin as the component (A) preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroiso-propanol group. A repeating unit having a carboxyl group is more preferred. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, CH₃, CF₃ or CH₂OH.)

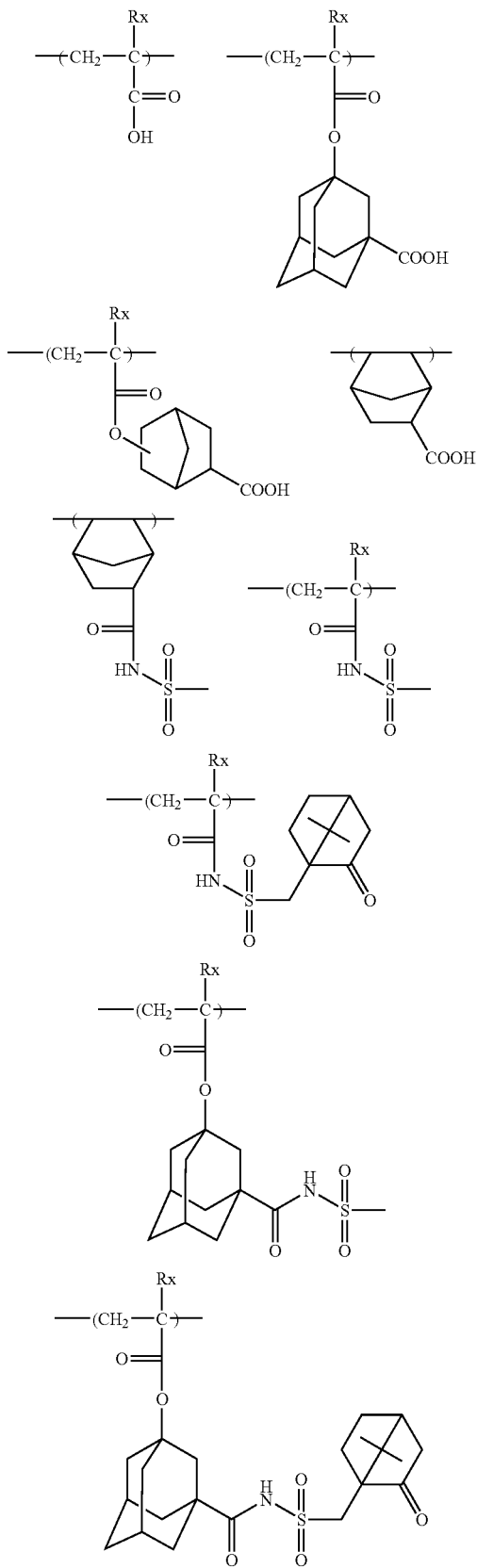

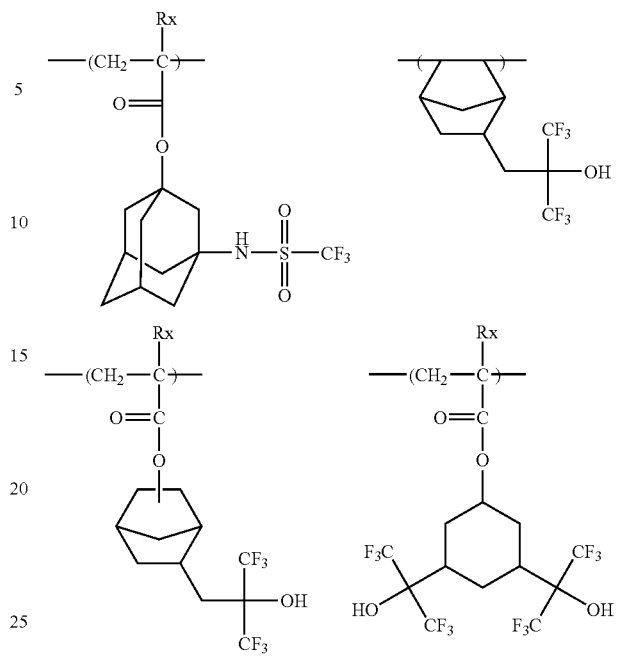

The resin as the component (A) may further contain a repeating unit having an alicyclic hydrocarbon structure and not exhibiting acid decomposability. By containing such a repeating unit, the dissolving out of low molecular components from the resist film to the immersion liquid at the immersion exposure can be reduced. Examples of this repeating unit include 1-adamantyl(meth)acrylate, diamantyl (meth)acrylate, tricyclodecanyl(meth)acrylate and cyclohexyl(meth)acrylate.

Specific examples of the repeating unit having an alicyclic hydrocarbon structure and not exhibiting acid decomposability are set forth below, but the present invention is not limited thereto. In the formulae, Ra represents H, CH₃, CH₂OH or CF₃.

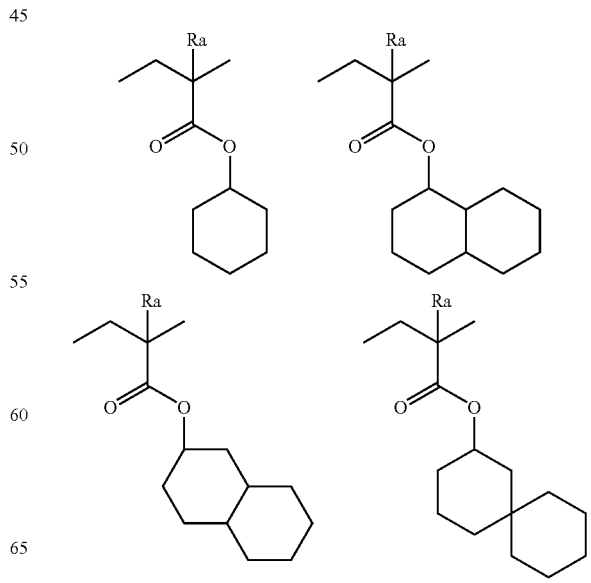

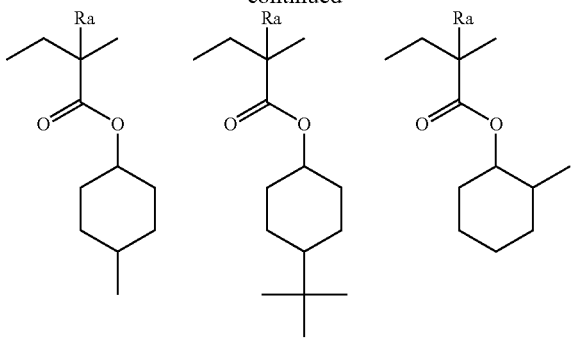
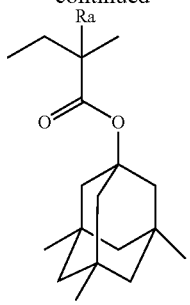
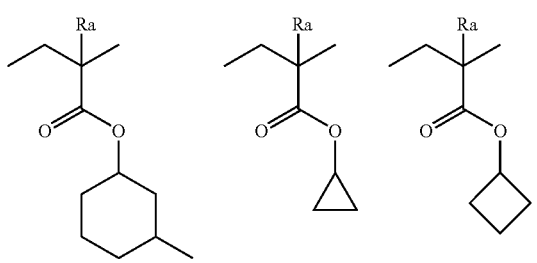
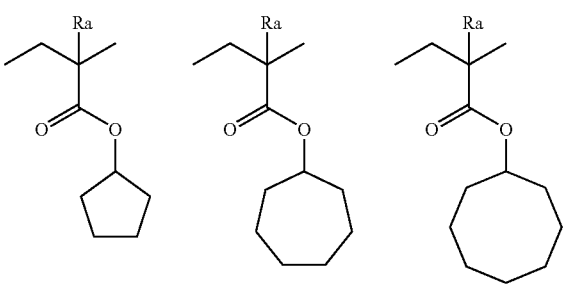
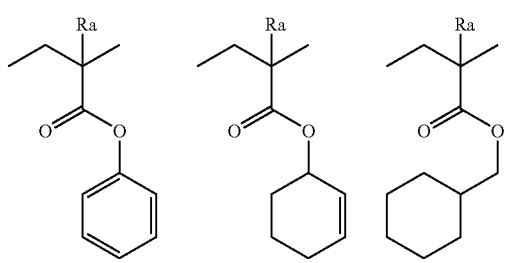
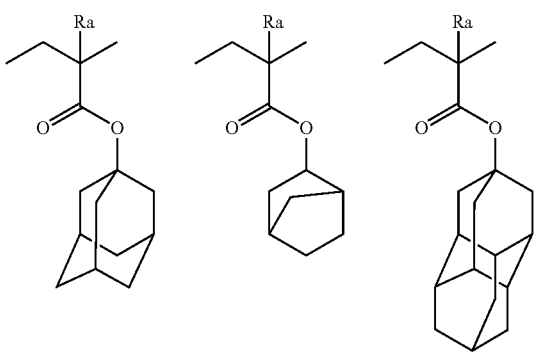

The resin as the component (A) may contain, in addition to the above-described repeating structural units, various repeating structural units for the purpose of controlling the dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

By virtue of such a repeating structural unit, the performance required of the resin as the component (A), particularly, (1) solubility in coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin as the component (A), the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case of using the actinic ray-sensitive or radiation-sensitive resin composition of the present invention for ArF exposure, the resin as the component (A) preferably has no aromatic group in view of transparency to ArF light.

Also, the resin as the component (A) preferably contains no fluorine atom and no silicon atom in view of compatibility with a hydrophobic resin (HR) described later.

The resin as the component (A) can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate (PGMEA; 1-Methoxy-2-acetoxypropane), propylene glycol monomethyl ether (PGME; 1-Methoxy-2-propanol) and cyclohexanone. The polymerization is more preferably performed using the same solvent as the solvent used in the actinic ray-sensitive or radiation-sensitive resin composition of the present invention. By the use of this solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a method such as powder or solid recovery. The reaction concentration (the concentration of solute in the reaction solution) is normally from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin as the component (A) is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance, dry etching resistance and developability can be prevented from deterioration and also, the film-forming property can be prevented from deteriorating due to high viscosity.

The dispersity (molecular weight distribution) is usually from 1 to 3, preferably from 1 to 2.6, more preferably from 1 to 2, still more preferably from 1.4 to 1.7. As the molecular weight distribution is smaller, the resolution and resist profile are more excellent, the side wall of the resist pattern is smoother, and the property in terms of roughness is more improved.

In the actinic ray-sensitive or radiation-sensitive resin composition of the present invention, the amount of the resin as the component (A) blended in the entire composition is preferably from 50 to 99.9 mass %, more preferably from 60 to 99.0 mass %, based on the entire solid content.

In the present invention, with respect to the resin as the component (A), one kind may be used or a plurality of kinds may be used in combination.

(B) Compound Capable of Generating an Acid upon Irradiation with an Actinic Ray or Radiation The actinic ray-sensitive or radiation-sensitive resin composition of the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photo-polymerization, a photo-decoloring agent for dyes, a photo-discoloring agent, a compound known to generate an acid upon irradiation with an actinic ray or radiation and used for microresist or the like, and a mixture thereof.

Examples of such an acid generator include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, compounds represented by the following formulae (ZI), (ZII) and (ZIII) are preferred.

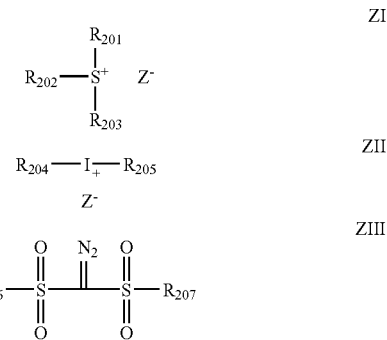

In formula (ZI), $R_{201}$, $R_{202}$ and $R_{203}$ each independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

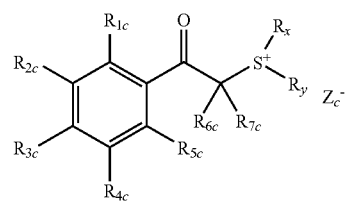

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

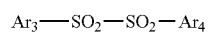
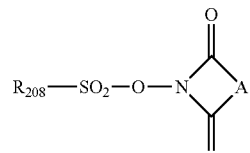
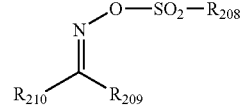

In formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound that generates an acid having one sulfonic acid group or imide group, more preferably a compound that generates a monovalent perfluoroalkanesulfonic acid, a compound that generates a monovalent aromatic sulfonic acid substituted by a fluorine atom or a fluorine atom-containing group, or a compound that generates a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generated from the acid generator which can be used is preferably a fluoro-substituted alkanesulfonic acid, fluoro-substituted benzenesulfonic acid or fluoro-substituted imide acid having a pKa of −1 or less and in this case, the sensitivity can be enhanced.

Out of the acid generators, particularly preferred examples are set forth below, but the present invention is not limited thereto.

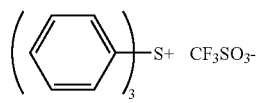
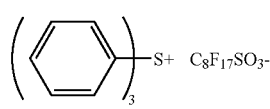
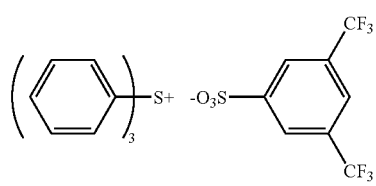
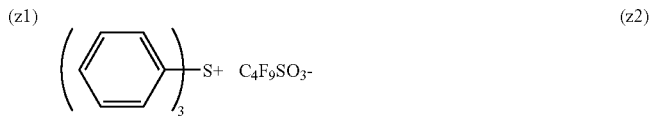
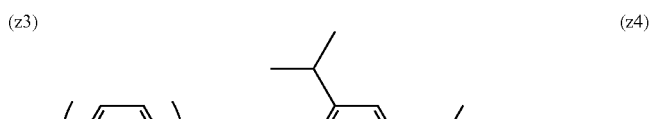
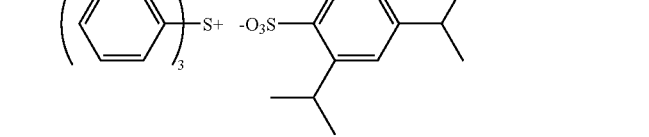
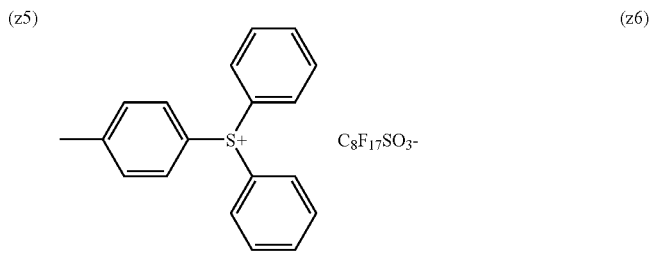

-continued
(z7) 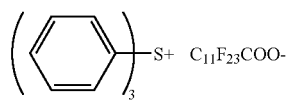
(z8) 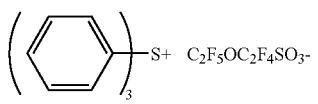
(z9) 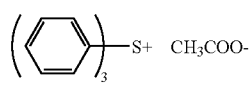
(z10) 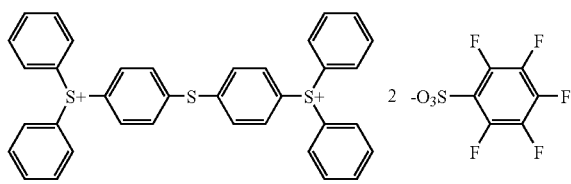
(z11) 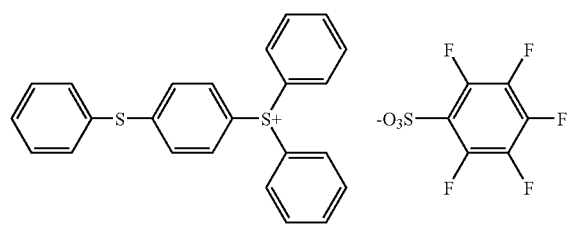
(z12) 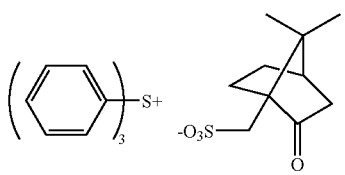
(z13) 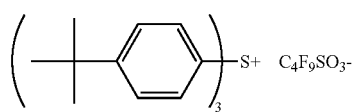
(z14) 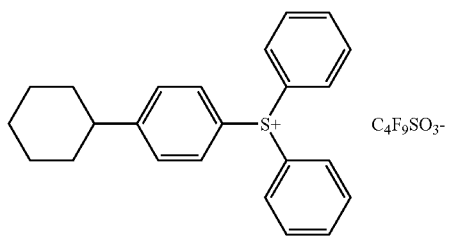
(z15) 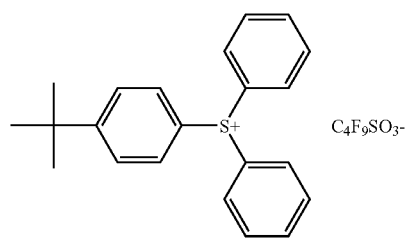
(z16) 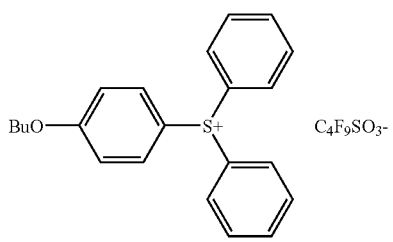
(z17) 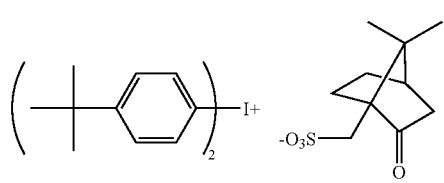
(z18) 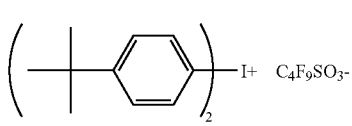
(z19) 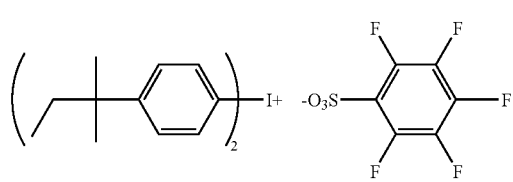
(z20) 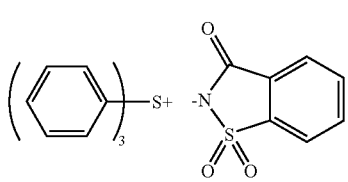
(z21) 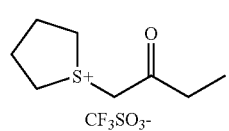
(z22) 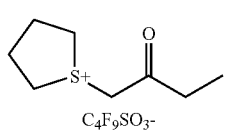

-continued

-continued
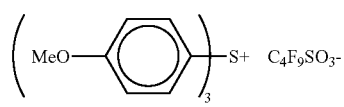 (z39)
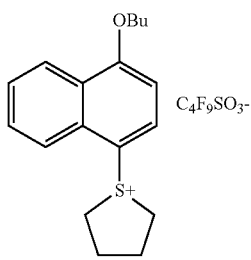 (z40)
 (z41)
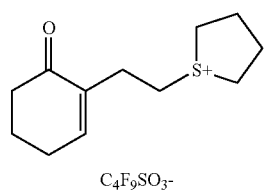 (z42)
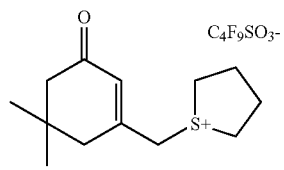 (z43)
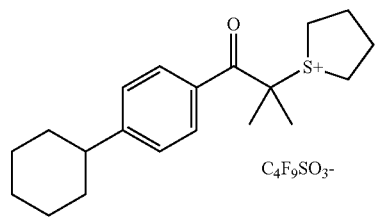 (z44)
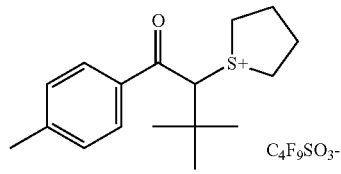 (z45)
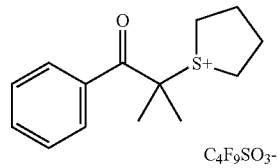 (z46)
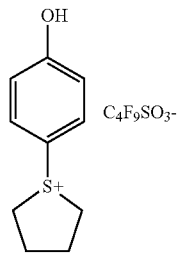 (z47)
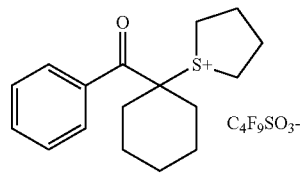 (z48)
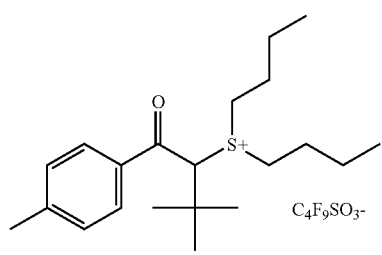 (z49)
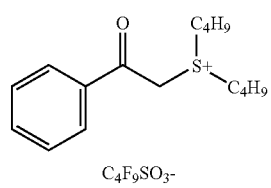 (z50)
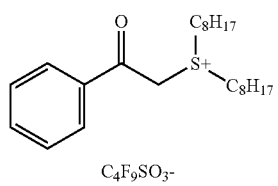 (z51)
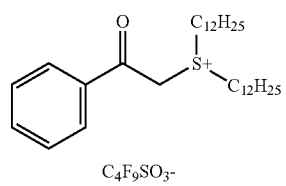 (z52)

-continued
(z53)
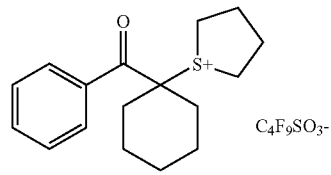
(z54)
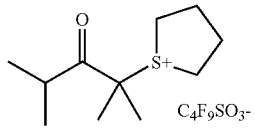
(z55)
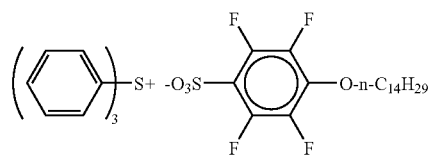
(z56)
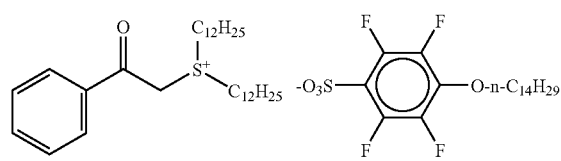
(z57)
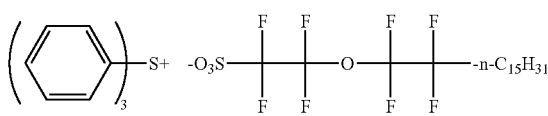
(z58)
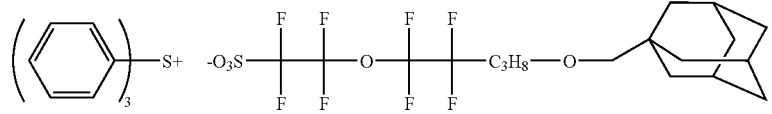
(z59)
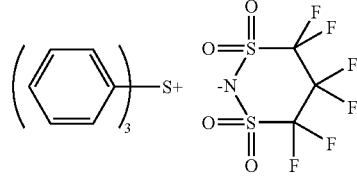
(z60)
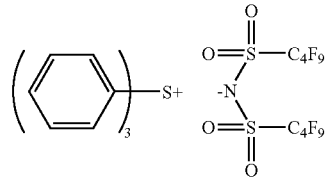
(z61)
(z62)
(z63)
(z64)
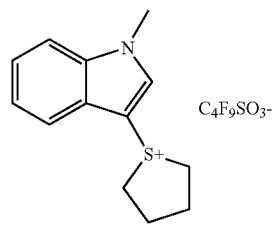
(z65)
(z66)
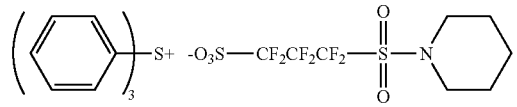
(z67)
(z68)
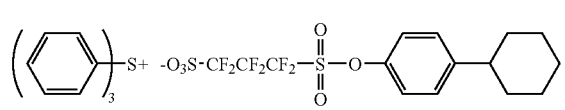
(z69)
(z70)
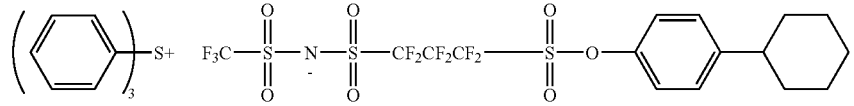

-continued
(z71)
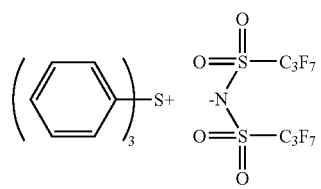
(z72)
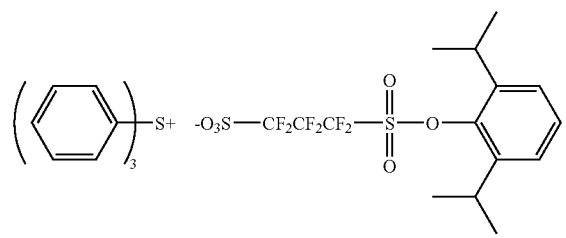
(z73)
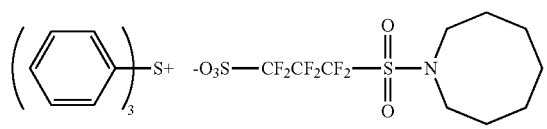
(z74)
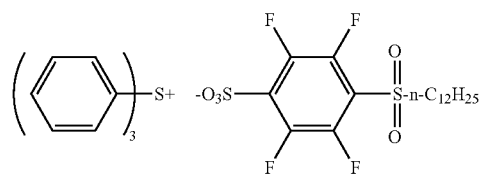
(z75)
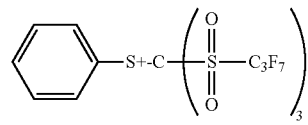
(z76)
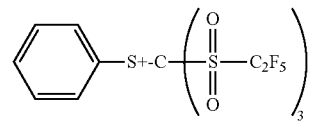
(z77)
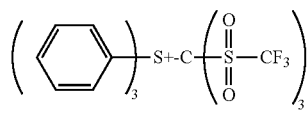
(z78)
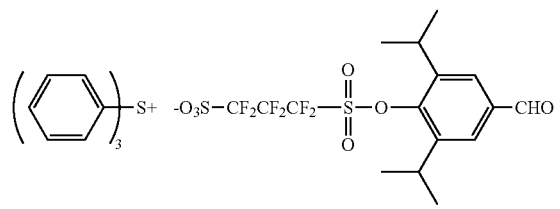
(z79)
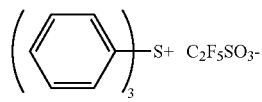
(z80)
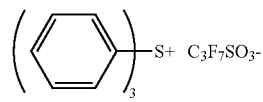
(z81)
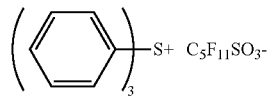
(z82)
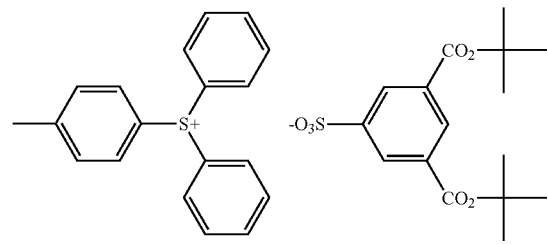
(z83)
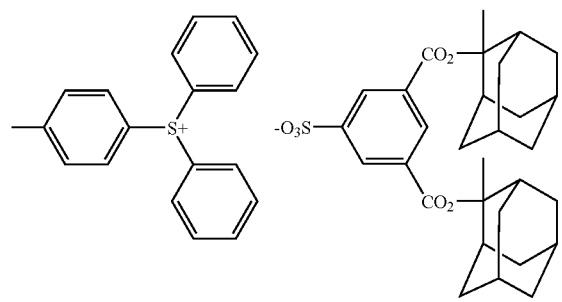
(z84)
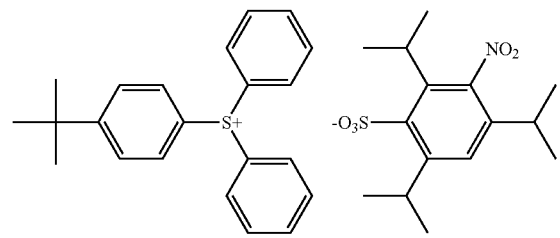

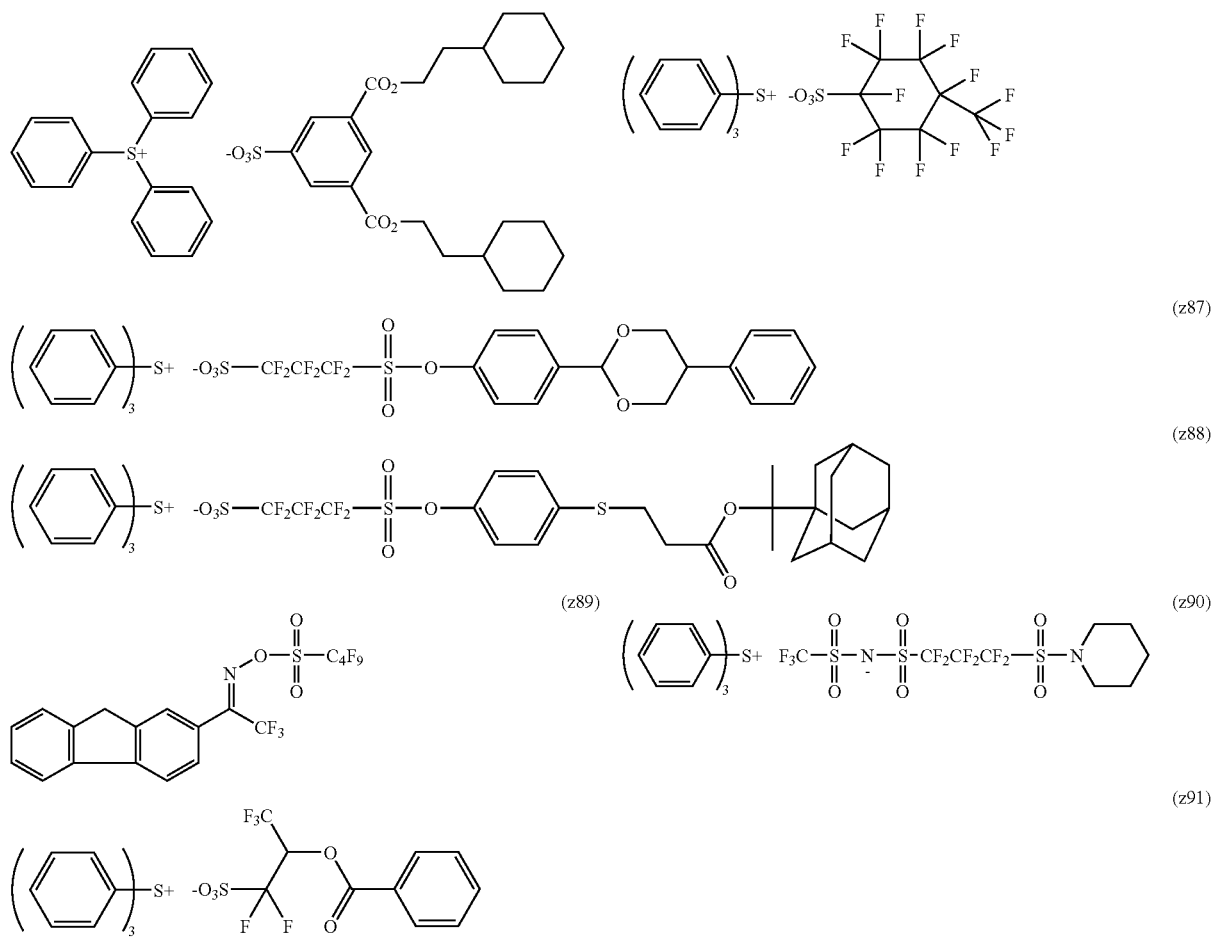

Among these acid generators, a fluoro-substituted alkanesulfonic acid having at least one substituent and a fluorine-substituted imide acid having at least one substituent are preferred, and a fluoro-substituted alkanesulfonic acid and a fluorine-substituted imide acid each having at least one sulfonamide or sulfonic acid ester group are more preferred. Specific examples thereof include z66, z67, z68, z69, z70, z72, z73, z78, z88 and z90.

One kind of an acid generator may be used alone or two or more kinds of acid generators may be used in combination.

The content of the acid generator in the actinic ray-sensitive or radiation-sensitive resin composition is preferably from 0.1 to 20 mass %, more preferably from 0.5 to 10 mass %, still more preferably from 1 to 7 mass %, based on the entire solid content of the actinic ray-sensitive or radiation-sensitive resin composition.

Solvent:

Examples of the solvent which can be used at the time of preparing an actinic ray-sensitive or radiation-sensitive resin composition by dissolving respective components described above include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4- dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more kinds of solvents including propylene glycol monomethyl ether acetate.

Basic Compound:

The actinic ray-sensitive or radiation-sensitive resin composition of the present invention preferably contains a basic compound for reducing the change of performance with aging from exposure until heating.

As for the basic compound, compounds having a structure represented by any one of the following formulae (A) to (E) are preferred.

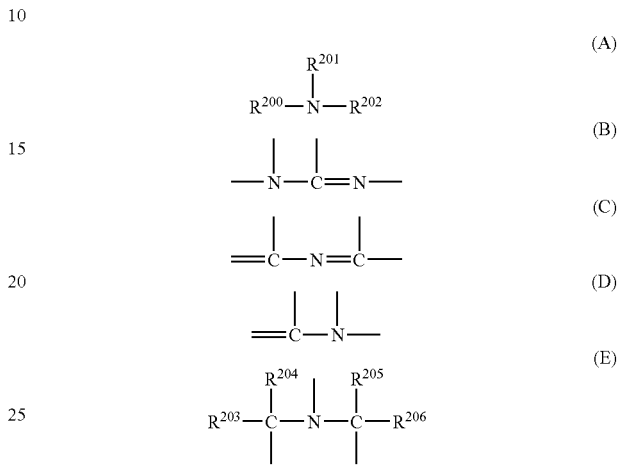

In formulae (A) to (E), $R^{200}$, $R^{201}$ and $R^{202}$, which may be the same or different, each represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiopheniun hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

One of these basic compounds may be used alone, or two or more kinds thereof may be used in combination.

The amount of the basic compound used is usually from 0.001 to 10 mass %, preferably from 0.01 to 5 mass %, based on the solid content of the actinic ray-sensitive or radiation-sensitive resin composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

Surfactant:

The actinic ray-sensitive or radiation-sensitive resin composition of the present invention preferably further contains a surfactant, more preferably any one of a fluorine-containing and/or silicon-containing surfactant (a fluorine-containing surfactant, a silicon-containing surfactant and a surfactant containing both a fluorine atom and a silicon atom), or two or more kinds thereof.

By incorporating the above-described surfactant into the actinic ray-sensitive or radiation-sensitive resin composition of the present invention, a resist pattern with good performance in terms of sensitivity, resolution and adherence as well as less development defect can be provided when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of such surfactants may be used alone, or some of these may be used in combination.

The amount of the surfactant used is preferably from 0.0001 to 2 mass %, more preferably from 0.001 to 1 mass %, based on the entire amount of the actinic ray-sensitive or radiation-sensitive resin composition (excluding the solvent).

Onium Carboxylate:

The actinic ray-sensitive or radiation-sensitive resin composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. By virtue of such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

Dissolution inhibiting compound having a molecular weight of 3,000 or less, which decomposes by the action of an acid to increase the solubility in an alkali developer:

The dissolution inhibiting compound having a molecular weight of 3,000 or less, which decomposes by the action of an acid to increase the solubility in an alkali developer (hereinafter, sometimes referred to as a "dissolution inhibiting compound"), is preferably an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less. Examples of the acid-decomposable group and alicyclic structure are the same as those described above with respect to the resin as the component (A).

In the case where the actinic ray-sensitive or radiation-sensitive resin composition of the present invention is exposed by a KrF excimer laser or irradiated with an electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the actinic ray-sensitive or radiation-sensitive resin composition.

Specific examples of the dissolution inhibiting compound are set forth below, but the present invention is not limited thereto.

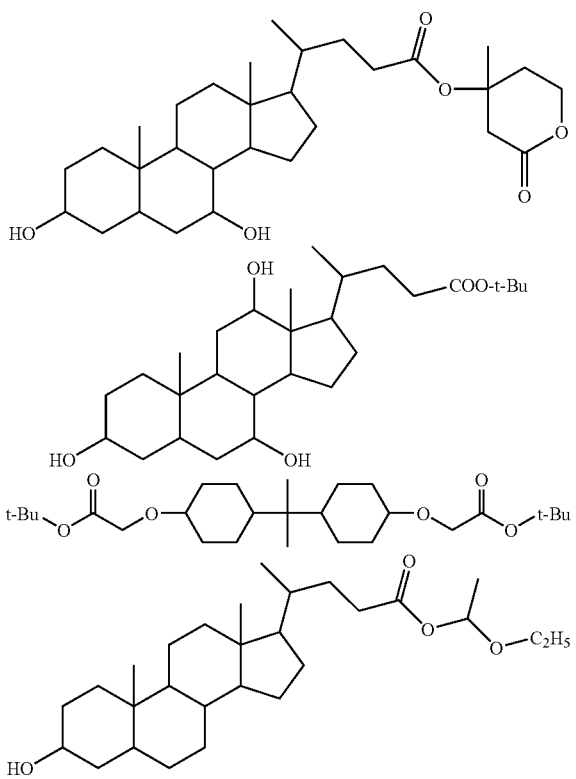

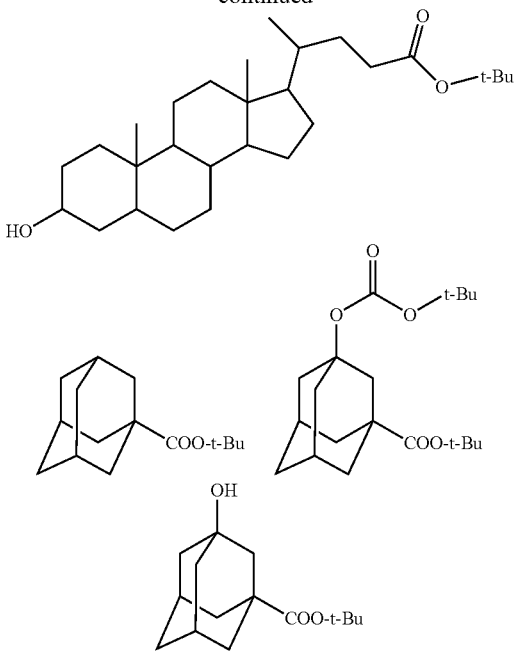

Other Additives:

The actinic ray-sensitive or radiation-sensitive resin composition of the present invention may further contain, for example, a dye, a plasticizer, a photosensitizer, a light absorbent and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

The actinic ray-sensitive or radiation-sensitive resin composition of the present invention is preferably used in a film thickness of 30 to 250 nm, more preferably from 30 to 200 nm, from the standpoint of enhancing the resolution. Such a film thickness can be obtained by setting the solid content concentration in the actinic ray-sensitive or radiation-sensitive resin composition to an appropriate range, thereby imparting an appropriate viscosity and enhancing the coatability and film-forming property.

The entire solid content concentration in the actinic ray-sensitive or radiation-sensitive resin composition is generally from 1 to 10 mass %, preferably from 1 to 8.0 mass %, more preferably from 1.0 to 6.0 mass %.

The actinic ray-sensitive or radiation-sensitive resin composition of the present invention is used by dissolving the components above in a predetermined organic solvent, preferably in the above-described mixed solvent, filtering the solution, and coating it on a predetermined support as follows. The filter used for filtering is preferably a polytetrafluoroethylene-, polyethylene- or nylon-made filter having a pore size of 0.1 µm or less, more preferably 0.05 µm or less, still more preferably 0.03 µm or less.

For example, the actinic ray-sensitive or radiation-sensitive resin composition is coated on such a substrate (e.g., silicon/silicon dioxide-coated substrate) as used in the production of a precision integrated circuit device, by an appropriate coating method such as spinner or coater and dried to form a resist film.

The resist film is exposed by irradiating an actinic ray or radiation thereon through a predetermined mask, preferably heated and then subjected to development and rinsing, whereby a good pattern can be obtained.

Examples of the an actinic ray or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam, with ArF excimer laser light, $F_2$ excimer laser light, EUV (13 nm) and electron beam being preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorbent and a polymer material. Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

In the development step, an alkali developer is used as follows. The alkali developer which can be used for the actinic ray-sensitive or radiation-sensitive resin composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid.

The actinic ray-sensitive or radiation-sensitive resin composition of the present invention may also be suitably used for pattern formation by immersion exposure where exposure is performed by filling a liquid (immersion medium) having a refractive index higher than that of air between the resist film and a lens at the irradiation with an actinic ray or radiation. By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist film. Therefore, the water used is preferably distilled water. Pure water obtained by further filtering the distilled water through an ion exchange filter or the like may also be used.

The electrical resistance of water as the immersion liquid is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or heavy water ($D_2O$) may be used in place of water.

In the case where the resist film formed of the actinic ray-sensitive or radiation-sensitive resin composition of the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability to the immersion liquid. The hydrophobic resin (HR) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the actinic ray-sensitive or radiation-sensitive resin composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again sucked into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important and the resist is required to have a performance of allowing a liquid droplet to follow the high-speed scanning of an exposure head and not to remain.

The fluorine atom or silicon atom in the hydrophobic resin (HR) may be present in the main chain of the resin or may be substituted to the side chain.

The hydrophobic resin (HR) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

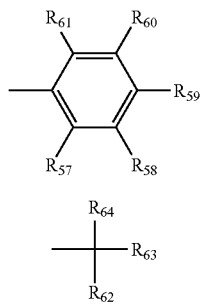

(F2)

(F3)

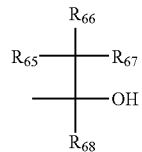

(F4)

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine together to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

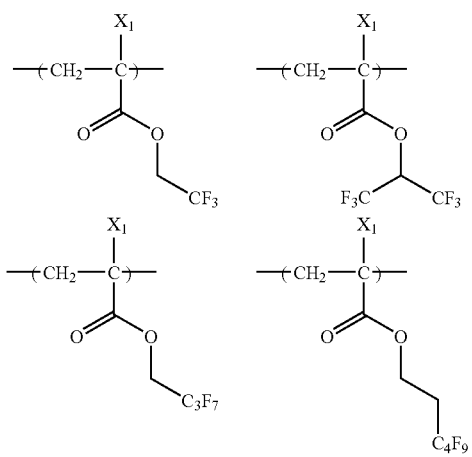

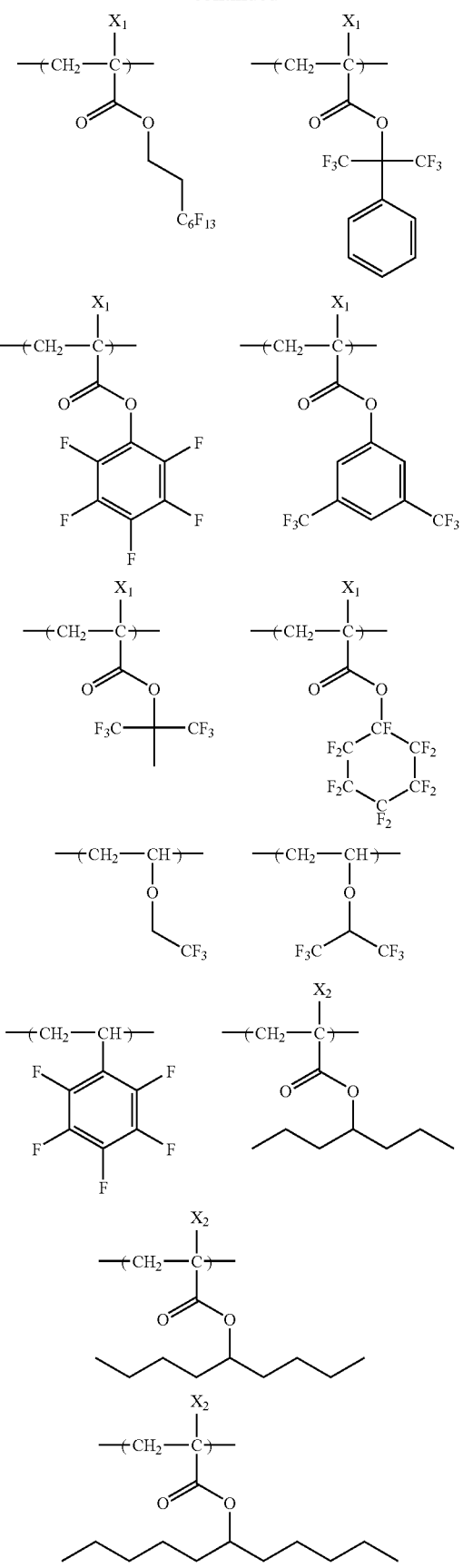
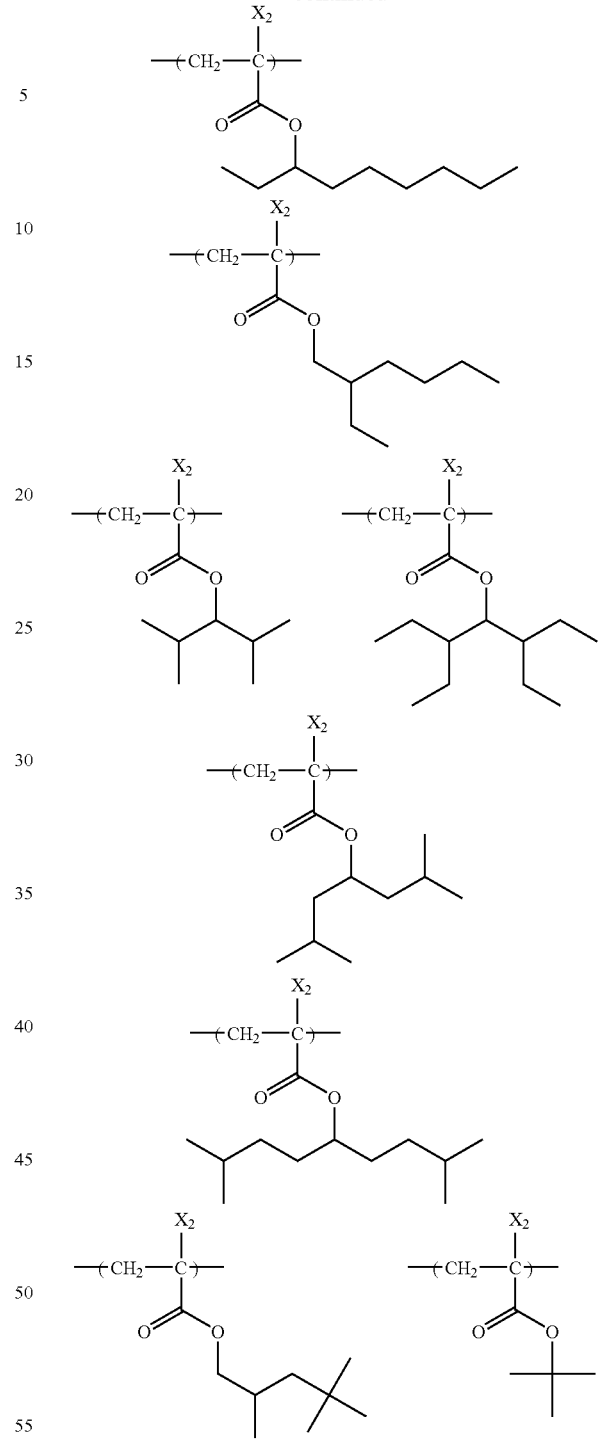
The hydrophobic resin (HR) is preferably a resin having an alkylsilyl structure (preferably a trialkylsilyl group) or a cyclic siloxane structure, as a silicon atom-containing partial structure.
Specific examples of the alkylsilyl structure and cyclic siloxane structure include the groups represented by the following formulae (CS-1) to (CS-3):

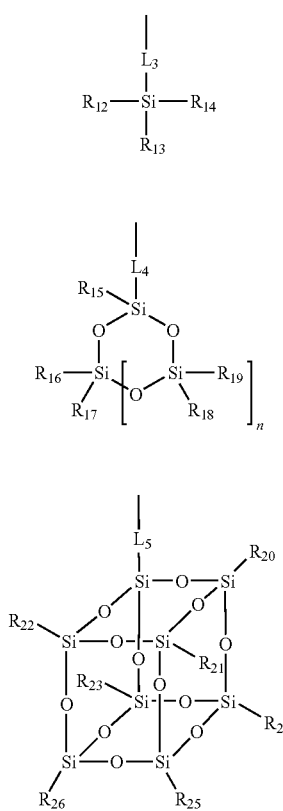

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a single group or a combination of two or more groups, selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a group represented by formula (CS-1) to (CS-3) are set forth below, but the present invention is not limited thereto.

In specific examples, $X_1$ represents a hydrogen atom, $-CH_3$, $-F$ or $-CF_3$.

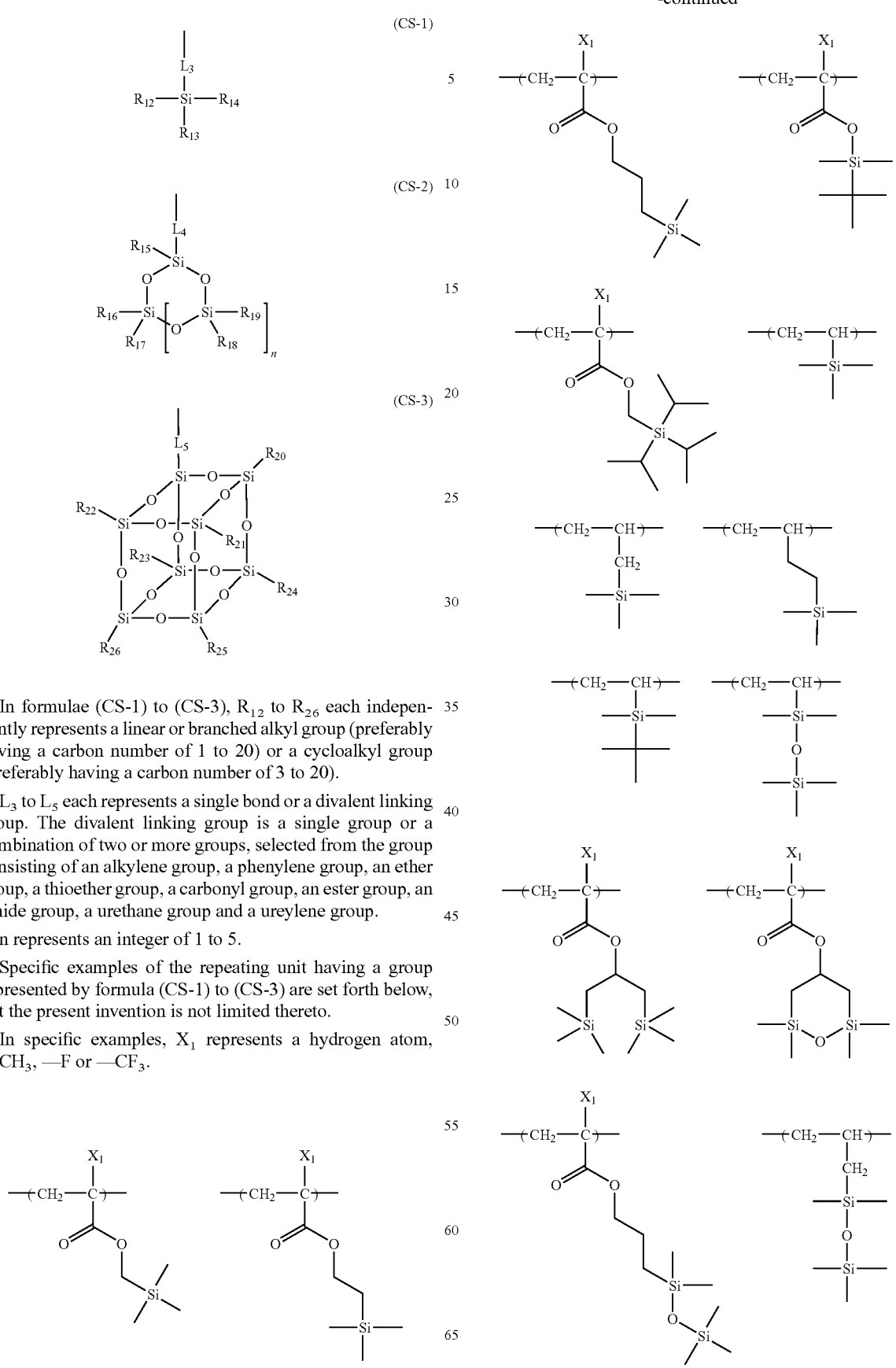

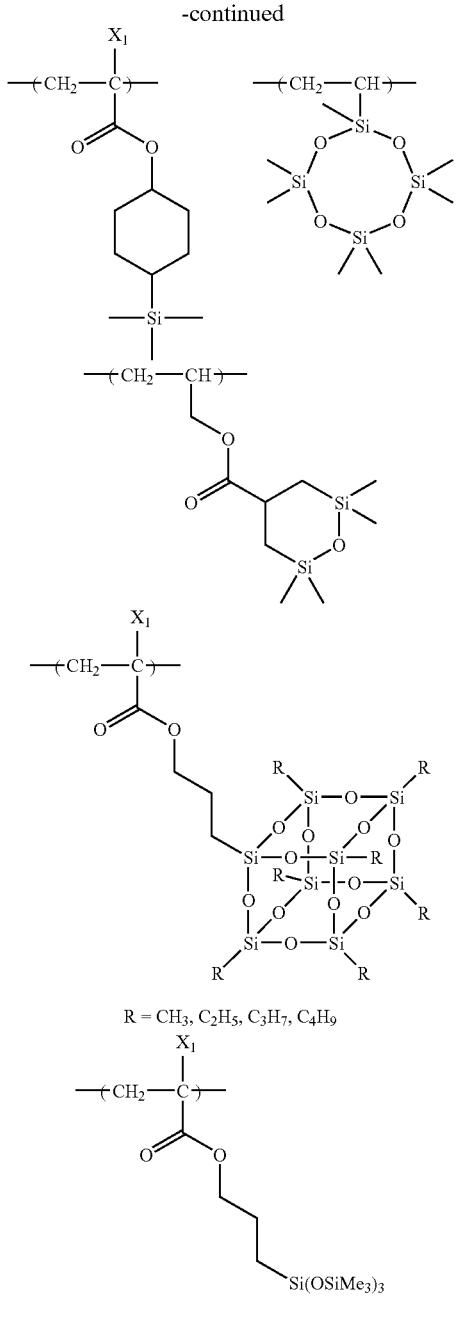

Furthermore, the hydrophobic resin (HR) may contain at least one group selected from the group consisting of the following (x) to (z):

(x) an alkali-soluble group,
(y) a group capable of decomposing by the action of an alkali developer to increase the solubility in an alkali developer, and
(z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkyl-sulfonyl)imide group, a tris(alkylcarbonyl)methylene group and a tris(alkylsulfonyl)methylene group.

Preferred alkali-soluble groups include a fluorinated alcohol group (preferably hexafluoroisopropanol), a sulfonimide group and a bis(carbonyl)methylene group.

The repeating unit having (x) an alkali-soluble group includes a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, and these repeating units all are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, $CH_3$, $CF_3$ or $CH_2OH$.

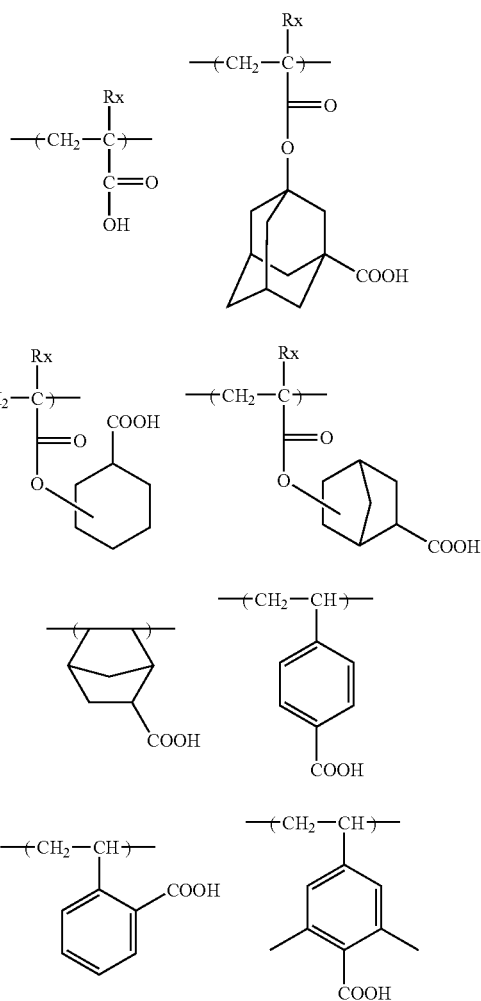

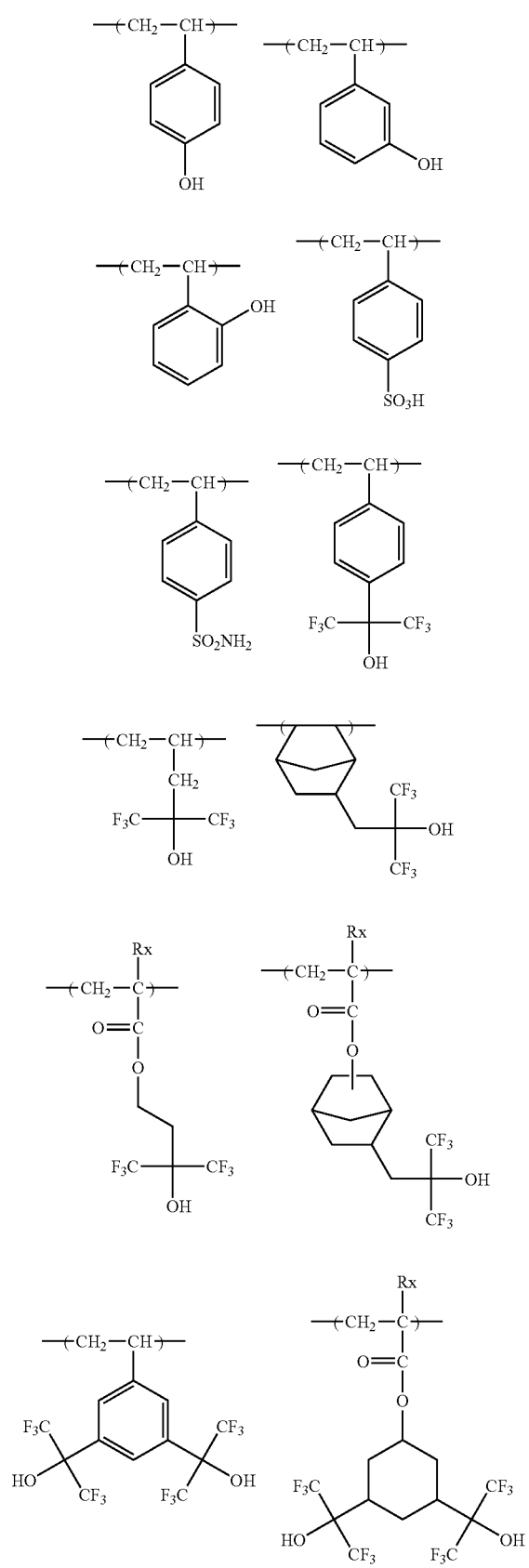

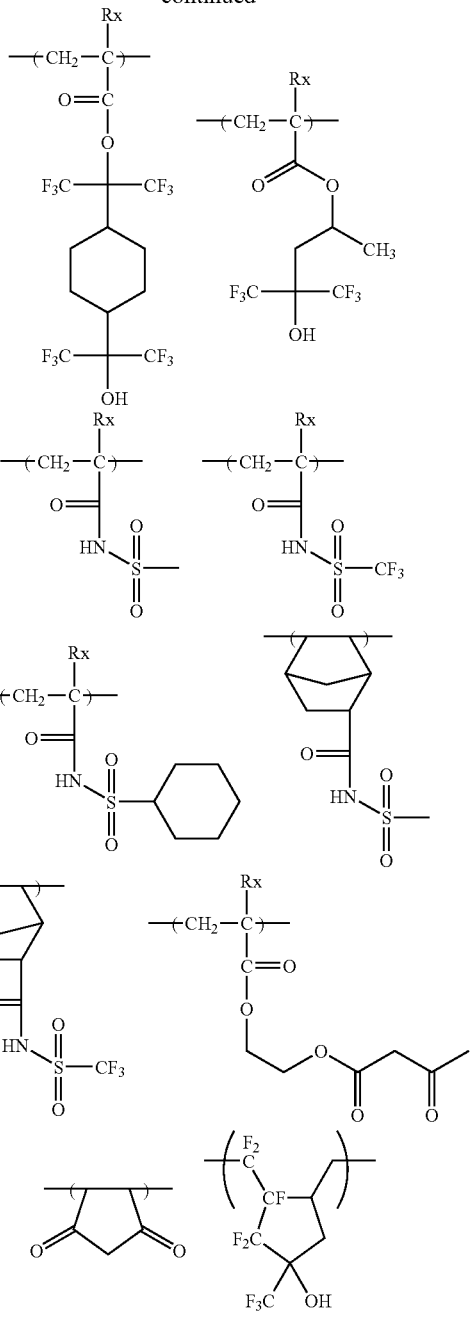

Examples of the (y) group capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing this group at the polymerization are preferred.

The content of the repeating unit having (y) a group capable of decomposing by the action of an alkali developer to increase the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group capable of decomposing by the action of an alkali developer to increase the solubility in an alkali developer are the same as those of the repeating unit having a lactone structure described for the resin as the component (A).

Examples of the repeating unit having (z) a group capable of decomposing by the action of an acid, contained in the hydrophobic resin (HR), are the same as those of the repeating unit having an acid-decomposable group described for the resin as the component (A). In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the polymer.

The hydrophobic resin (HR) may further contain a repeating unit represented by the following formula (III):

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-reduced weight average molecular of the hydrophobic resin (HR) is preferably from 1,000 to 100,000, more preferably from 1,000 to 50,000, still more preferably from 2,000 to 15,000.

Similarly to the resin as the component (A), the hydrophobic resin (HR) of course preferably has less impurities such as metal and also, the content of the residual monomer or oligomer component is preferably from 0 to 10 mass %, more preferably from 0 to 5 mass %, still more preferably from 0 to 1 mass %. When these conditions are satisfied, a resist free of foreign matters in the solution and suffering no change with time of sensitivity can be obtained. Also, in view of resolution, resist profile, side wall of resist pattern, roughness or the like, the molecular weight distribution (Mw/Mn, also called dispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the actinic ray-sensitive or radiation-sensitive resin composition of the present invention. By the use of the same solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration (the concentration of solute in the reaction solution) is normally from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution state, such as ultrafiltration of removing by extraction only those having a molecular weight not more than a specific value; a reprecipitation method of adding dropwise the resin solution in a poor solvent to solidify the resin in the poor solvent and thereby remove residual monomers or the like; and a purification method in a solid state, such as a method of subjecting a resin slurry separated by filtration to washing with a poor solvent. For example, the resin is precipitated as a solid by contacting the reaction solution with a solvent in which the resin is sparingly soluble or insoluble (poor solvent) and which is in a volume amount of 10 times or less, preferably from 10 to 5 times.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units from the left), weight average molecular weight and dispersity of each resin are shown in Table 1 below.

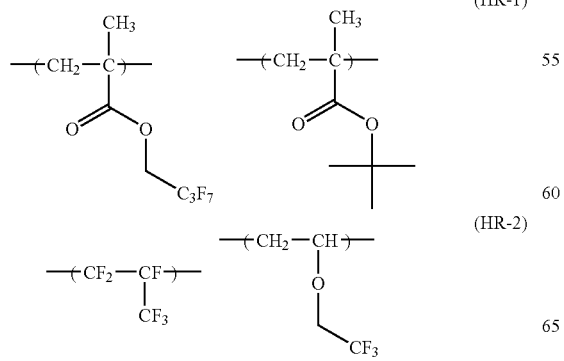
(HR-1)

(HR-2)

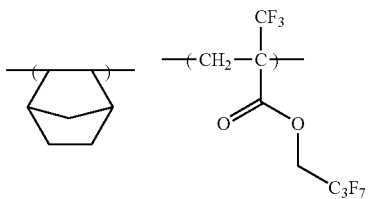
(HR-3)

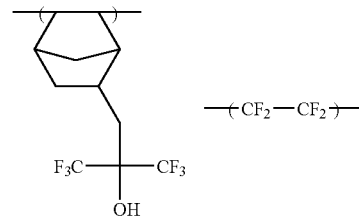
(HR-4)

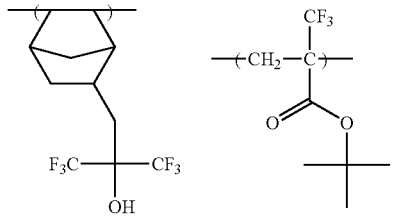
(HR-5)

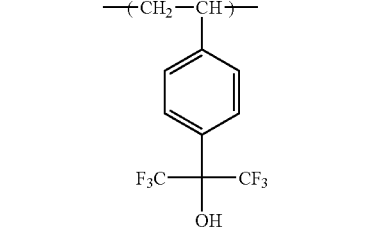
(HR-6)

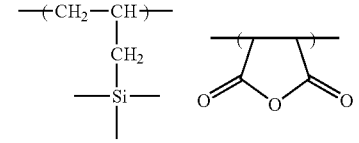
(HR-7)

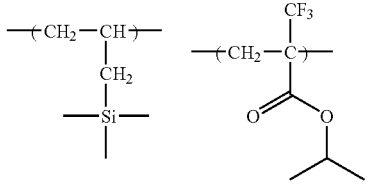
(HR-8)

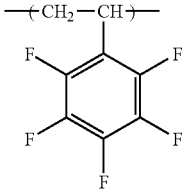
(HR-9)

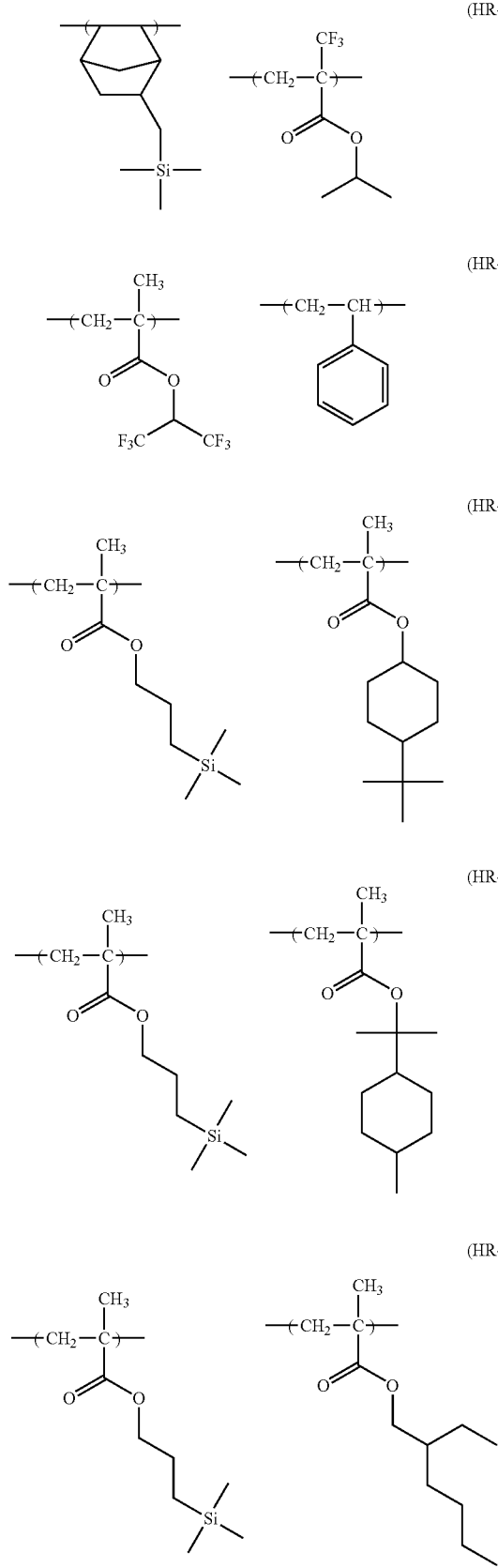
(HR-10)
(HR-11)
(HR-12)
(HR-13)
(HR-14)
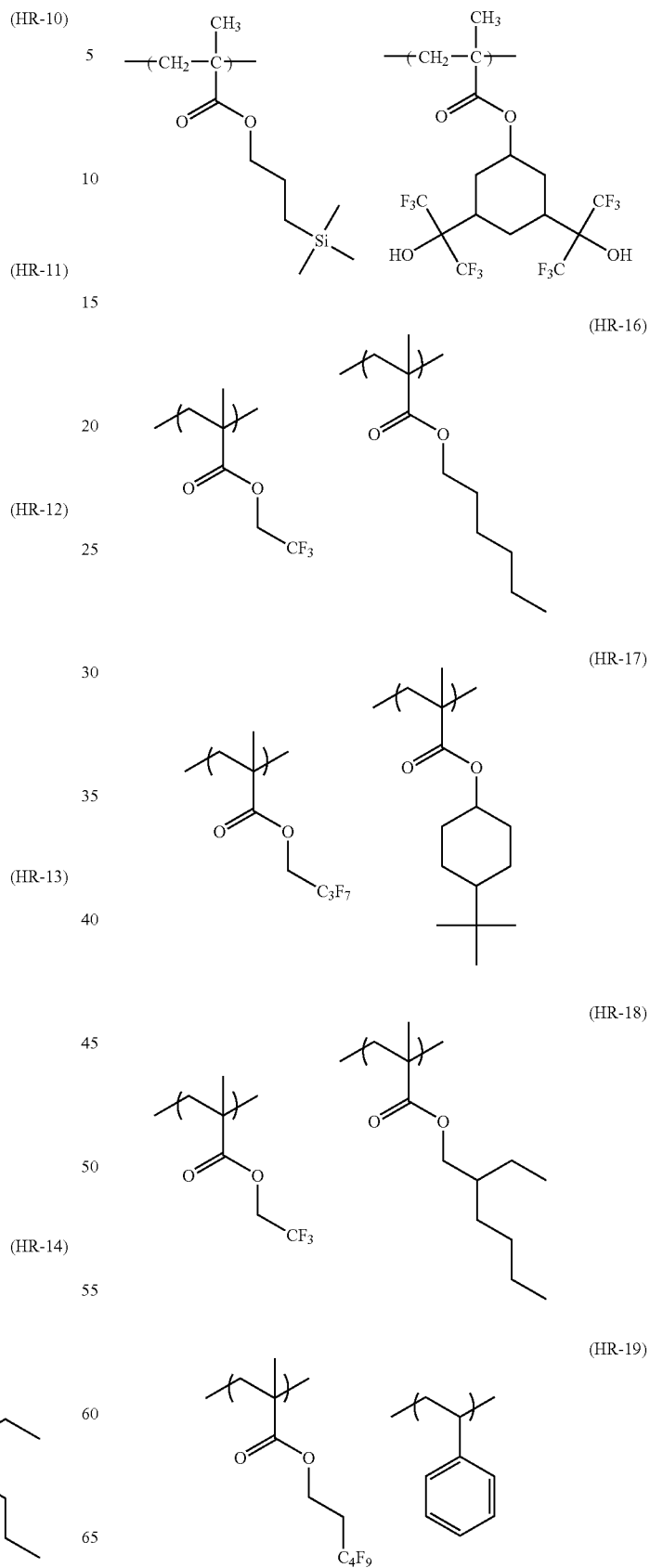
(HR-15)
(HR-16)
(HR-17)
(HR-18)
(HR-19)

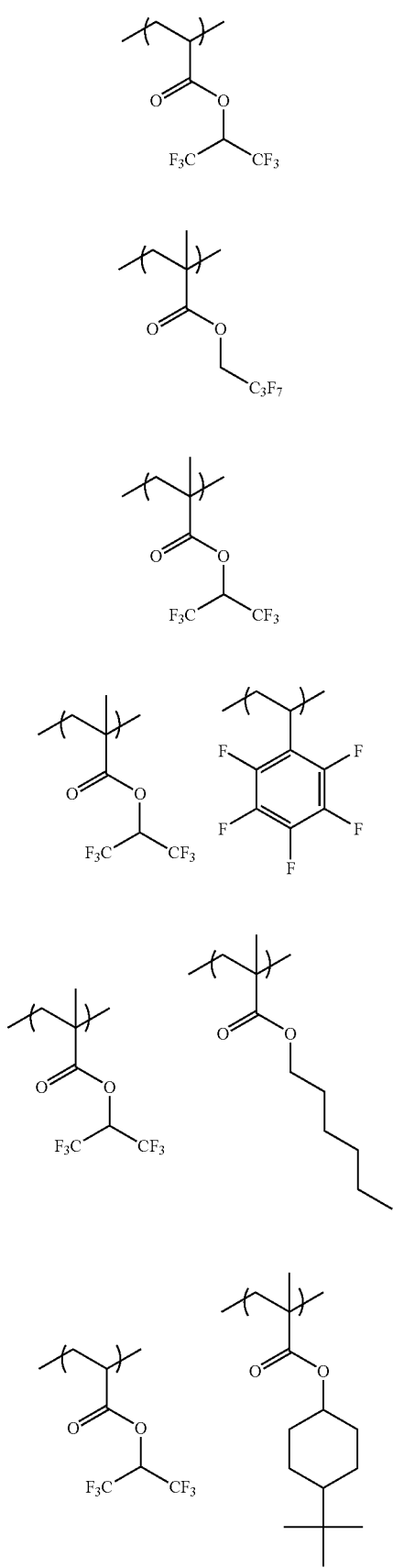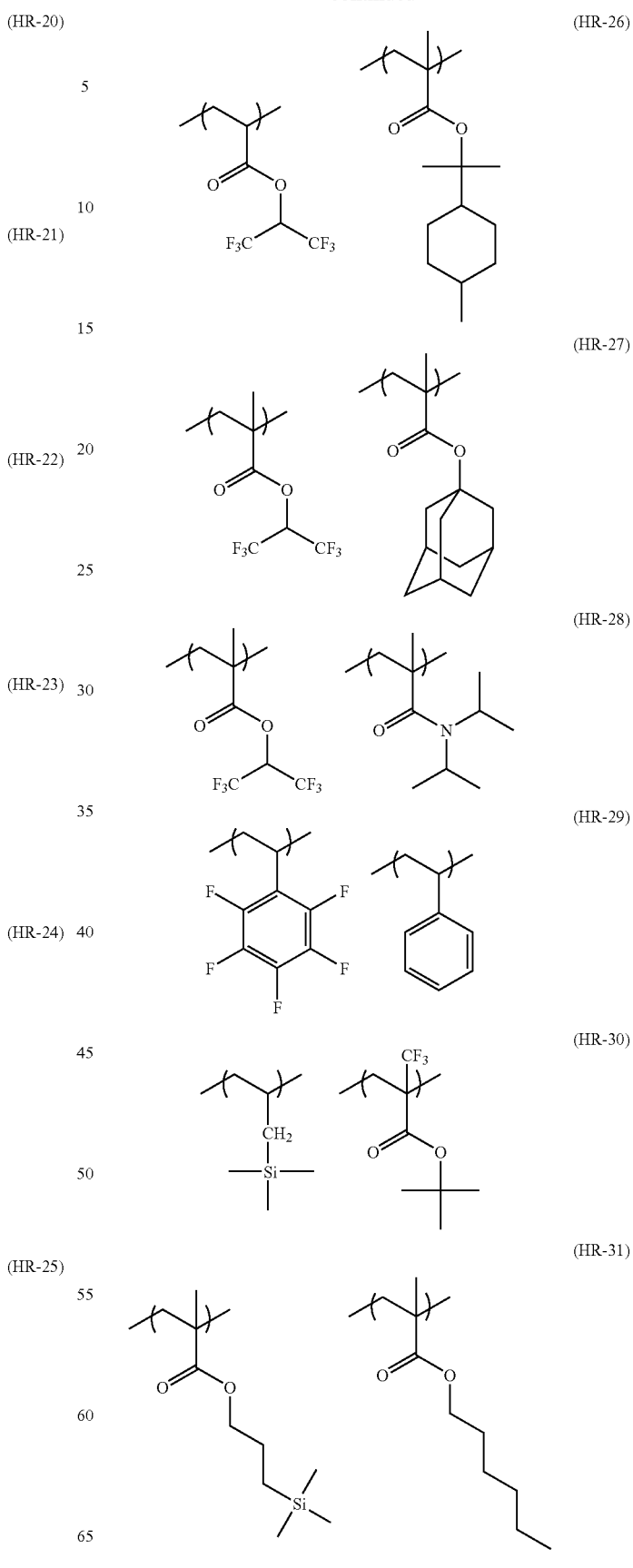

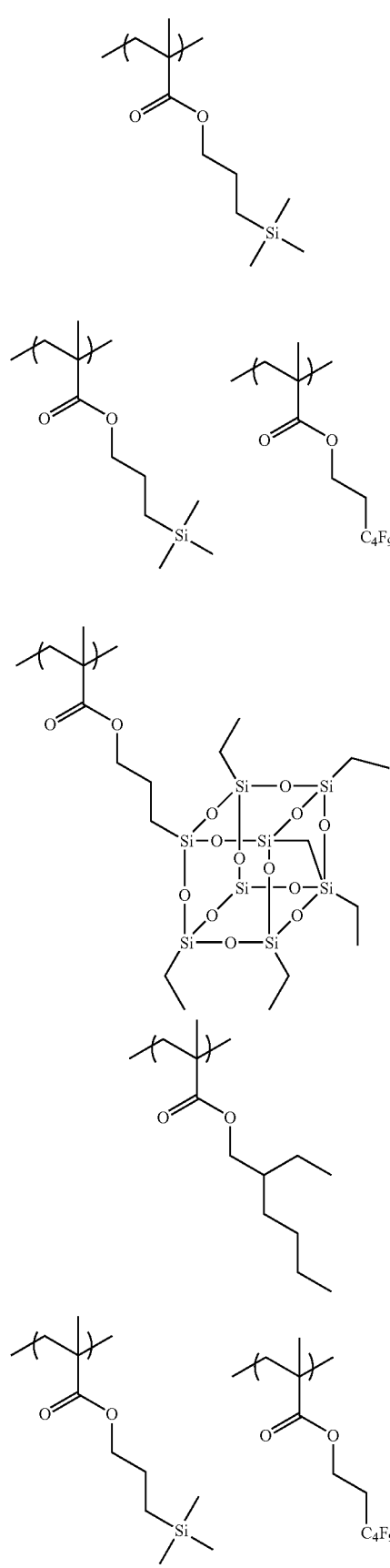
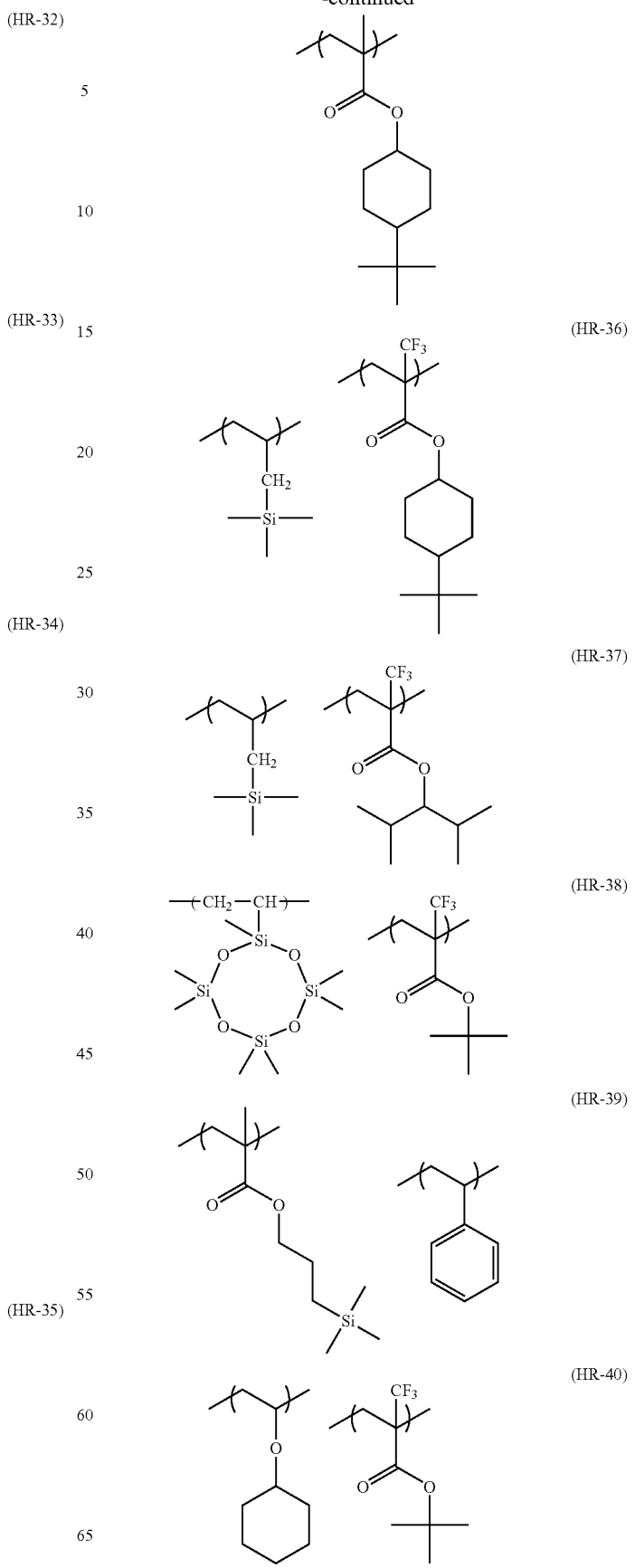

(HR-41)
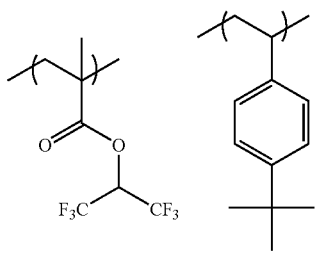
(HR-42)
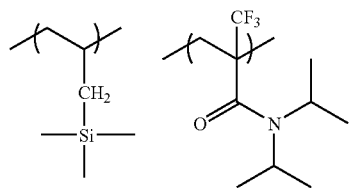
(HR-43)
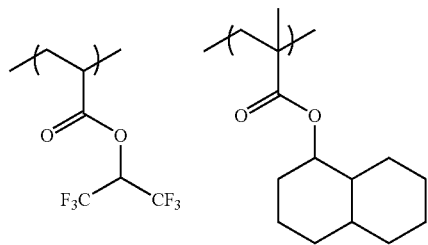
(HR-44)
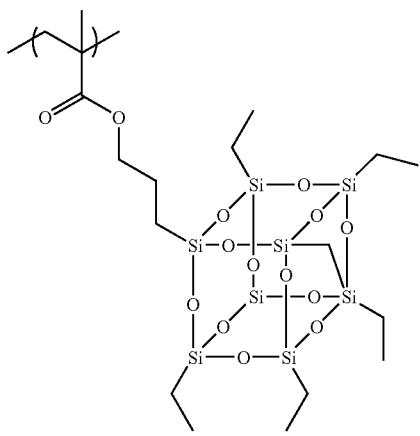
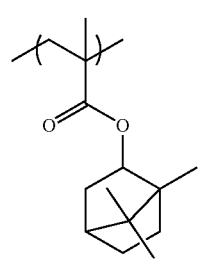
(HR-45)
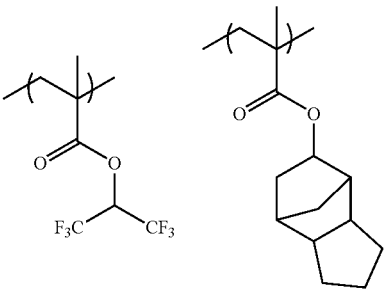
(HR-46)
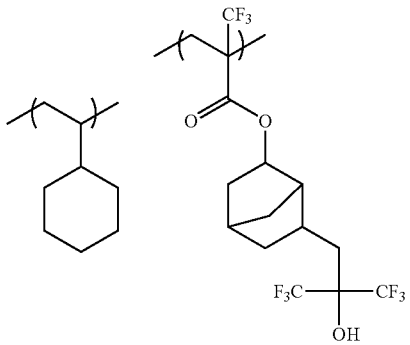
(HR-47)
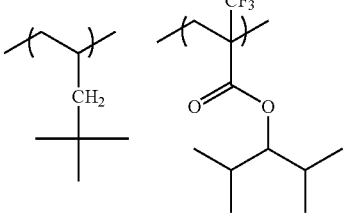
(HR-48)
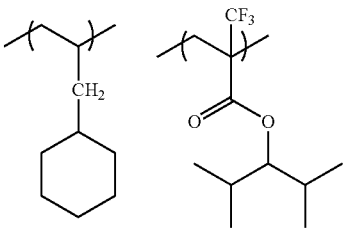
(HR-49)
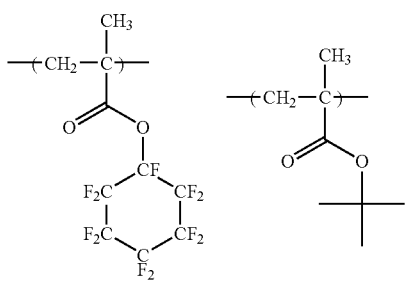

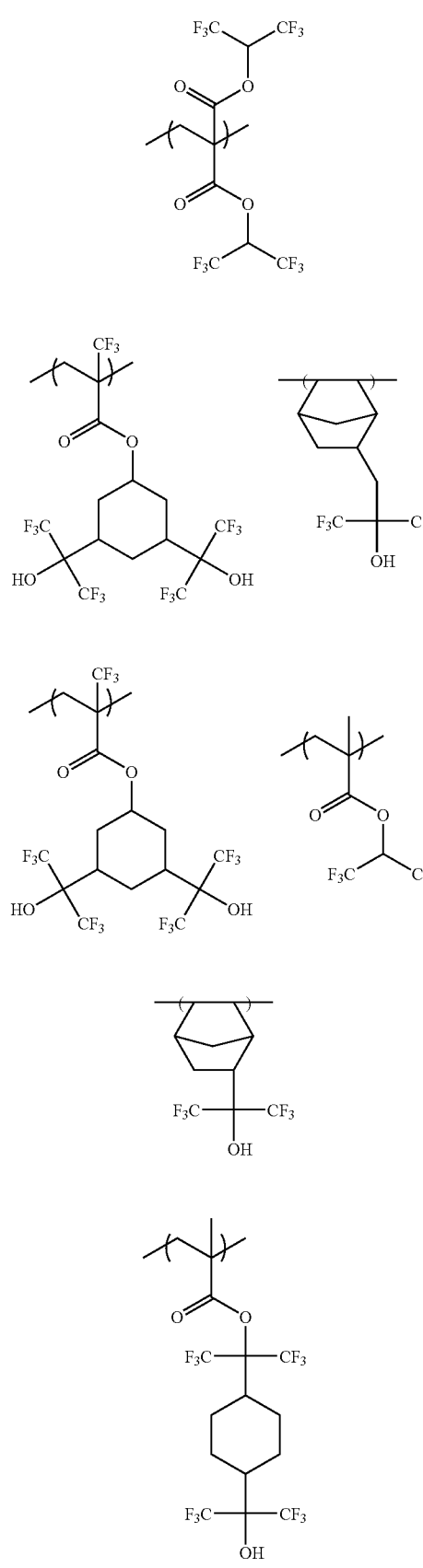
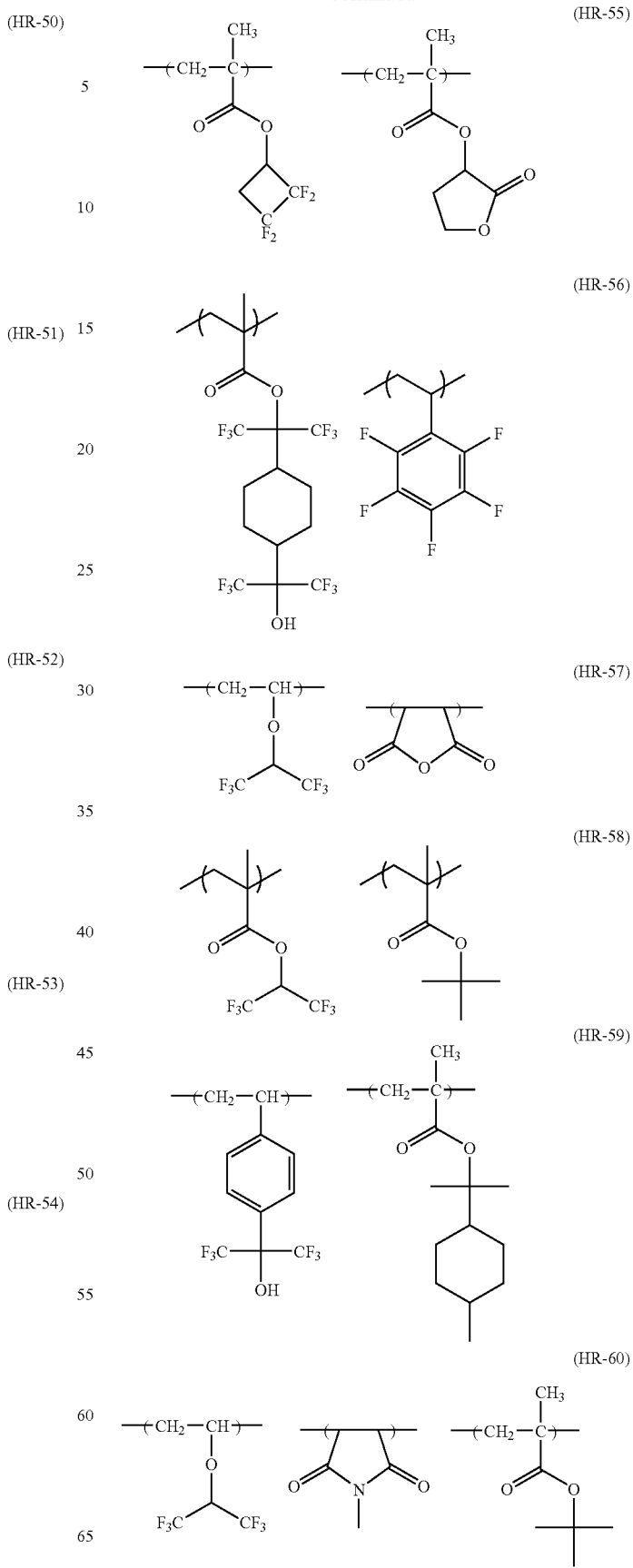

(HR-61)
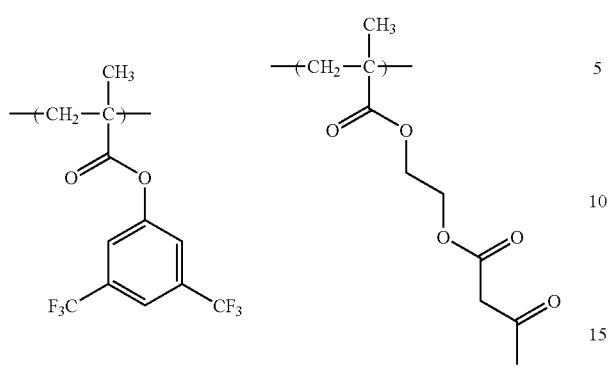
(HR-62)
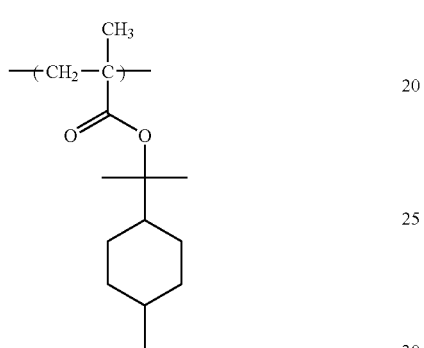
(HR-63)
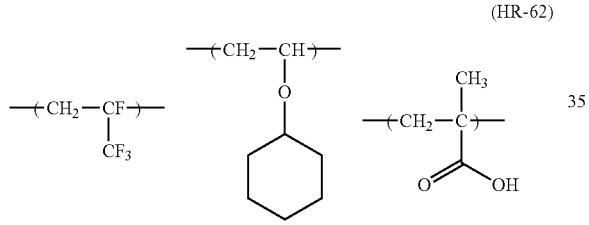
(HR-64)
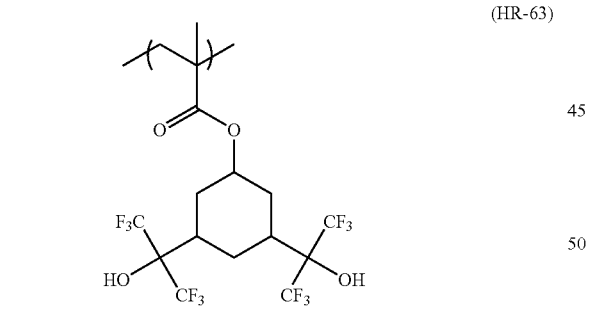
(HR-65)
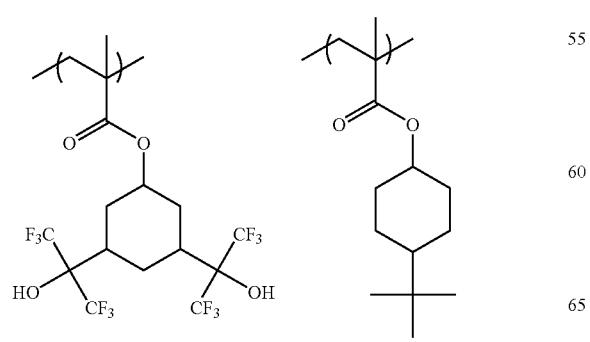
(HR-66)
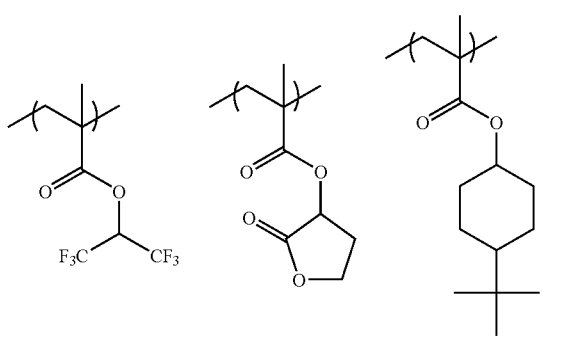
(HR-67)
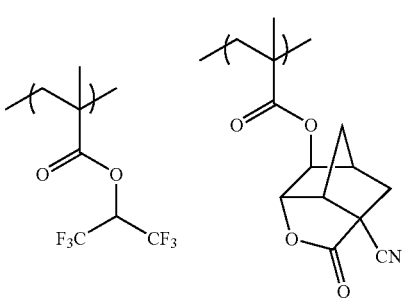
(HR-68)
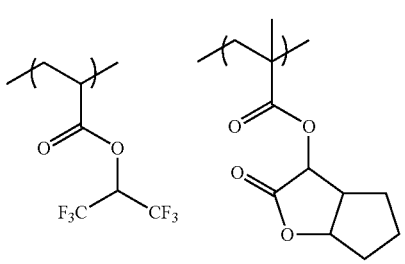
(HR-69)
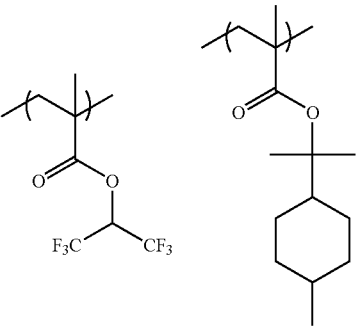

-continued
(HR-70)
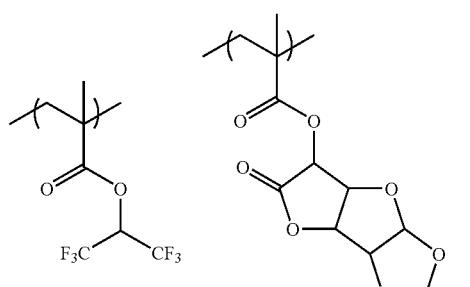
(HR-71)
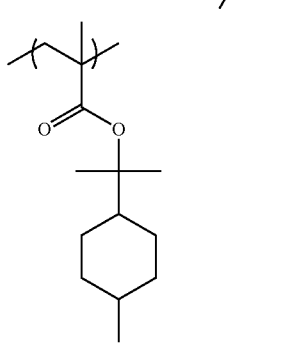
(HR-72)
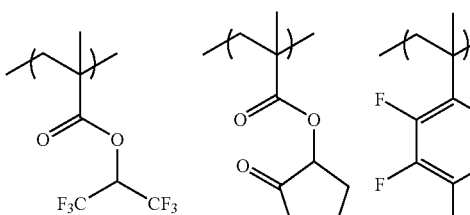
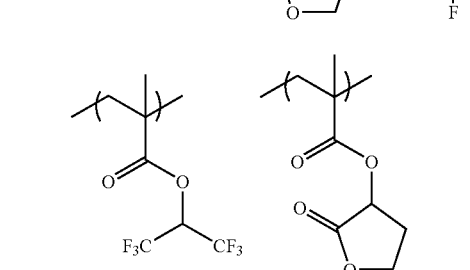
(HR-73)
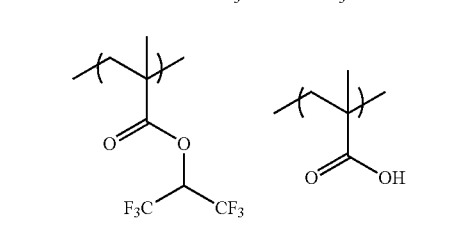
(HR-74)
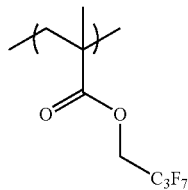
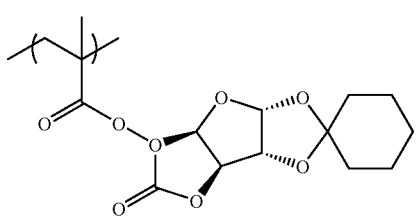
(HR-75)
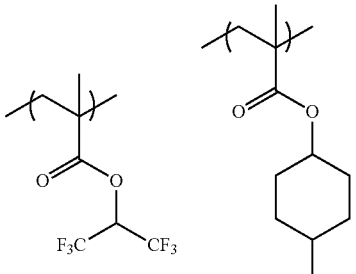
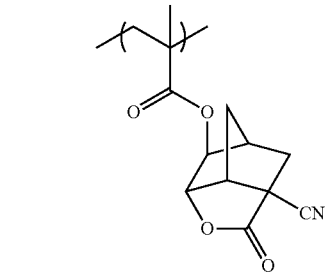
(HR-76)
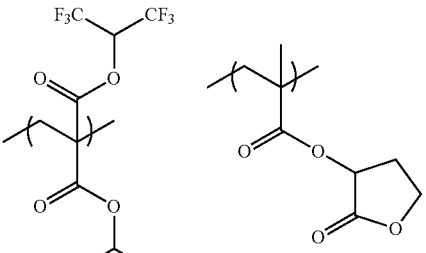
(HR-77)
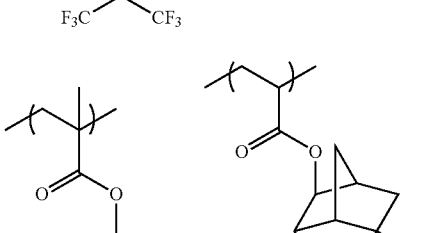

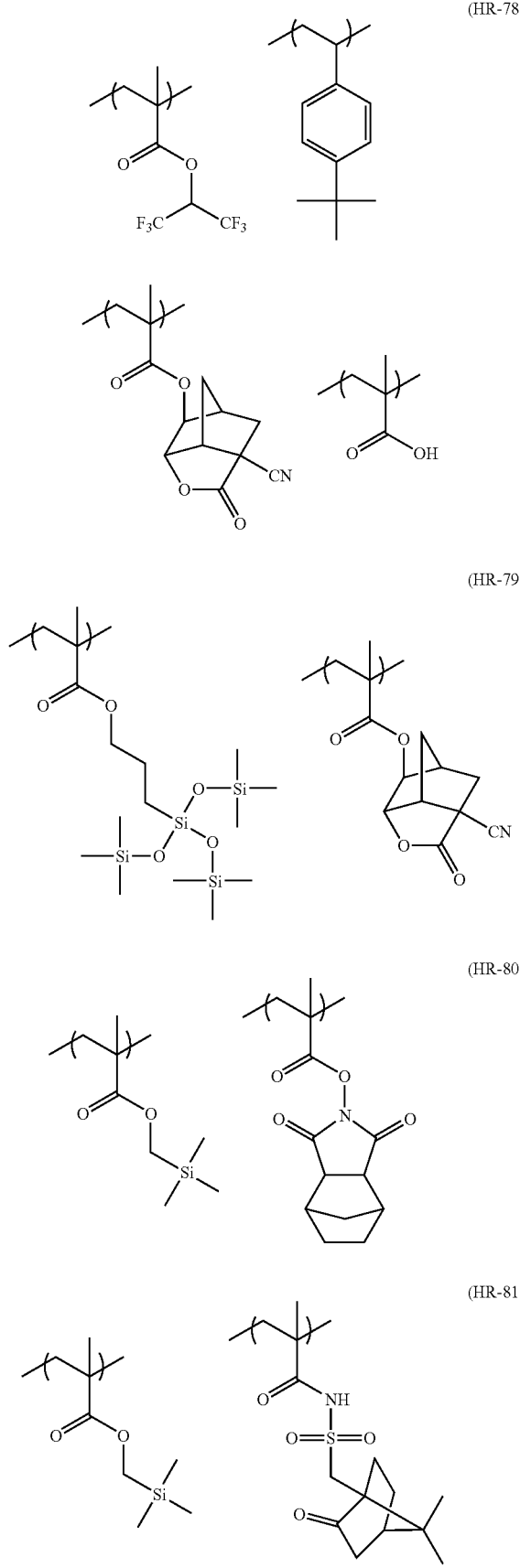
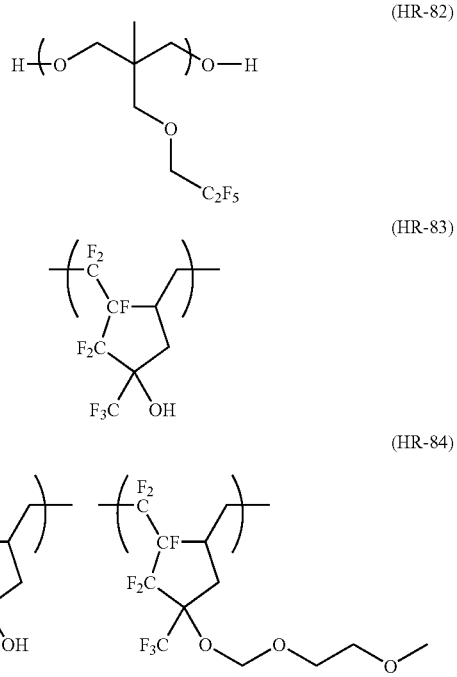
TABLE 1
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |

TABLE 1-continued

| Resin | Composition | Mw | Mw/Mn |
|---|---|---|---|
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

In order to prevent the resist film from directly contacting with the immersion liquid, a film (hereinafter, sometimes referred to as a "topcoat") sparingly soluble in an immersion liquid may be provided between the immersion liquid and the resist film formed of the actinic ray-sensitive or radiation-sensitive resin composition of the present invention. The functions required of the topcoat are suitability for coating as an overlayer of the resist, transparency to radiation particularly at 193 nm, and scarce solubility in the immersion liquid. The topcoat is preferably unmixable with the resist and capable of being uniformly coated as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is also suitable as the topcoat. If impurities are dissolved out into the immersion liquid from the topcoat, the optical lens is contaminated. In this viewpoint, the amount of residual monomers of the polymer contained in the topcoat is preferably smaller.

On peeling off the topcoat, a developer may be used or a releasing agent may be separately used. The releasing agent is preferably a solvent less permeating into the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the resist film and further unmixable with the immersion liquid. From this standpoint, when the immersion liquid is water, the topcoat solvent is preferably a medium which is sparingly soluble in the solvent used for the actinic ray-sensitive or radiation-sensitive resin composition and insoluble in water. Furthermore, when the immersion liquid is an organic solvent, the topcoat may be either water-soluble or water-insoluble.

Polymerizable compound having lactone structure represented by formula (M-1):

The repeating unit containing a group having a lactone structure represented by formula (1) in the resin as the component (A) can be derived, for example, from a novel polymerizable compound having a lactone structure, represented by the following formula (M-1). That is, another aspect of the present invention is a novel polymerizable compound having a lactone structure, represented by the following formula (M-1):

Formula (M-1):

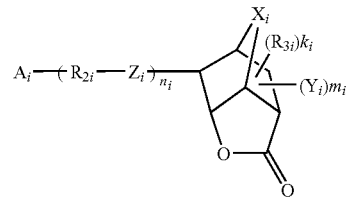

In formula (M-1), $A_i$ represents a polymerizable site.

$R_{2i}$ represents, when a plurality of $R_{2i}$'s are present, each independently represents, a chain or cyclic alkylene group which may have a substituent.

$R_{3i}$ represents, when a plurality of $R_{3i}$'s are present, each independently represents, an alkyl group which may have a substituent, or a cycloalkyl group which may have a substituent, and when a plurality of $R_{3i}$'s are present, two $R_{3i}$'s may combine to form a ring.

$X_i$ represents an alkylene group which may have a substituent, an oxygen atom or a sulfur atom.

$Y_i$ represents, when a plurality of $Y_i$'s are present, each independently represents, an electron-withdrawing group.

$Z_i$ represents, when a plurality of $Z_i$'s are present, each independently represents, a single bond, an ether bond, an ester bond, an amide bond, a urethane bond or a urea bond.

$k_i$ is the number of substituents and represents an integer of 0 to 8.

$n_i$ is the number of repetitions and represents an integer of 1 to 5.

$m_i$ is the number of substituents and represents an integer of 1 to 7.

The polymerizable site of $A_i$ is not particularly limited but is preferably a skeleton having a radical polymerizable group, an anion polymerizable group or a cation polymerizable group, more preferably a (meth)acrylate skeleton, a styrene skeleton or an epoxy skeleton, still more preferably a (meth)acrylate skeleton.

The group represented by $R_{2i}$ is not particularly limited as long as it is a chain alkylene group or a cyclic alkylene group, but the chain alkylene group is preferably a chain alkylene group having a carbon number of 1 to 10, more preferably from 1 to 5, and examples thereof include a methylene group, an ethylene group and a propylene group. The cyclic alkylene group is preferably a cyclic alkylene group having a carbon number of 1 to 20, and examples thereof include cyclohexylene, cyclopentylene, norbornylene and adamantylene. The group represented by $R_{2i}$ is preferably a chain alkylene, more preferably a methylene group. The chain alkylene group and cyclic alkylene group may have a substituent without any particular limitation. Examples of the substituent on the chain alkylene group and cyclic alkylene group include a halogen atom such as fluorine atom, chlorine atom and bromine atom, a mercapto group, a hydroxy group, an alkoxy group such as methoxy group, ethoxy group, isopropoxy group, a tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group. In the case where $n_i$ is 2 or more, each group represented by $R_{2i}$ may be independently the same as or different from every other groups.

The alkyl group represented by $R_{3i}$ is preferably an alkyl group having a carbon number of 1 to 30, more preferably a linear or branched alkyl group having a carbon number of 1 to 15, and specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

The cycloalkyl group as $R_{3i}$ is preferably a cycloalkyl group having a carbon number of 3 to 20 and may be polycyclic or may have an oxygen atom in the ring. Specific examples thereof include a cyclopropyl group, a cyclopentyl group, a cyclohexyl group, a norbornyl group and an adamantyl group.

The alkyl group and cycloalkyl group of $R_{3i}$ may have a substituent. Examples of the substituent on the alkyl group and cycloalkyl group include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group. Also, groups represented by $R_{3i}$ may combine together to form a cycloalkylene group.

The group represented by $X_i$ is an alkylene group which may have a substituent, an oxygen atom or a sulfur atom. The alkylene group which may have a substituent is preferably an alkylene group having a carbon number of 1 to 2, and examples thereof include a methylene group and an ethylene group. Examples of the substituent on the alkylene group include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, an alkyl group such as methyl group, ethyl group, propyl group, isopropyl group, butyl group, sec-butyl group, tert-butyl group, pentyl group and hexyl group, a cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group.

The electron-withdrawing group represented by $Y_i$ is not particularly limited, but examples thereof include a cyano group, a trifluoromethyl group, a nitro group, a carboxyl group, a ketone group, an acyloxy group, a hydroxy group, a perfluoroalkyl group, an alkoxy group such as methoxy group, ethoxy group, isopropoxy group, tert-butoxy group and benzyloxy group, an alkoxycarbonyl group (preferably having a carbon number of 10 or less), and an alkylsulfonyl group (preferably having a carbon number of 10 or less). Among these, a cyano group, a trifluoromethyl group, a nitro group, a ketone group and an acyloxy group are preferred, and a cyano group is more preferred. The substitution position of $Y_i$ is most preferably a position shown below.

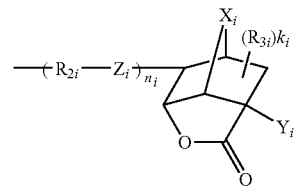

The group represented by $Z_i$ is a single bond, an ether bond, an ester bond, an amide bond, a urethane bond or a urea bond, more preferably a single bond, an ether bond or an ester bond, still more preferably an ester bond. $Z_i$ may be positioned on whichever side, endo side or exo side, of the norbornane skeleton.

$k_i$ is the number of substituents and represents an integer of 0 to 8, preferably from 0 to 5, more preferably from 0 to 3.

$n_i$ is the number of repetitions and represents an integer of 1 to 5, preferably 1 or 2, and most preferably 1.

$m_i$ is the number of substituents and represents an integer of 1 to 7, preferably from 1 to 5, more preferably from 1 to 3, and most preferably 1.

The polymerizable compound having a lactone structure represented by formula (M-1) is preferably represented by the following formula (M-2):

Formula (M-2):

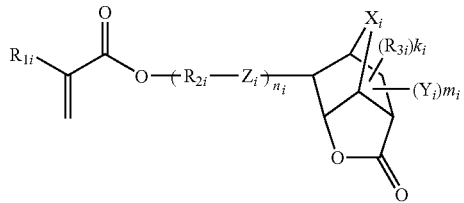

In formula (M-2), $R_{1i}$ represents a hydrogen atom, an alkyl group which may have a substituent, or a halogen atom.

$R_{2i}$ represents, when a plurality of $R_{2i}$'s are present, each independently represents, a chain or cyclic alkylene group which may have a substituent.

$R_{3i}$ represents, when a plurality of $R_{3i}$'s are present, each independently represents, an alkyl group which may have a substituent, or a cycloalkyl group which may have a substituent, and when a plurality of $R_{3i}$'s are present, two $R_{3i}$'s may combine to form a ring.

$X_i$ represents an alkylene group which may have a substituent, an oxygen atom or a sulfur atom.

$Y_i$ represents, when a plurality of $Y_i$'s are present, each independently represents, an electron-withdrawing group.

$Z_i$ represents, when a plurality of $Z_i$'s are present, each independently represents, a single bond, an ether bond, an ester bond, an amide bond, a urethane bond or a urea bond.

$k_i$ is the number of substituents and represents an integer of 0 to 8.

$n_i$ is the number of repetitions and represents an integer of 1 to 5, and $m_i$ is the number of substituents and represents an integer of 1 to 7.

$R_{2i}$, $R_{3i}$, $X_i$, $Y_i$, $Z_i$, $k_i$, $n_i$ and $m_i$ in formula (M-2) have the same meanings as $R_{2i}$, $R_{3i}$, $X_i$, $Y_i$, $Z_i$, $k_i$, $n_i$ and $m_i$ in formula (M-1).

The compound preferably has at least one substituent $Y_i$ at the α-position or β-position, more preferably at the α-position, of the carbonyl group of the lactone.

The group represented by $R_{1i}$ is a hydrogen atom, an alkyl group which may have a substituent, or a halogen atom, preferably a hydrogen atom or an alkyl group which may have a substituent. Preferred examples of the substituent on the alkyl group include a halogen atom, a hydroxy group, and an alkoxy group such as methoxy group, ethoxy group, isopropoxy group, tert-butoxy group and benzyloxy group.

The group particularly preferred as $R_{1i}$ is a hydrogen atom, a methyl group, a hydroxymethyl group or a trifluoromethyl group.

The polymerizable compound having a lactone structure represented by formula (M-1) is preferably represented by the following formula (M-3):

Formula (M-3):

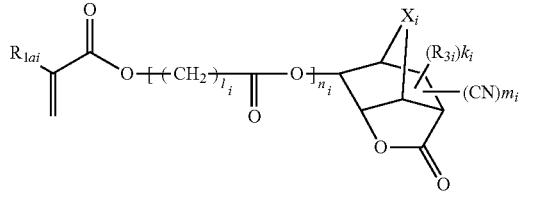

$R_{1ai}$ represents a hydrogen atom, a methyl group, a hydroxymethyl group, a halogenated methyl group or a halogen atom.

$R_{3i}$ represents, when a plurality of $R_{3i}$'s are present, each independently represents, an alkyl group which may have a substituent, or a cycloalkyl group which may have a substituent, and when a plurality of $R_{3i}$'s are present, two $R_{3i}$'s may combine to form a ring.

$X_1$ represents an alkylene group which may have a substituent, an oxygen atom or a sulfur atom.

$k_i$ is the number of substituents and represents an integer of 0 to 8.

$l_i$ is the number of repetitions and represents an integer of 1 to 5.

$n_i$ is the number of repetitions and represents an integer of 1 to 5.

$m_i$ is the number of substituents and represents an integer of 1 to 7.

$R_{3i}$, $X_i$, $k_i$, $n_i$ and $m_i$ in formula (M-3) have the same meanings as $R_{3i}$, $X_i$, $k_i$, $n_i$ and $m_i$ in formula (M-1). The compound preferably has at least one cyano group (CN) at the α-position or β-position, more preferably at the α-position, of the carbonyl group of the lactone.

The halogenated methyl group of $R_{1ai}$ is preferably a trifluoromethyl group.

$l_i$ is the number of repetitions of the methylene group and represents an integer of 1 to 5, preferably an integer of 1 to 3, more preferably 1.

The synthesis method of the compound represented by formula (M-1) is not particularly limited, but the compound can be synthesized by the following method.

That is, a norbornene (a) is synthesized from the corresponding diene and dienophile by the Diels-Alder reaction and (1) starting from the double bond site, (b) is obtained by halolactonization or through an epoxide.

The spacer site $R_{2i}$ and the polymerizable site $A_i$ (2) may be stepwise introduced by introducing the spacer site by an etherification reaction, an esterification reaction or the like and then introducing the polymerizable site, or (4) may be introduced by directly coupling a unit having both the polymerizable site and the spacer site.

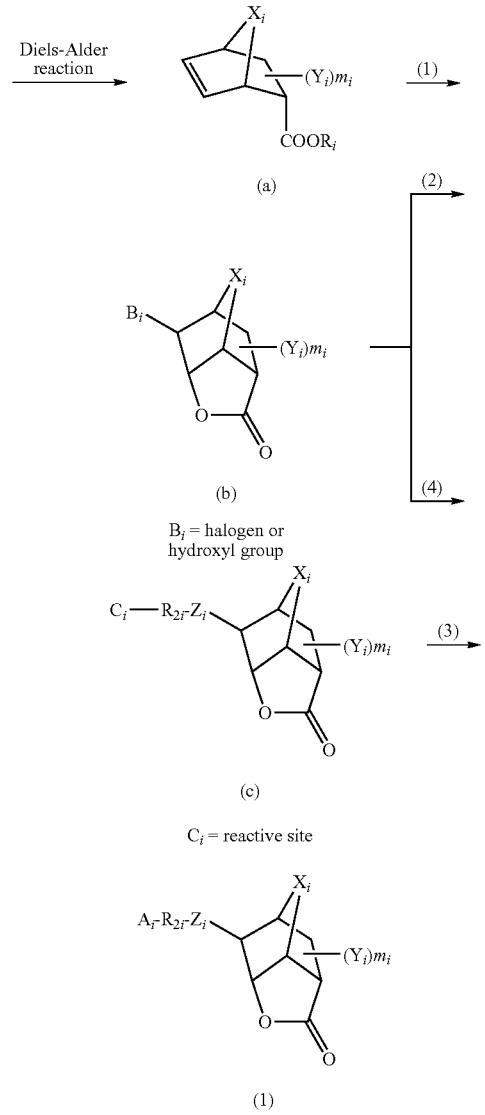

-continued

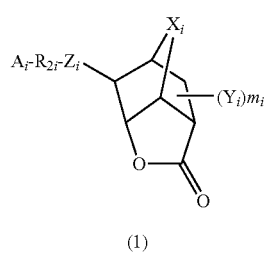

(1)

$R_i$ in formula (a) represents, for example, a hydrogen atom, an alkyl group or an aryl group, and $R_i$ is preferably an alkyl group. As the alkyl group, methyl group, ethyl group, n-propyl group, isopropyl group, n-butyl group, sec-butyl group, tert-butyl group, pentyl group, hexyl group, octyl group and 2-ethylhexyl group are exemplified.

Specific examples of the polymerizable compound having a lactone structure are set forth below, but the present invention is not limited thereto.

In the following formulae, $R_{1i}$ represents a hydrogen atom, an alkyl group which may have a substituent, or a halogen atom and is preferably a hydrogen atom, a methyl group, a hydroxymethyl group, a trifluoromethyl group or a halogen atom.

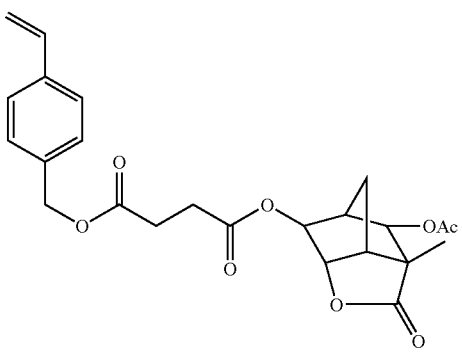

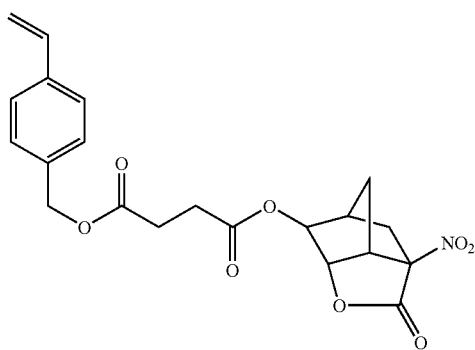

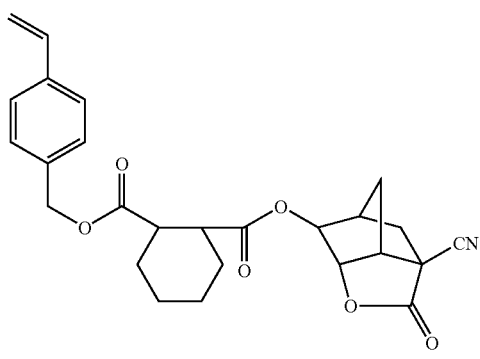

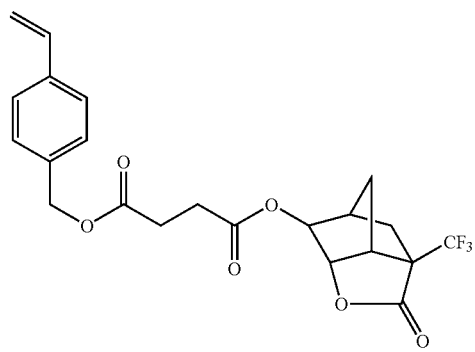

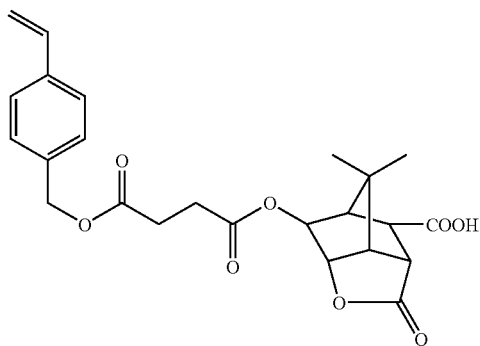

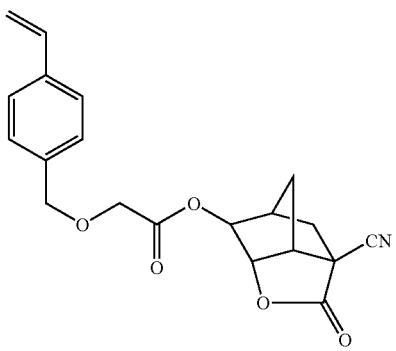

121
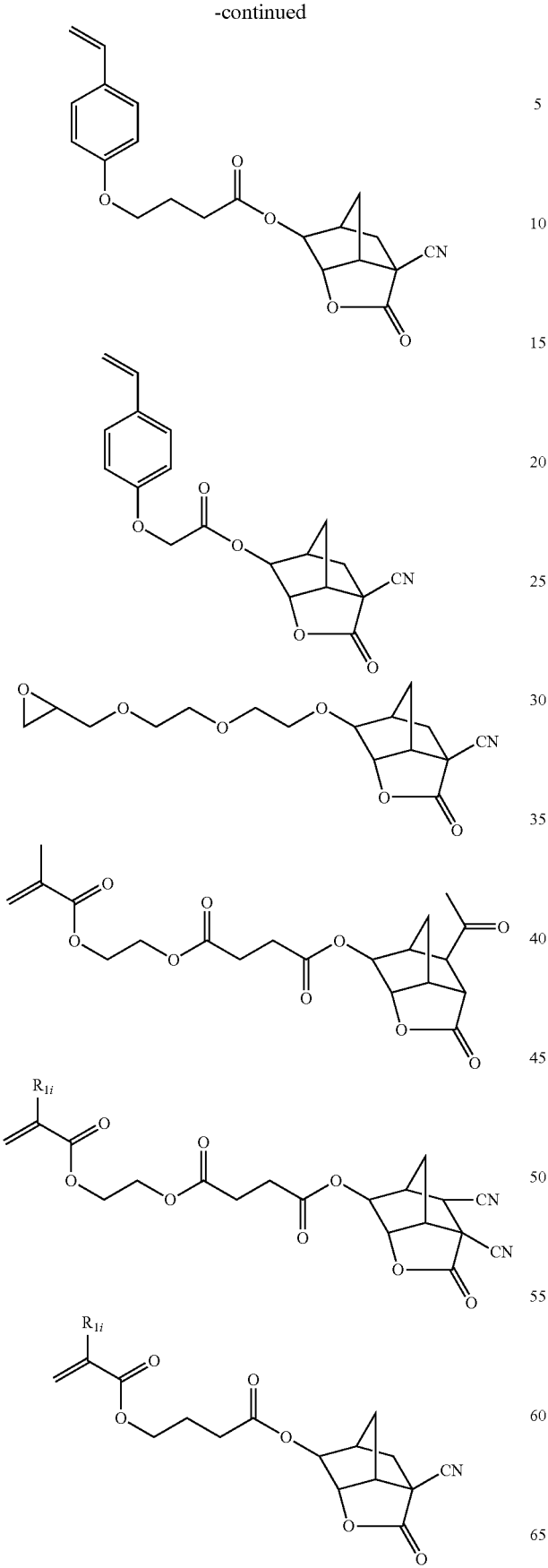
122
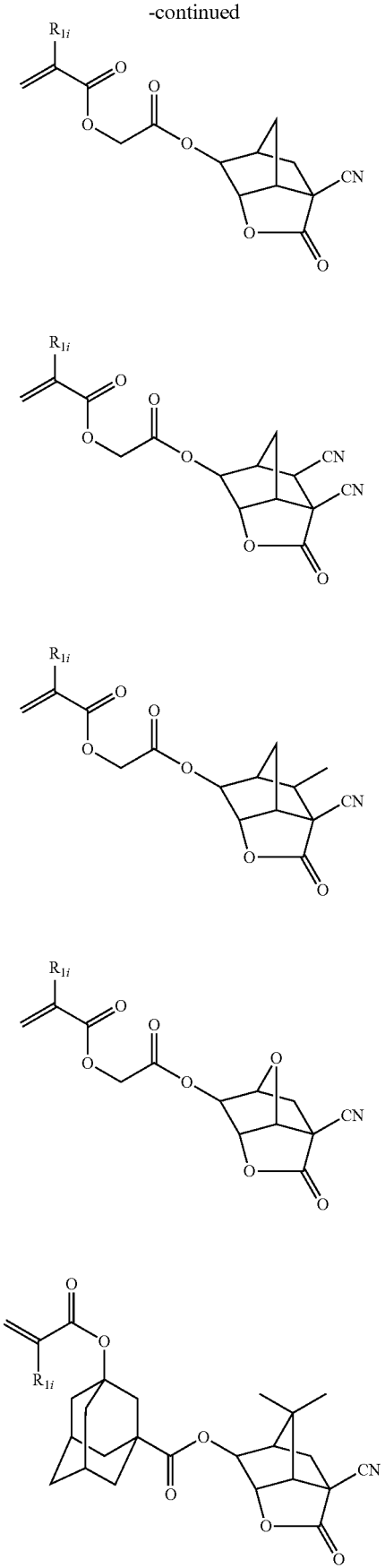

123
-continued
124
-continued
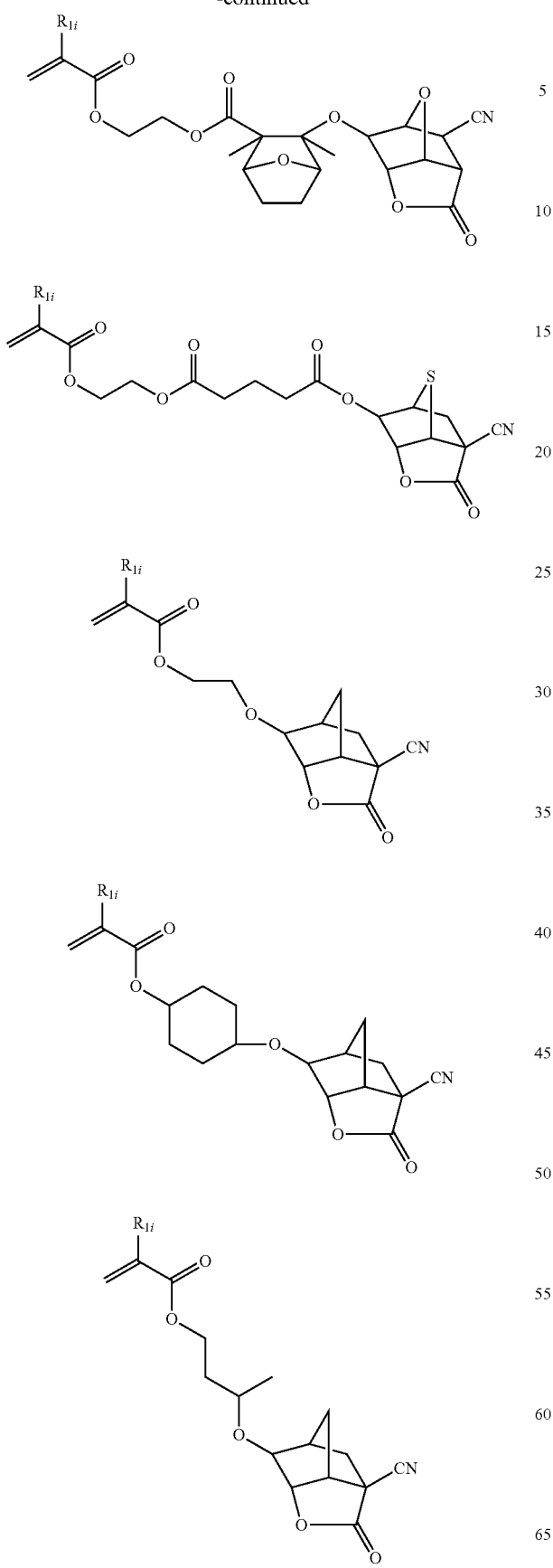
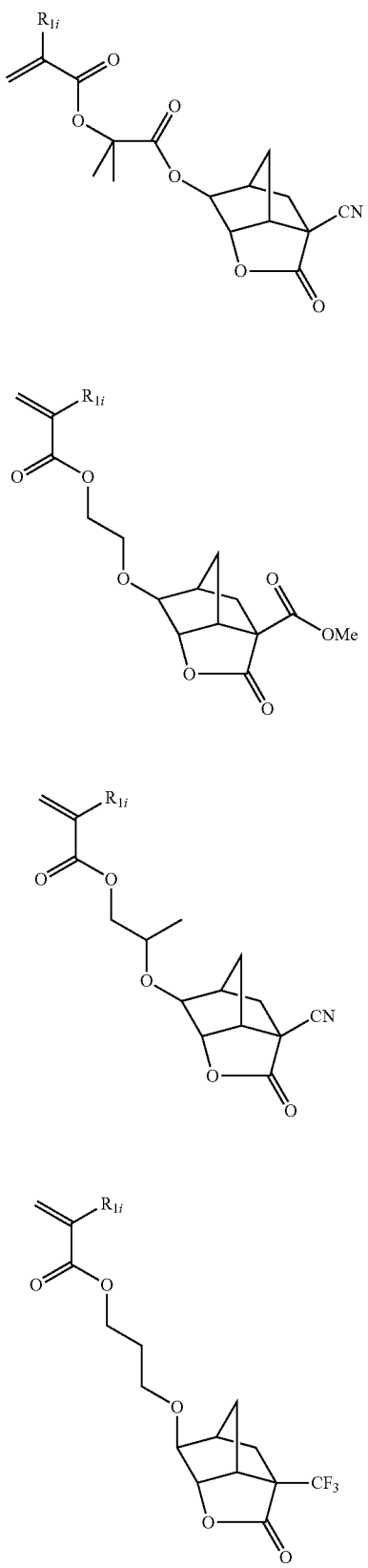

125
-continued
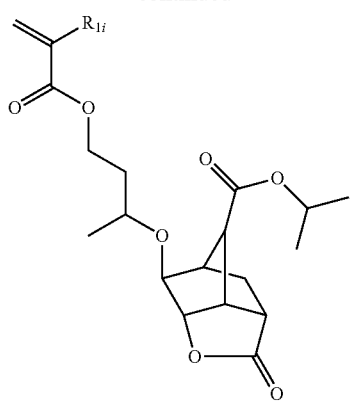
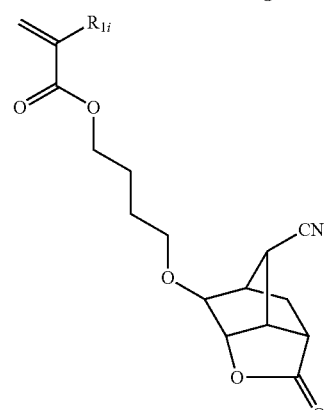
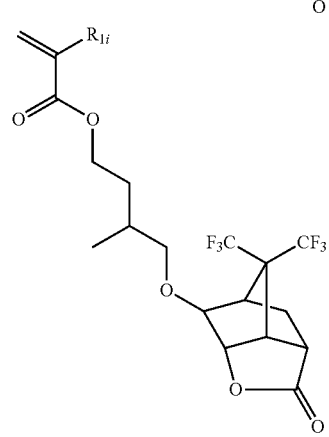
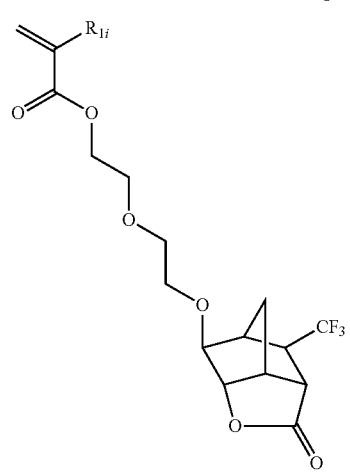
126
-continued
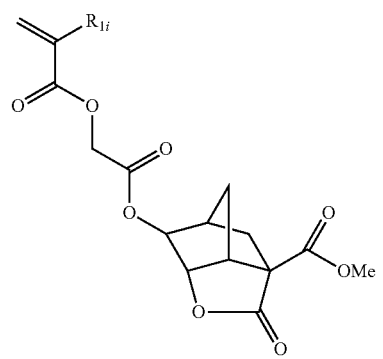
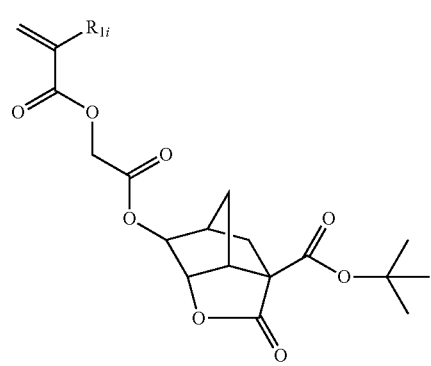
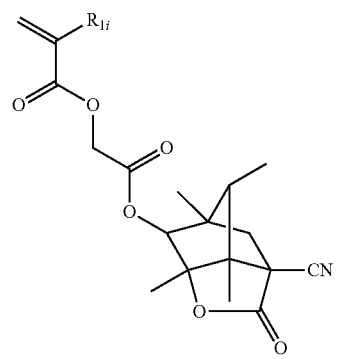
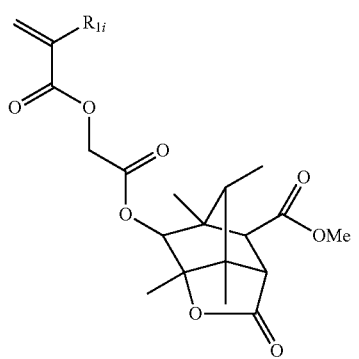

127
-continued
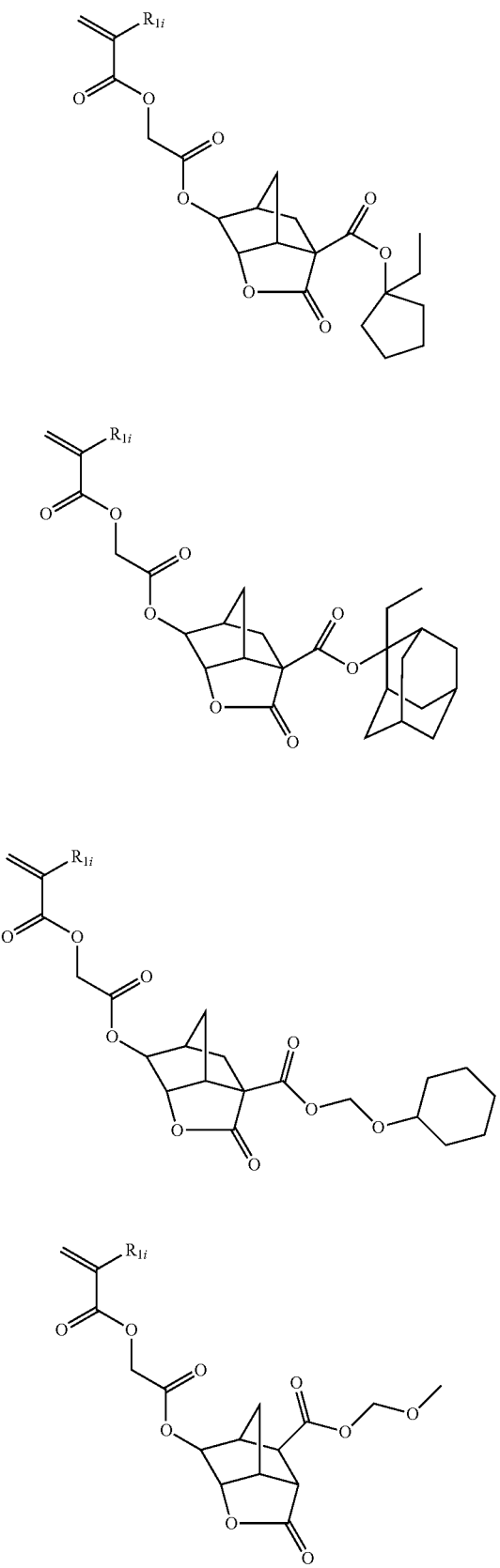
128
-continued
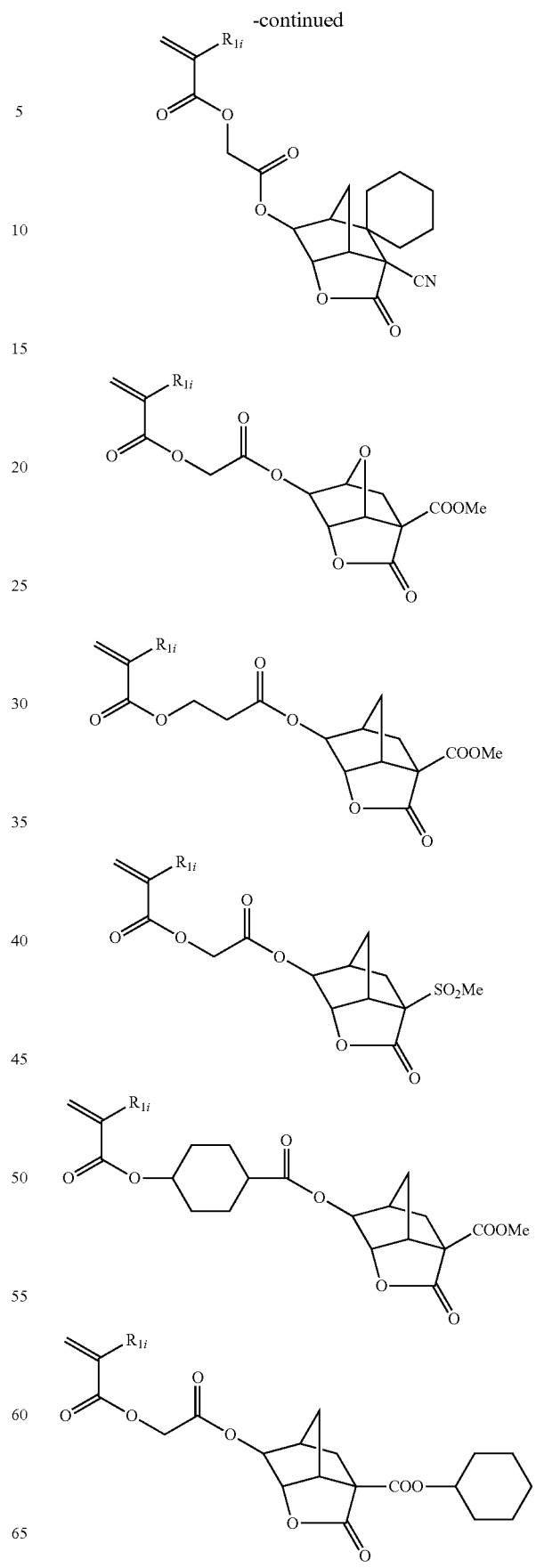

-continued

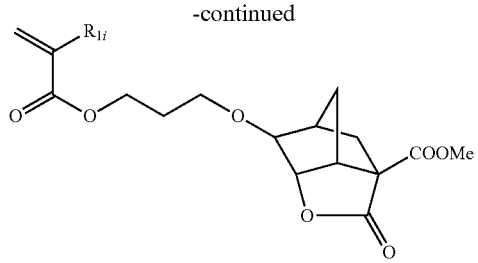

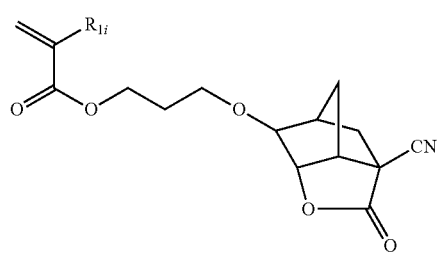

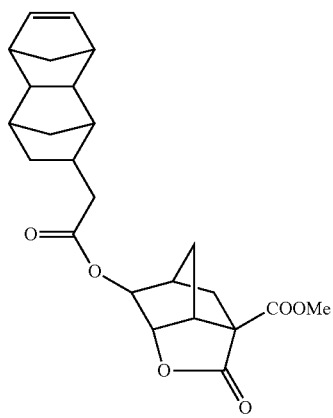

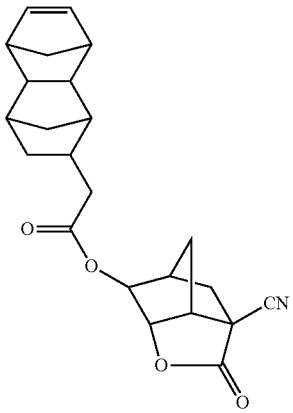

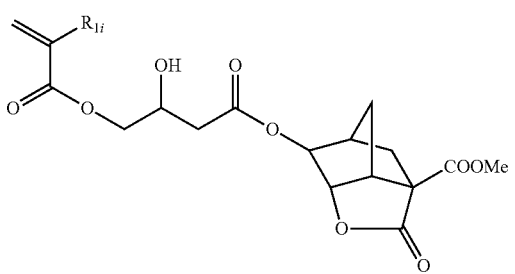

-continued

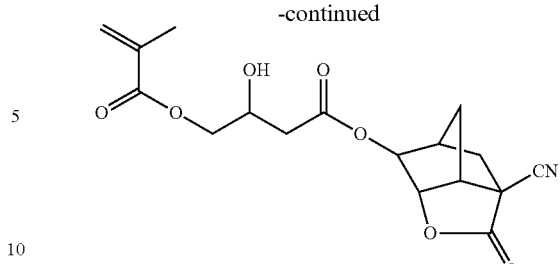

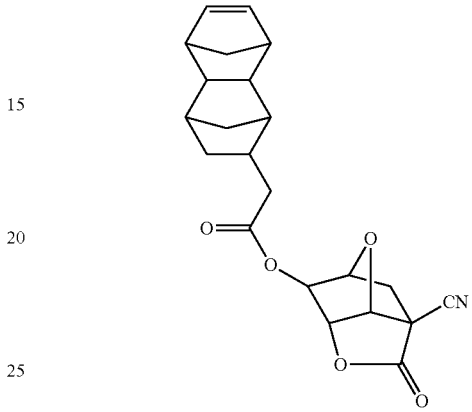

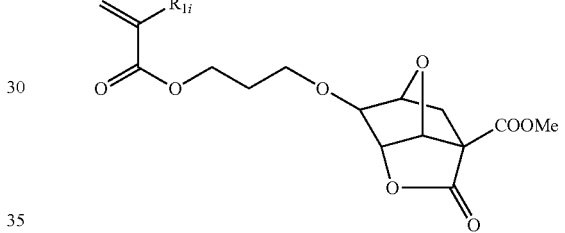

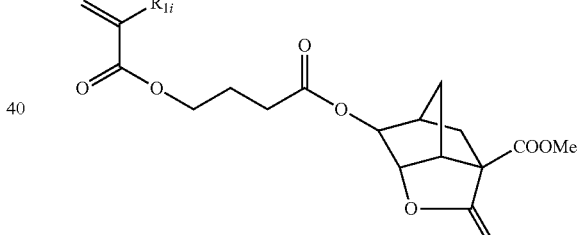

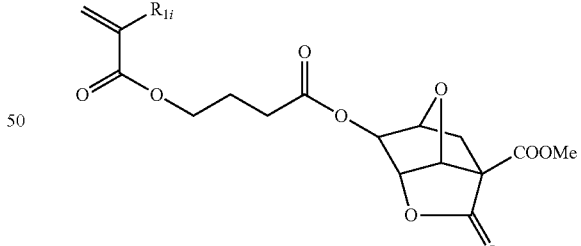

The resin having a repeating unit corresponding to the novel polymerizable compound having a lactone structure represented by formula (M-1) is not particularly limited, and the novel polymerizable compound having a lactone structure represented by formula (M-1) can provide not only the resin as the component (A) but also a resin having a repeating unit derived from the novel polymerizable compound having a lactone structure represented by formula (M-1), which is useful as a resin for photoresists.

This resin may be an acid-decomposable resin or a non-acid-decomposable resin.

Examples of the alkali-soluble group, acid-decomposable group and repeating unit having an acid-decomposable group in the acid-decomposable resin having a repeating unit derived from the novel polymerizable compound having a lactone structure represented by formula (M-1) are the same as those in the resin as the component (A).

The acid-decomposable resin may contain a repeating unit having at least one kind of a group selected from a lactone group except for the lactone structure in formula (M-1), a hydroxyl group, a cyano group and an alkali-soluble group.

Examples of the repeating unit having a lactone group except for the lactone structure in formula (M-1) are the same as those of the repeating unit having a lactone structure-containing group different from the group having a lactone structure represented by formula (1) in the resin as the component (A).

Similarly, examples of the repeating unit having a hydroxyl group or a cyano group and the repeating unit having an alkali-soluble group are also the same as those in the resin as the component (A).

The repeating unit having at least one kind of a group selected from a lactone group, a hydroxyl group, a cyano group and an alkali-soluble group is more preferably a repeating unit having at least two groups selected from a lactone group, a hydroxyl group, a cyano group and an alkali-soluble group, still more preferably a repeating unit having a cyano group and a lactone group, yet still more preferably a repeating unit having a structure where a cyano group is substituted to the lactone structure of (LCI-4) above.

The acid-decomposable resin may further contain a repeating unit having an alicyclic hydrocarbon structure and not exhibiting acid decomposability in the resin as the component (A).

The acid-decomposable resin may contain, in addition to the above-described repeating units, various repeating structural units similarly to the resin as the component (A) for the purpose of controlling dry etching resistance, suitability for standard developer, adherence to substrate, resist profile and properties generally required of the resist, such as resolution, heat resistance and sensitivity.

In the acid-decomposable resin, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case of using the acid-decomposable resin for ArF exposure, the resin preferably has no aromatic group in view of transparency to ArF light.

The acid-decomposable resin is preferably a resin where all repeating units are composed of a (meth)acrylate-based repeating unit. In this case, any of a resin where the repeating units all are a methacrylate-based repeating unit, a resin where all are an acrylate-based repeating unit, and a resin where all are composed of a methacrylate-based repeating unit and an acrylate-based repeating unit, may be used. The content of the (meth)acrylate-based repeating unit having an acid-decomposable group, represented by formula (A), is preferably from 10 to 70 mol %, more preferably from 20 to 50 mol %, based on all repeating units. The content of the (meth)acrylate-based repeating unit having a lactone structure is, as a total of the repeating unit by a polymerizable compound represented by formula (M-1) and others, preferably from 10 to 70 mol %, more preferably from 20 to 60 mol %, still more preferably from 20 to 50 mol %, based on all repeating units. The content of the (meth)acrylate-based repeating unit having an alicyclic hydrocarbon structure substituted by a hydroxyl group or a cyano group is preferably from 0 to 30 mol %, more preferably from 0 to 20 mol %, based on all repeating units. Furthermore, the content of other (meth)acylate-based repeating units is preferably from 0 to 20 mol % based on all repeating units.

Out of all lactone structure-containing repeating units, the molar ratio of the repeating unit by the polymerizable compound represented by formula (M-1) is preferably 10 to 100%, more preferably from 20 to 100%, based on all lactone units.

In the case where the acid-decomposable resin is irradiated with KrF excimer laser light, electron beam, X-ray or high-energy beam at a wavelength of 50 nm or less (e.g., EUV), the acid-decomposable resin preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth)acrylate, in addition to the repeating unit represented by formula (A).

Preferred examples of the repeating unit having an acid-decomposable group include a repeating unit composed of a tert-butoxycarbonyloxystyrene, a 1-alkoxyethoxystyrene or a tertiary alkyl(meth)acrylate. A repeating unit by 2-alkyl-2-adamantyl(meth)acrylate or a dialkyl(1-adamantyl)methyl (meth)acrylate is more preferred.

The acid-decomposable resin can be synthesized by an ordinary method similarly to the resin as the component (A). With respect to the weight average molecular weight and dispersity of the acid-decomposable resin, a resin having a weight average molecular weight and a dispersity in the same ranges as those for the resin as the component (A) is used.

The acid-decomposable resin is, similarly to the resin as the component (A), dissolved together with a compound capable of generating an acid upon irradiation with an actinic ray or radiation, a basic compound, a surfactant and the like in a solvent, and the resulting solution is filtered, whereby a positive resist solution can be prepared.

EXAMPLES

The present invention is described in greater detail below by referring to Examples, but the present invention should not be construed as being limited thereto.

Synthesis Example 1

Synthesis of Compound (M-3)

Compound (M-1) show below was synthesized by the method described in International Publication No. 07/037213, pamphlet.

In a 3-L three-necked flask, Compound (M-1) (120 g, 0.67 mol) and pyridine (64 g, 0.8 mol) were dissolved in 750 ml of THF, and under cooling on an ice bath, chloroacetyl chloride (113 g, 1 mol) was added dropwise while keeping the inner temperature at 15° C. or less. After the completion of dropwise addition, the solution was stirred for 30 minutes still under cooling on an ice bath, then removed from the ice bath and further stirred at room temperature for 4 hours. The three-necked flack was again cooled on an ice bath. Thereafter, 1.5 L of water was added dropwise while maintaining the inner temperature at 15° C. or less and ethyl acetate was further added. The purified crude crystal was collected by filtration. Also, after extraction from the filtrate, the organic layer was concentrated to obtain a crude crystal. These crude crystals were combined, again dissolved in ethyl acetate, washed twice with saturated sodium bicarbonate water and then concentrated to obtain Compound (M-2) shown below (165 g).

$^1$H NMR Spectrum (CDCl$_3$) σ (PPM):
4.71 (1H, d), 4.69 (1H, br s), 4.07 (2H, s), 3.64-3.62 (1H, m), 2.78 (1H, br), 2.43 (1H, dd), 2.27 (1H, dd), 2.21 (1H, ddd), 2.00 (1H, dd).

In a 3-L three-necked flask, Compound (M-2) (165 g, 0.65 mol) was dissolved in 750 ml of NMP, and methacrylic acid (63.7 g, 0.74 mol) and potassium carbonate (138 g, 1 mol) were then added at room temperature. After cooling on an ice bath, potassium iodide (47 g, 0.28 mol) was added and the mixture was stirred for 1 hour and further stirred at room temperature for 5 hours. While again cooling the reaction vessel on an ice bath, the pH of the reaction solution was adjusted to about 2 by adding hydrochloric acid, and extraction was performed using ethyl acetate. The organic layer was washed using sodium bicarbonate water and saturated brine, decolored with activated carbon and concentrated. The obtained crude product was left to stand still at room temperature for 12 hours, as a result, a crude crystal was precipitated. The obtained crude crystal was stirred in methanol and then purified by filtration to obtain Compound (M-3) shown below (122 g).

$^1$H NMR Spectrum (CDCl$_3$) σ (PPM):
6.23 (1H, q), 5.70 (1H, q), 4.69-4.66 (4H, m), 3.62-3.59 (1H, m), 2.76 (1H, m), 2.40 (1H, dd), 2.25 (1H, dd), 2.16 (1H, ddd), 1.98 (3H, dd), 1.96 (1H, m).

120 ml of THF, and under cooling on an ice bath, a THF (30 ml) solution of 4-chlorobutyl chloride (29.5 g, 0.21 mol) was added dropwise. The resulting solution was stirred for 30 minutes and then stirred at room temperature for 4 hours and after adding water, extraction was performed using ethyl acetate. The organic layer was dried over magnesium sulfate, concentrated and after adding hexane, left to stand still, as a result, a crystal was precipitated. The obtained crystal was filtered and then washed using water and hexane to obtain Compound (M-11) (23 g).

$^1$H NMR Spectrum:
4.66 (dd, 1H), 4.62 (s, 1H), 3.26-3.59 (m, 3H), 2.72 (br, 1H), 2.54 (t, 2H), 2.40 (dd, 1H), 2.28-2.20 (m, 2H), 2.10 (tt, 2H), 1.97 (dd, 1H).

In a 500-ml three-necked flask, Compound (M-11) (23 g, 0.081 mol) was dissolved in 250 g of NMP, and potassium carbonate (16.8 g, 0.122 mol) and methacrylic acid (21 g, 0.25 mol) were added thereto. Furthermore, potassium iodide (10.8 g, 0.065 mol) was added and the mixture was stirred at 50° C. for 8 hours. Thereafter, water was added at room temperature, and extraction was performed using ethyl acetate. The organic layer was washed using sodium bicarbonate water and saturated brine, decolored with activated carbon and concentrated. The obtained crude product was purified by silica gel column chromatography to obtain Compound (M-12) (11.8 g).

$^1$H NMR Spectrum:
6.1 (s, 1H), 5.9 (t, 1H), 4.66 (dd, 1H), 4.61 (br, 1H), 4.20 (t, 2H), 3.61 (dd, 1H), 2.71 (br, 1H), 2.44 (t, 2H), 2.39 (dd, 1H), 2.28-2.13 (m, 3H), 2.1-1.90 (m, 5H).

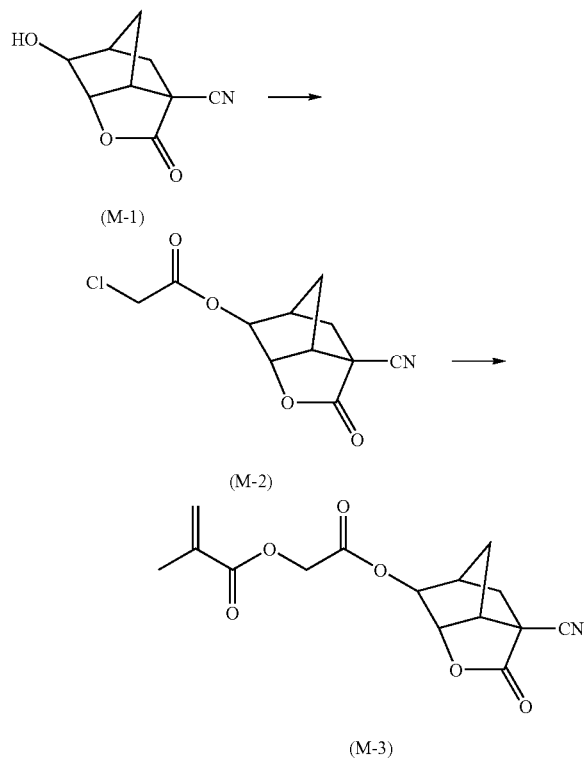

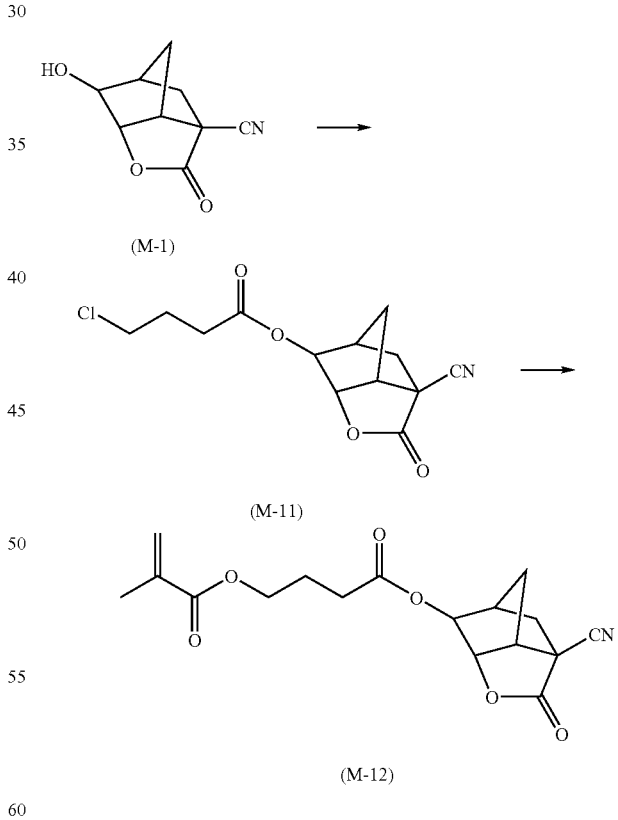

Synthesis Example 2

Synthesis of Compound (M-12)

In a 500-ml three-necked flask, Compound (M-1) (25 g, 0.14 mol) and pyridine (13.3 g, 0.17 mol) were dissolved in Synthesis Example 3

Synthesis of Polymer (P-1)

Under a nitrogen stream, 69 g of cyclohexanone was charged into a three-necked flask, and the flask was heated at 80° C. Thereto, a solution prepared by dissolving Compound (M-3) (15.3 g), Compound (M-4) (3.15 g), Compound (M-5) (16.4 g) and polymerization initiator AIBN (produced by Wako Pure Chemical Industries, Ltd., 1.52 g, 7.4 mol % based on monomers) in 128 g of cyclohexanone was added dropwise over 6 hours. After the completion of dropwise addition, the mixture was further reacted at 80° C. for 2 hours. The reaction solution was allowed to cool and then added dropwise to a mixed solution of 900 ml-methanol/100 ml-water over 20 minutes, and the precipitated powder was collected by filtration and dried to obtain Polymer (P-1) (26 g). The weight average molecular weight of the obtained polymer was 7,800 in terms of standard polystyrene and the dispersity (Mw/Mn) was 1.45.

80° C. Thereto, a solution prepared by dissolving Compound (M-3) (7.63 g), Compound (M-6) (6.18 g), Compound (M-4) (3.15 g), Compound (M-7) (13.13 g) and polymerization initiator AIBN (produced by Wako Pure Chemical Industries, Ltd., 1.43 g, 7 mol % based on monomers) in 110 g of cyclohexanone was added dropwise over 6 hours. After the completion of dropwise addition, the mixture was further reacted at 80° C. for 2 hours. The reaction solution was allowed to cool and then added dropwise to a mixed solution of 900 ml-methanol/100 ml-water over 20 minutes, and the precipitated powder was collected by filtration and dried to obtain 24 g of Polymer (P-2). The weight average molecular weight of Polymer (P-2) obtained was 7,300 in terms of standard polystyrene and the dispersity (Mw/Mn) was 1.46.

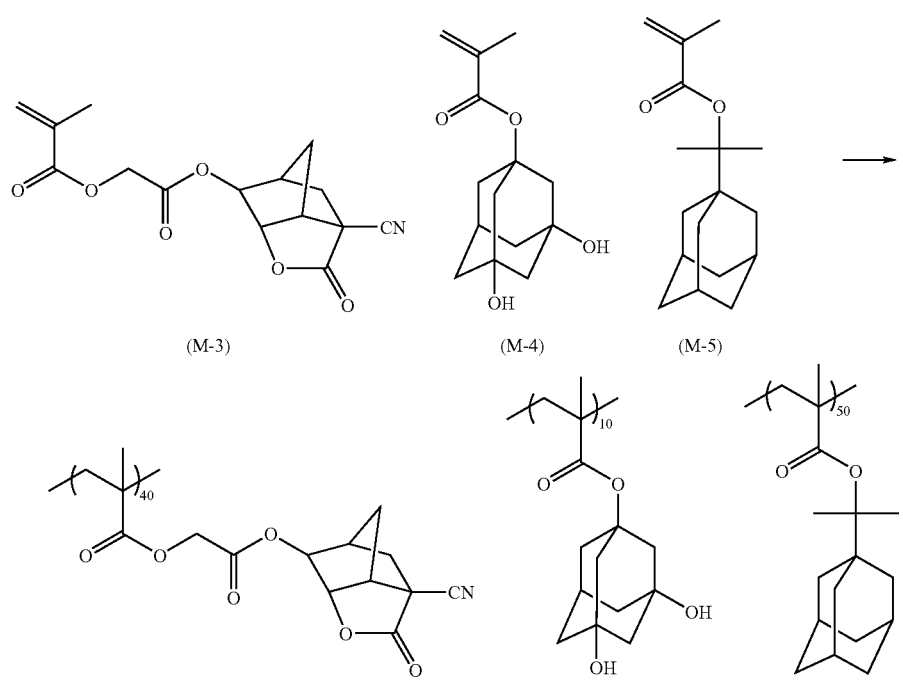

Polymer (P-1)

Synthesis Example 4

Synthesis of Polymer (P-2)

Under a nitrogen stream, 60 g of cyclohexanone was charged into a three-necked flask, and the flask was heated at

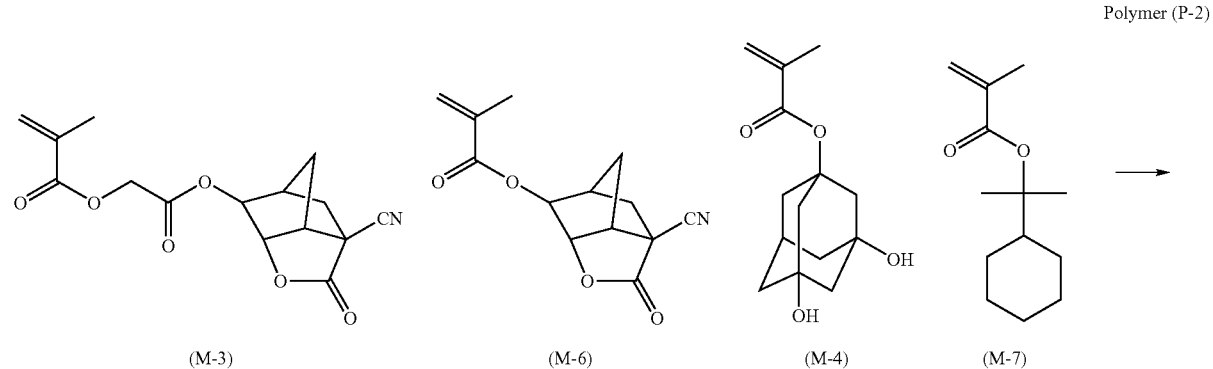

Polymer (P-2)

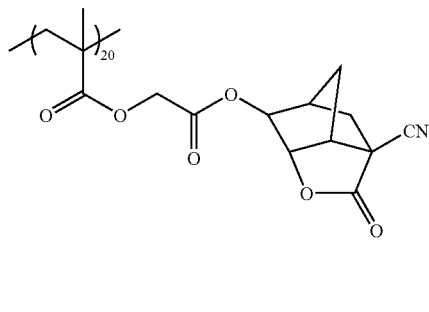
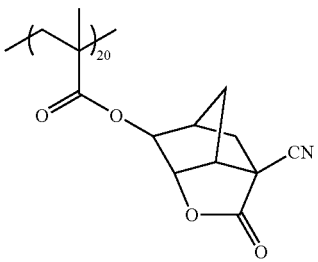
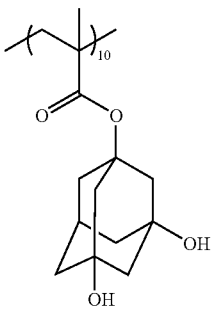

Synthesis Example 5

Synthesis of Polymer (P-3)

Under a nitrogen stream, 147 g of cyclohexanone was charged into a three-necked flask, and the flask was heated at 65° C. Thereto, a solution prepared by dissolving Compound (M-3) (7.63 g), Compound (M-8) (9.21 g), Compound (M-9) (3.15 g), Compound (M-10) (2.15 g) and polymerization initiator V-65 (produced by Wako Pure Chemical Industries, Ltd., 0.46 g, 1.5 mol % based on monomers) in 273 g of cyclohexanone was added dropwise over 6 hours. After the completion of dropwise addition, the mixture was further reacted at 80° C. for 2 hours. The reaction solution was allowed to cool and then added dropwise to a mixed solution of 900 ml-methanol/100 ml-water over 20 minutes, and the precipitated powder was collected by filtration and dried to obtain 18 g of Polymer (P-3). The weight average molecular weight of Polymer (P-3) obtained was 10,900 in terms of standard polystyrene and the dispersity (Mw/Mn) was 2.55.

Synthesis Example 6

Synthesis of Polymer (P-4)

Under a nitrogen stream, 66 g of cyclohexanone was charged into a three-necked flask, and the flask was heated at 80° C. Thereto, a solution prepared by dissolving Compound (M-12) (21 g), Compound (M-13) (5.90 g), Compound (M-14) (6.83 g) and polymerization initiator v-601 (produced by Wako Pure Chemical Industries, Ltd., 1.72 g, 6 mol % based on monomers) in 123 g of cyclohexanone was added dropwise over 6 hours. After the completion of dropwise addition, the mixture was further reacted at 80° C. for 2 hours. The reaction solution was allowed to cool and then added dropwise to a mixed solution of 900 ml-methanol/100 ml-water over 20 minutes, and the precipitated powder was collected by filtration and dried to obtain 22 g of Polymer (P-4). The weight average molecular weight of Polymer (P-4) obtained was 8,400 in terms of standard polystyrene and the dispersity (Mw/Mn) was 1.46.

Polymer (P-3)

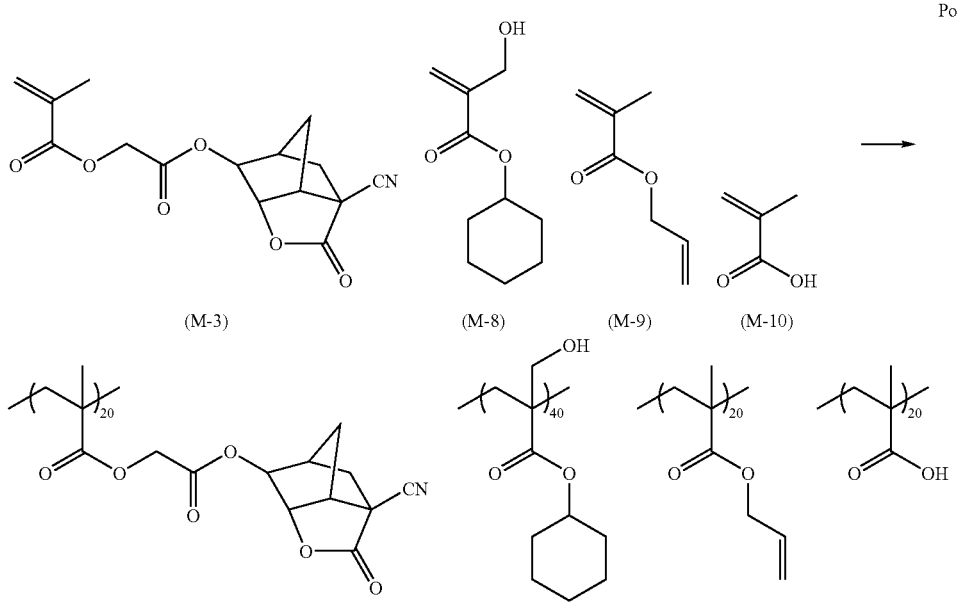

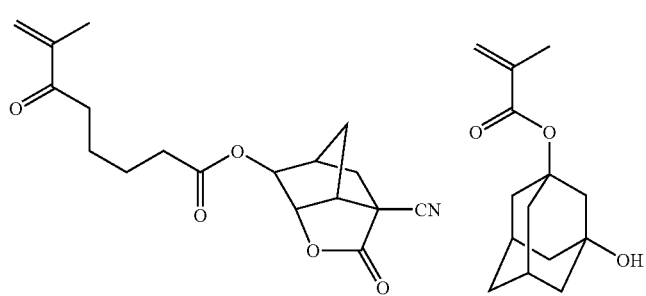

(M-12)　(M-13)　(M-14)

Polymer (P-4)

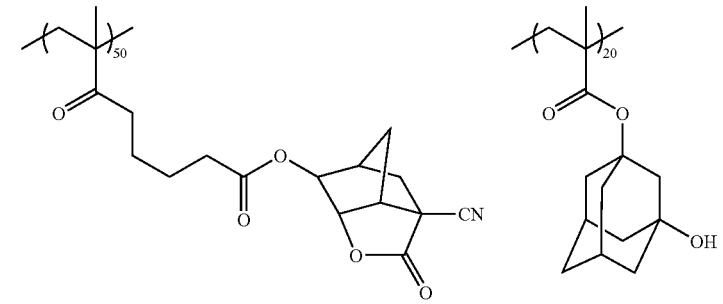

Synthesis Example 7

Synthesis of Compound (M-16)

In a 1-L three-necked flask, Compound (M-1) (40 g, 0.223 mol) was stirred in 200 g of water at 100° C. for 15 hours in the presence of sodium hydroxide (31.3 g, 0.781 mol). The reaction solution was heated and then, under cooling on an ice bath, hydrochloric acid was added until the pH became 1. Subsequently, extraction was performed using 600 ml of ethyl acetate and the organic layer was concentrated, whereby 38 g of Compound (M-13) was obtained as crude crystal.

$^1$H NMR Spectrum (acetone-d6) σ (ppm):
4.47 (1H, d), 3.69 (1H, s), 3.50 (1H, d), 2.42-2.47 (2H, m), 2.13 (1H, dd), 2.06 (1H, ddd), 1.70 (1H, dt), 1.57 (1H, d).

In 500-ml three-necked flask, the crude crystal (12.5 g, 63 mmol) of Compound (M-13), para-toluenesulfonic acid (12 g, 63 mmol) and methanol (40 g, 12.6 mmol) were added to 125 g of toluene, and the mixture was stirred at 60° C. for 3 hours. After the reaction, extraction from the aqueous phase was performed using 250 g of ethyl acetate, and the organic layer was concentrated to obtain a crude crystal. This crude crystal was washed once with sodium bicarbonate water and further once with water to obtain 13.1 g of Compound (M-14).

$^1$H NMR Spectrum (acetone-d6) σ (ppm):
4.45 (1H, d), 4.44 (1H, d), 3.67-3.69 (1H, m), 3.48 (1H, d), 2.84 (1H, s), 2.45 (1H, dd), 2.13 (1H, d), 2.054 (1H, ddd), 1.68-1.70 (1H, m), 1.55 (1H, m).

Compound (M-15) was synthesized from Compound (M-14) in the same manner as in the synthesis of Compound (M-2).

$^1$H NMR Spectrum (CDCl$_3$) σ (PPM):
4.69 (1H, s), 4.64 (1H, dd), 4.06 (2H, s), 3.81 (3H, s), 3.54-3.59 (1H, m), 2.65-2.70 (1H, m), 2.59 (1H, dd), 2.02 (1H, d), 1.95 (1H, dd), 1.71 (1H, dd).

Compound (M-16) was synthesized from Compound (M-15) in the same manner as in the synthesis of Compound (M-3).

$^1$H NMR Spectrum (CDCl$_3$) σ (ppm):
6.22 (1H, s), 5.68 (1H, s), 4.69 (1H, brs), 4.67 (1H, s), 4.61 (1H, dd), 3.81 (1H, d), 3.52-3.56 (1H, m), 2.64-2.68 (1H, m), 2.57 (1H, dd), 1.90-2.00 (5H, m), 1.70 (1H, dd).

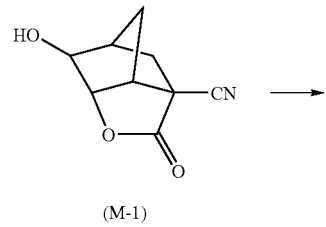

(M-1)

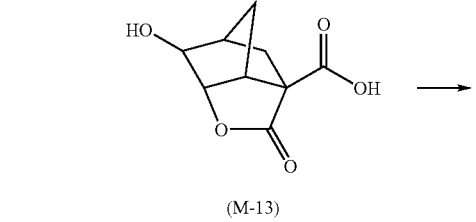

(M-13)

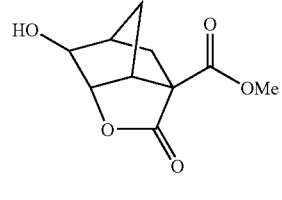

(M-14)

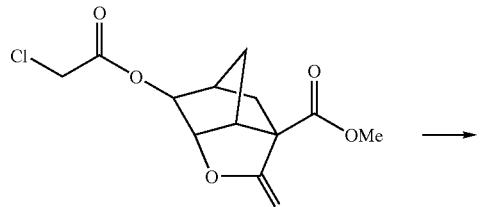

(M-15)

-continued

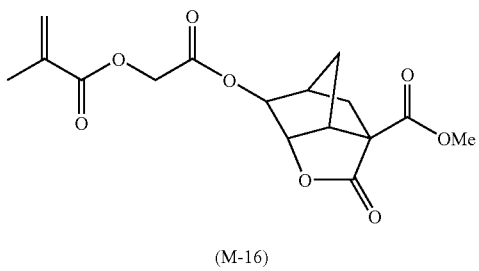

(M-16)

Synthesis Example 8

Synthesis of Polymer (1)

Under a nitrogen stream, 41 g of cyclohexanone was charged into a three-necked flask, and the flask was heated at 80° C. Thereto, a solution prepared by dissolving compounds shown below in amounts of 9.77 g, 2.02 g and 7.29 g in order from the left and polymerization initiator V601 (produced by Wako Pure Chemical Industries, Ltd., 0.972 g, 7.4 mol % based on monomers) in 70 g of cyclohexanone was added dropwise over 6 hours. After the completion of dropwise addition, the mixture was further reacted at 80° C. for 2 hours. The reaction solution was allowed to cool and then added dropwise to a mixed solution of 800 ml-hexane/300 ml-ethyl acetate over 20 minutes, and the precipitated powder was collected by filtration and dried to obtain 13 g of Polymer (1). The weight average molecular weight of Polymer (1) obtained was 8,260 in terms of standard polystyrene and the dispersity (Mw/Mn) was 1.50.

Polymers (2) to (40) and Comparative Polymers (1) and (2) were synthesized in the same manner as in Synthesis Example 8. The compositional ratio (mol %, corresponding to repeating units from the left), weight average molecular weight and dispersity are shown in Table 2 below.

TABLE 2

| Polymer No. | Polymer Structure | Compositional Ratio (mol %) | | | | Mw | Mw/Mn |
|---|---|---|---|---|---|---|---|
| 1  | 1    | 50 | 10 | 40 |    | 8260  | 1.50 |
| 2  | 2    | 50 | 10 | 40 |    | 8150  | 1.50 |
| 3  | 3    | 50 | 10 | 40 |    | 8290  | 1.54 |
| 4  | 4    | 50 | 10 | 40 |    | 7790  | 1.52 |
| 5  | 5    | 50 | 10 | 40 |    | 9460  | 1.57 |
| 6  | 6-1  | 50 | 10 | 20 | 20 | 9800  | 1.58 |
| 7  | 7    | 50 | 10 | 20 | 20 | 9000  | 1.52 |
| 8  | 8    | 50 | 10 | 20 | 20 | 8160  | 1.47 |
| 9  | 9    | 50 | 10 | 20 | 20 | 7300  | 1.46 |
| 10 | 10   | 50 | 10 | 20 | 20 | 10650 | 1.55 |
| 11 | 11-1 | 20 | 20 | 10 | 50 | 8000  | 1.44 |
| 12 | 11-2 | 40 | 10 | 10 | 40 | 10300 | 1.43 |
| 13 | 12   | 20 | 20 | 10 | 25 | 25 | 8000 | 1.46 |
| 14 | 13   | 20 | 20 | 10 | 25 | 25 | 8000 | 1.51 |
| 15 | 14   | 20 | 20 | 10 | 25 | 25 | 9700 | 1.64 |
| 16 | 15   | 20 | 20 | 10 | 25 | 25 | 7660 | 1.46 |
| 17 | 16   | 25 | 25 | 10 | 40 |    | 8300 | 1.52 |
| 18 | 17   | 25 | 25 | 10 | 30 | 10 | 8400 | 1.53 |
| 19 | 18   | 40 | 10 | 50 |    | 11350 | 1.59 |
| 20 | 19   | 50 | 10 | 40 |    | 7980  | 1.52 |
| 21 | 20   | 40 | 15 | 30 | 15 | 8800 | 1.53 |
| 22 | 21   | 40 | 10 | 20 | 30 | 8450 | 1.56 |
| 23 | 22   | 40 | 10 | 30 | 20 | 8750 | 1.55 |
| 24 | 23   | 35 | 15 | 25 | 25 | 8020 | 1.55 |
| 25 | 24   | 50 | 10 | 40 |    | 8350 | 1.56 |
| 26 | 25   | 40 | 10 | 30 | 20 | 8960 | 1.57 |
| 27 | 26   | 50 | 30 | 20 |    | 9300 | 1.55 |
| 28 | 27   | 40 | 20 | 40 |    | 9560 | 1.53 |
| 29 | 28   | 40 | 30 | 30 |    | 9810 | 1.48 |
| 30 | 29   | 40 | 10 | 35 | 15 | 8560 | 1.56 |
| 31 | 30   | 30 | 15 | 30 | 25 | 8870 | 1.65 |
| 32 | 31   | 40 | 10 | 10 | 40 | 7890 | 1.58 |

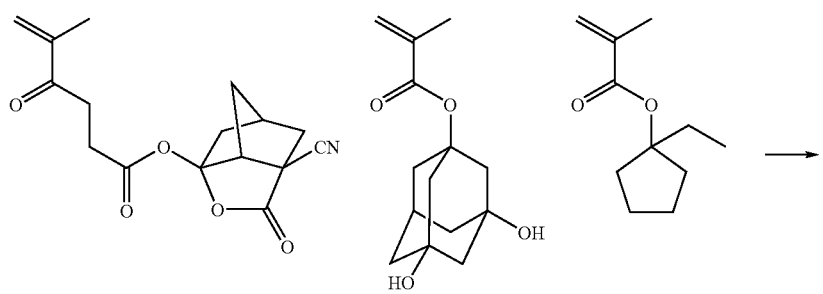

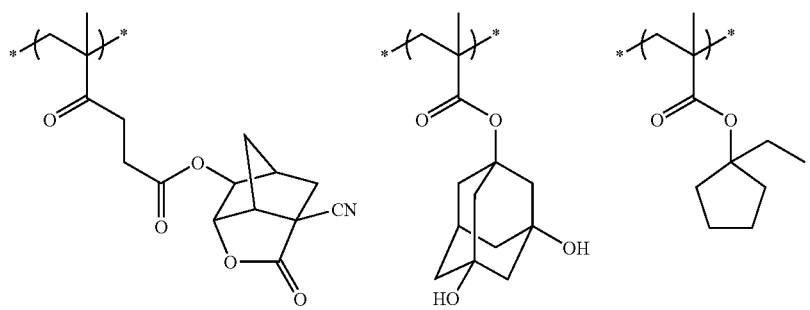

TABLE 2-continued

| Polymer No. | Polymer Structure | Compositional Ratio (mol %) | | | | Mw | Mw/Mn |
|---|---|---|---|---|---|---|---|
| 33 | 32 | 40 | 15 | 30 | 15 | 8840 | 1.55 |
| 34 | 33 | 50 | 50 | | | 7960 | 1.49 |
| 35 | 34 | 40 | 35 | 25 | | 8030 | 1.50 |
| 36 | 6-2 | 40 | 10 | 10 | 40 | 8990 | 1.56 |
| 37 | 6-3 | 40 | 10 | 20 | 30 | 9050 | 1.53 |
| 38 | 35 | 50 | 50 | | | 6700 | 1.55 |
| 39 | 36 | 55 | 45 | | | 7120 | 1.56 |
| 40 | 37 | 35 | 15 | 30 | 20 | 8950 | 1.62 |
| Comparison 1 | Comparison 1 | 50 | 10 | 40 | | 8200 | 1.60 |
| Comparison 2 | Comparison 2 | 50 | 10 | 40 | | 8500 | 1.58 |

Polymer structures shown in Table 2 are illustrated below. Incidentally, in Table 2, polymer structures 6-1 to 6-3 indicate that the polymer is a polymer of Polymer Structure (6) shown below, having the compositional ratio (ratio of respective repeating units), weight average molecular weight and dispersity shown in Table 2. The same applies to polymer structures 11-1 and 11-2.

(1)
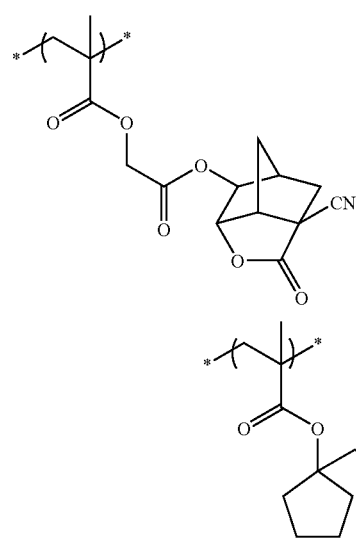
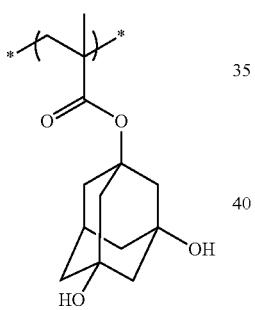

(2)
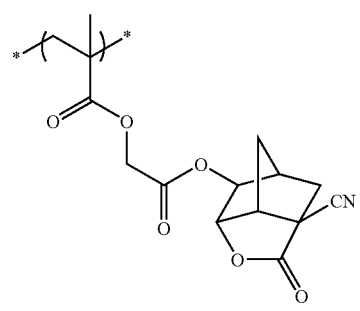
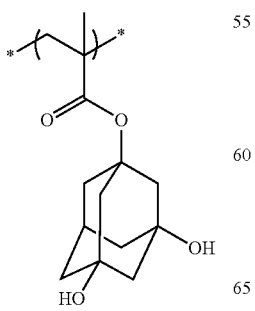
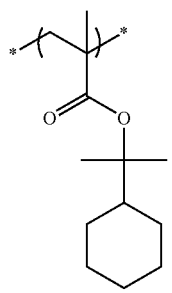

(3)
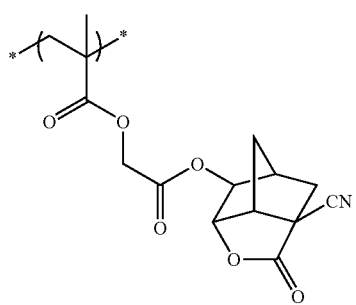
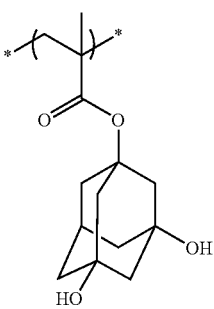
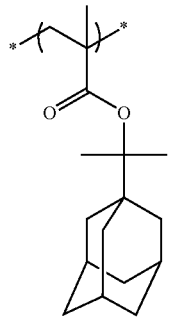

(4)
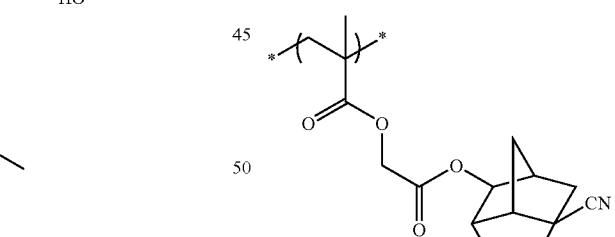
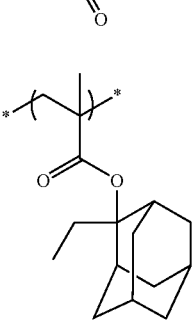

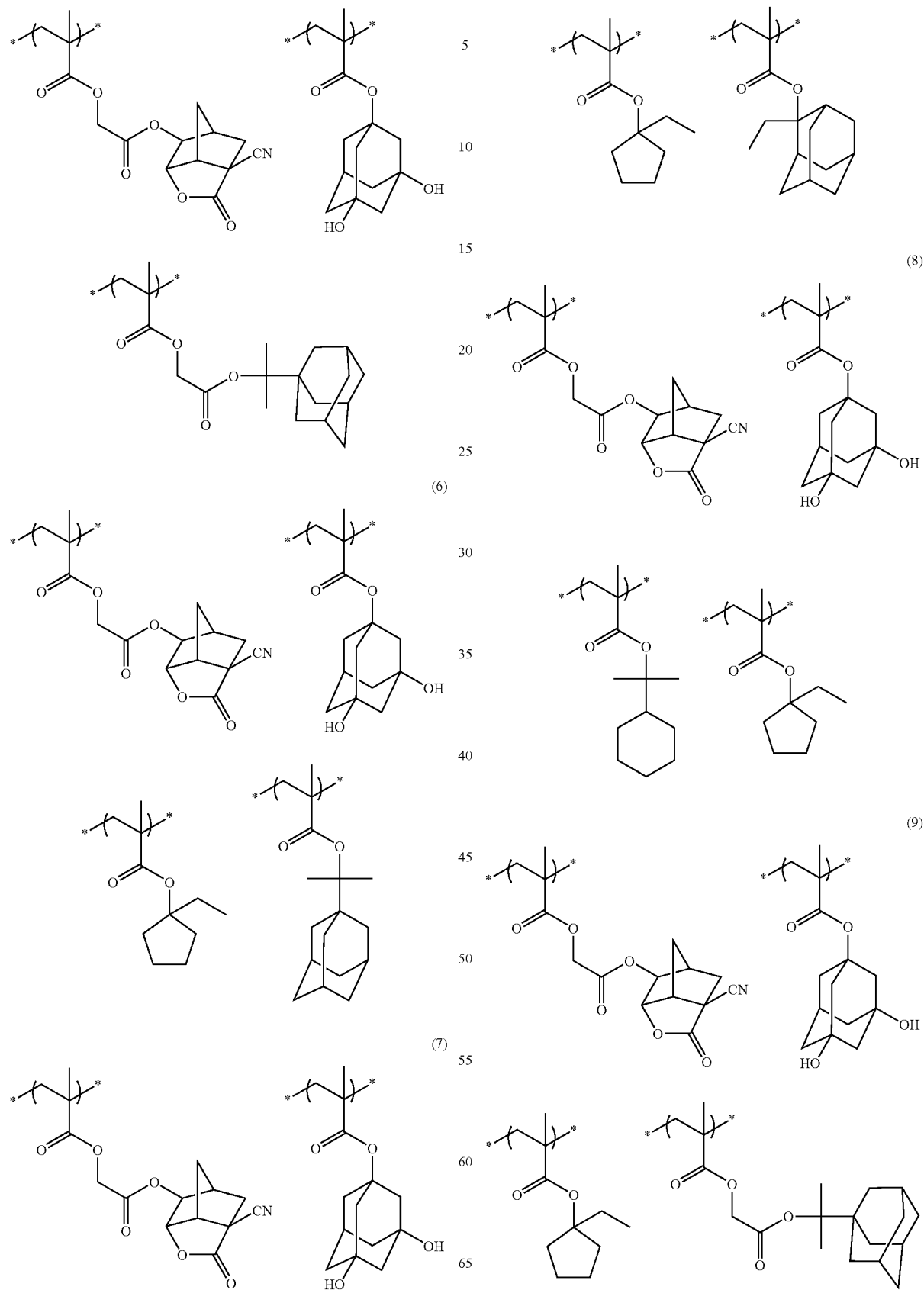

(10)
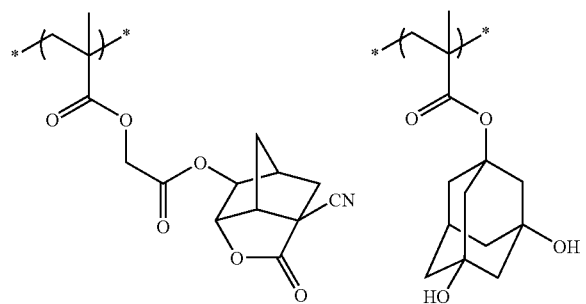
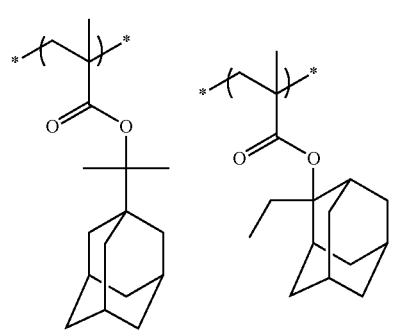
(11)
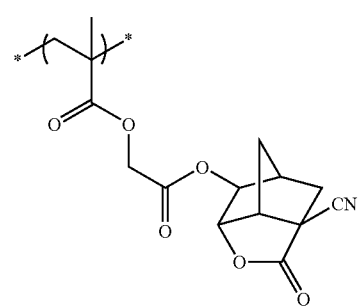
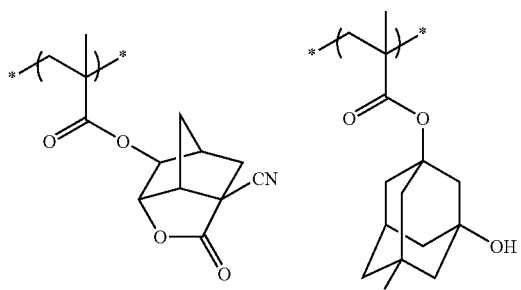
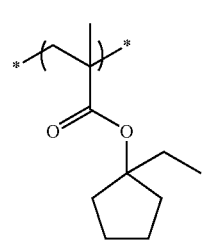
(12)
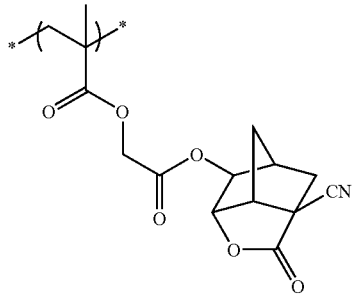
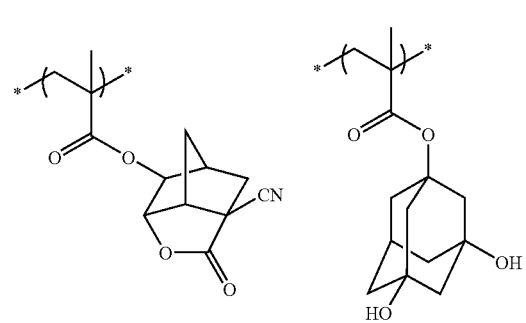
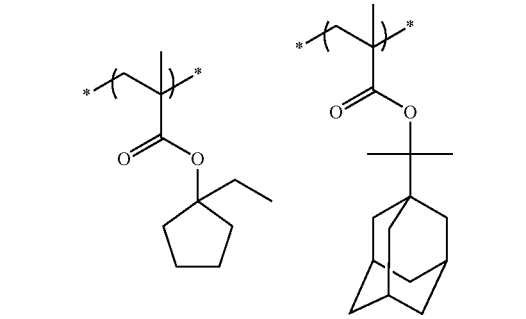
(13)
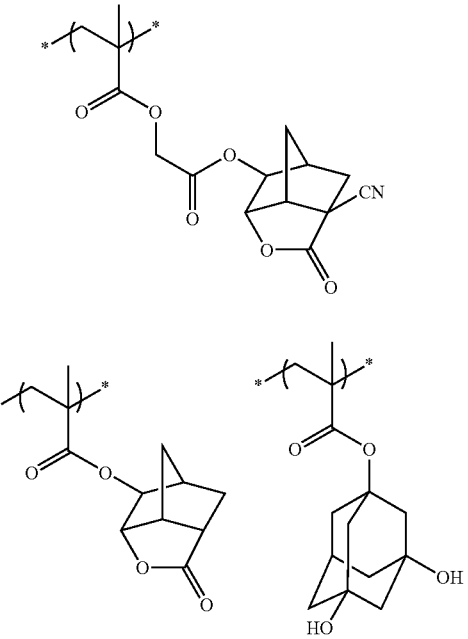

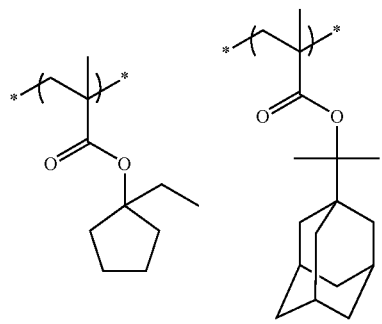
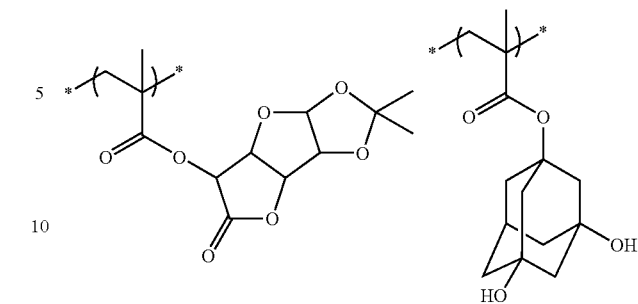
(14)
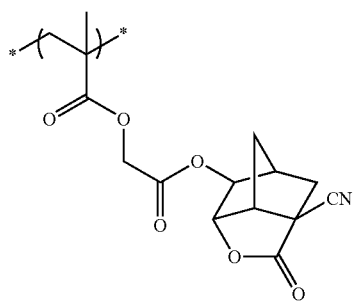
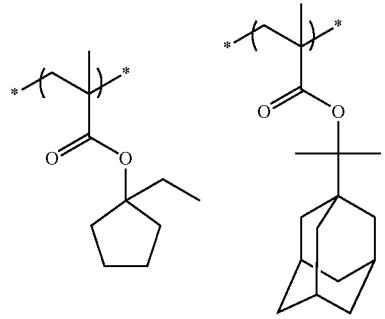
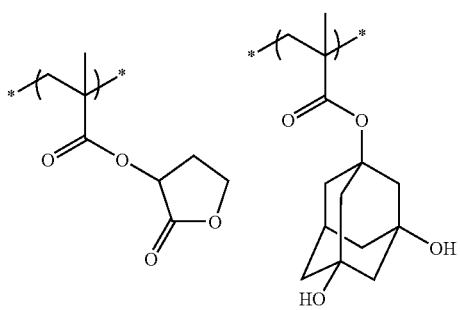
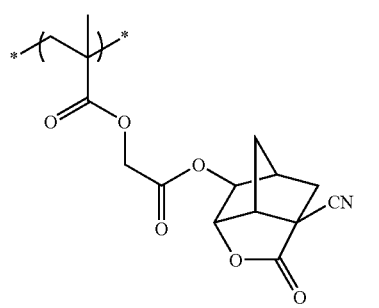
(16)
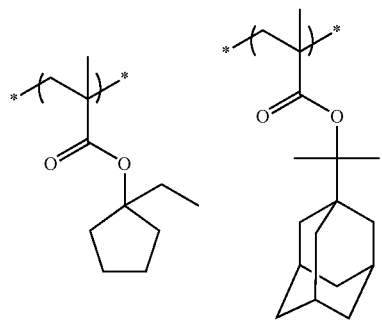
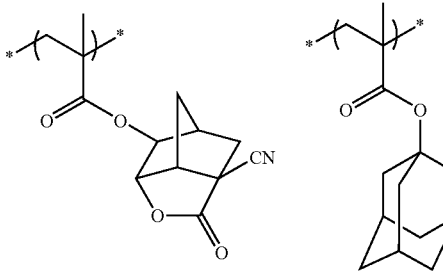
(15)
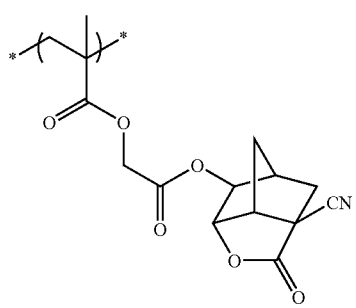
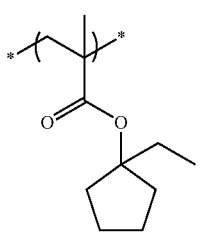

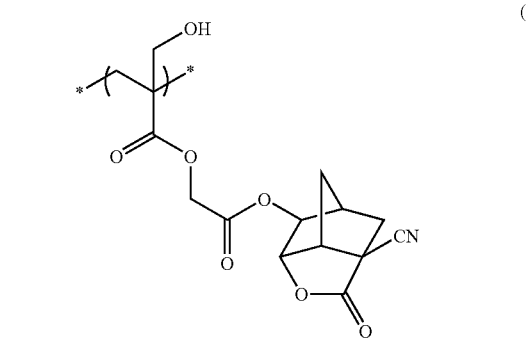
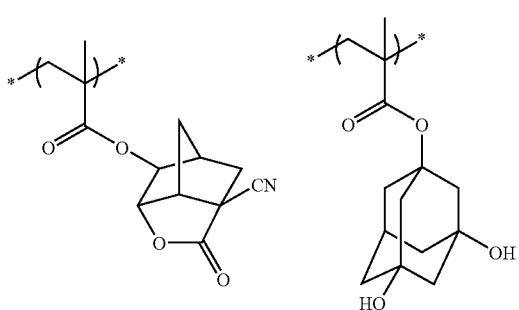
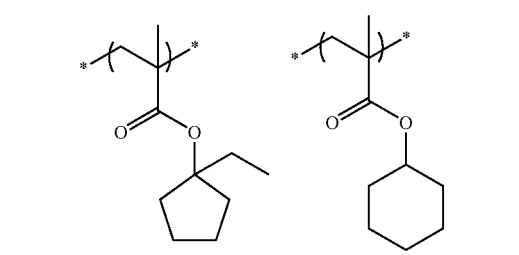
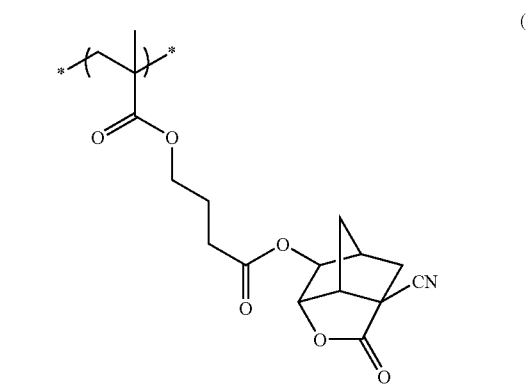
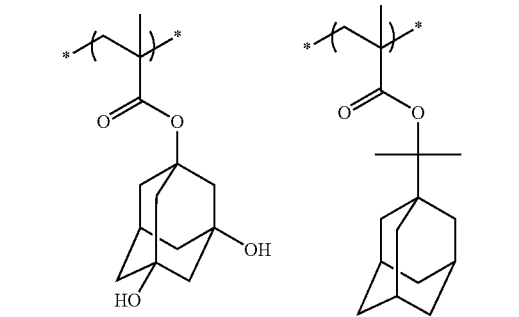
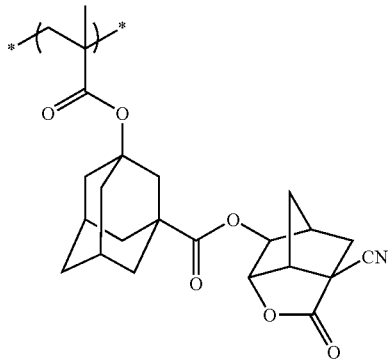
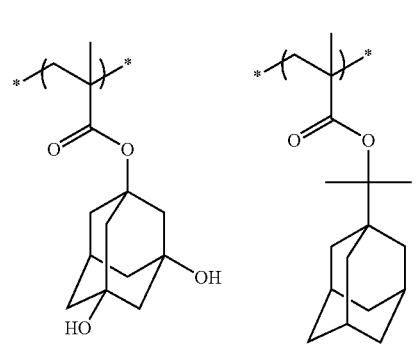
(Comparison 1)
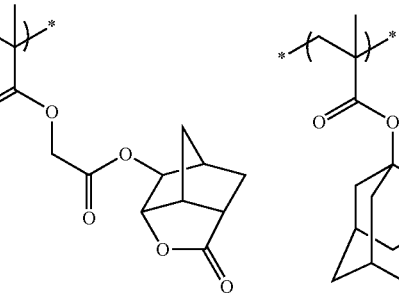
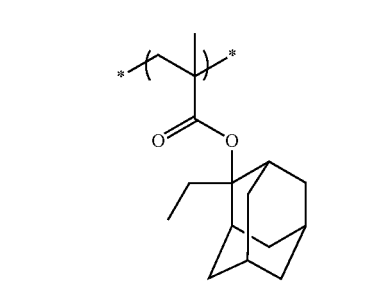
(Comparison 2)
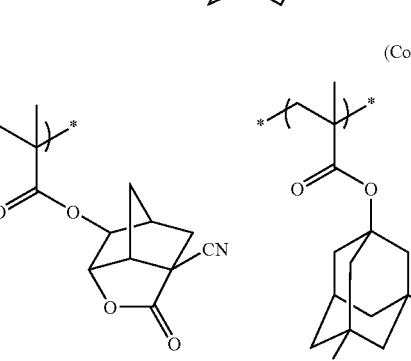

153 -continued
154 -continued
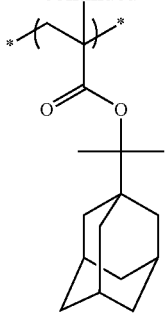
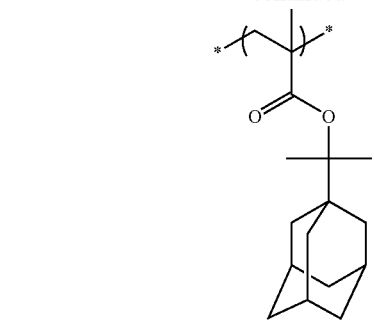
(20)
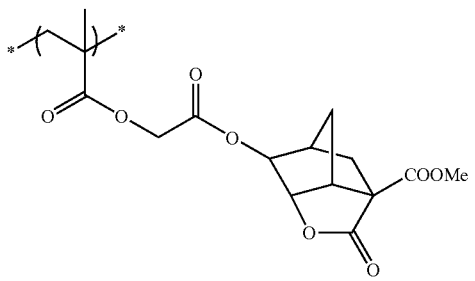
(22)
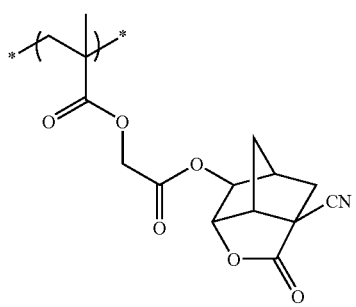 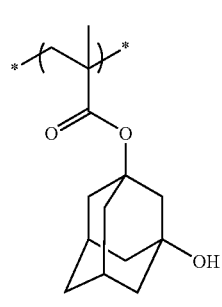
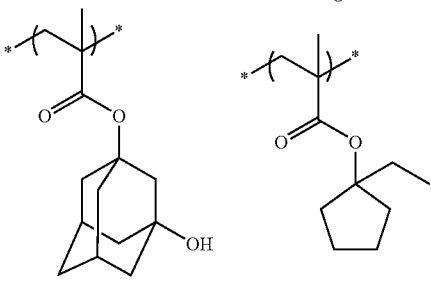
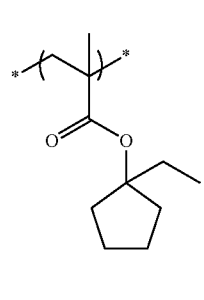 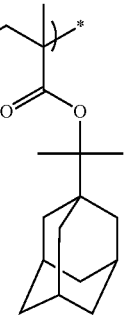
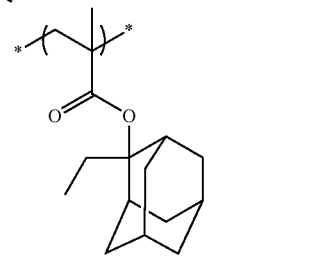
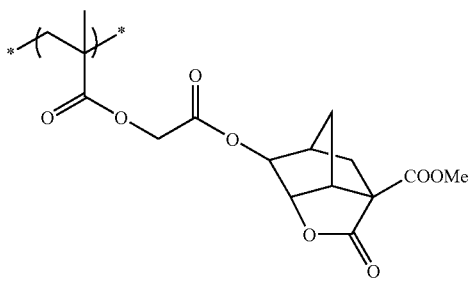
(21)
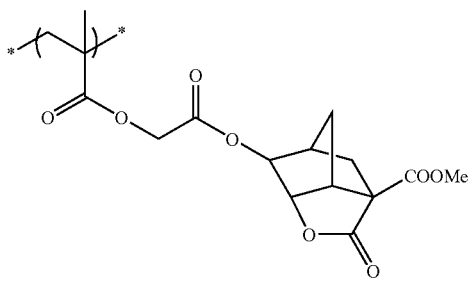
(23)
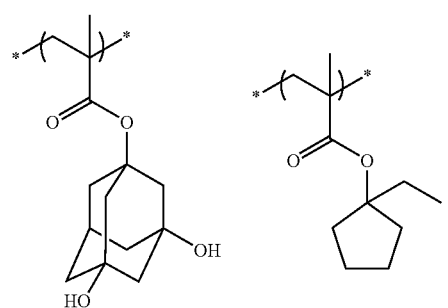
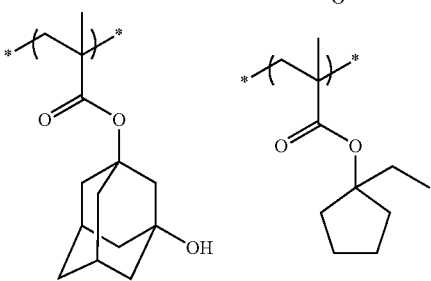

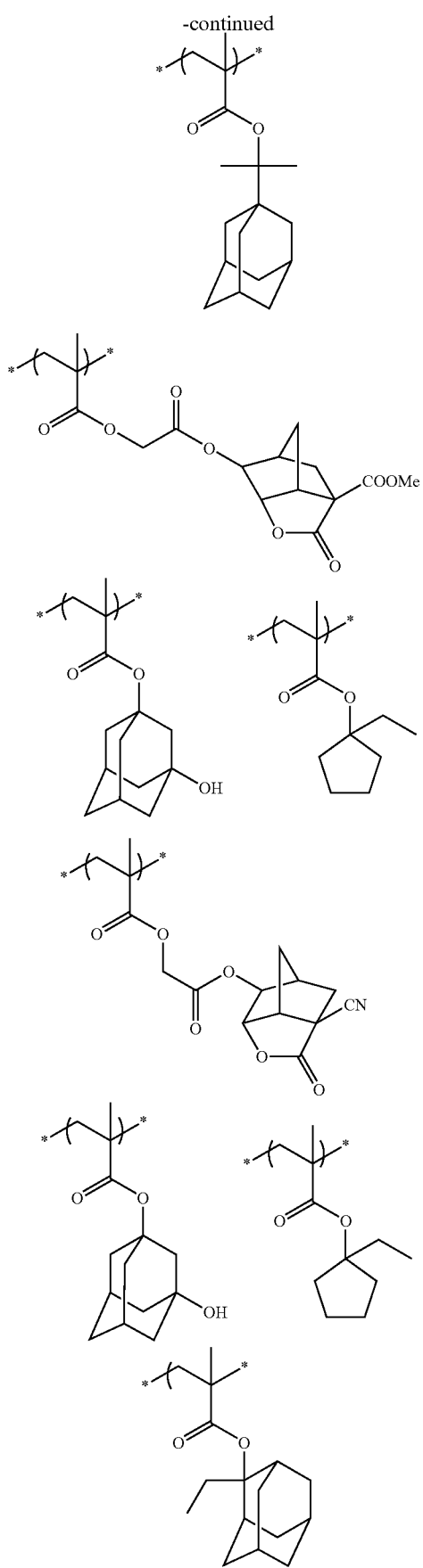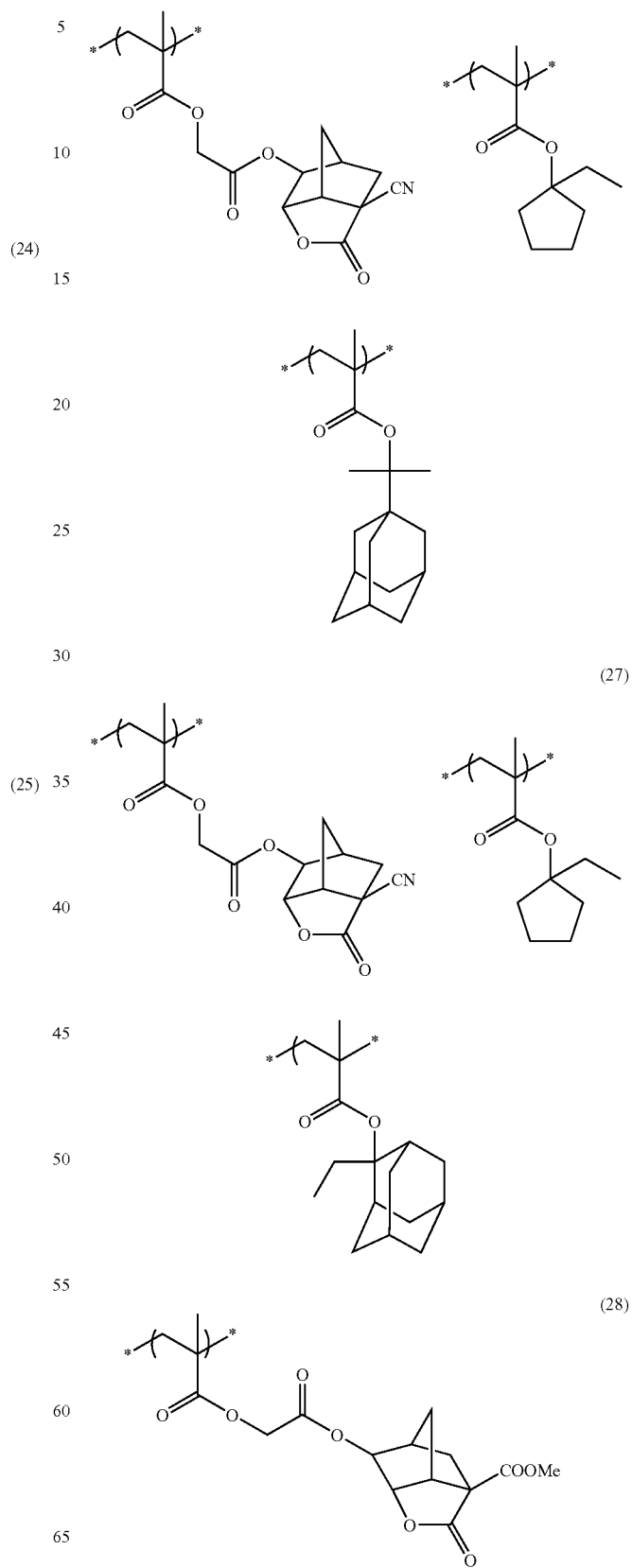

157
-continued
158
-continued
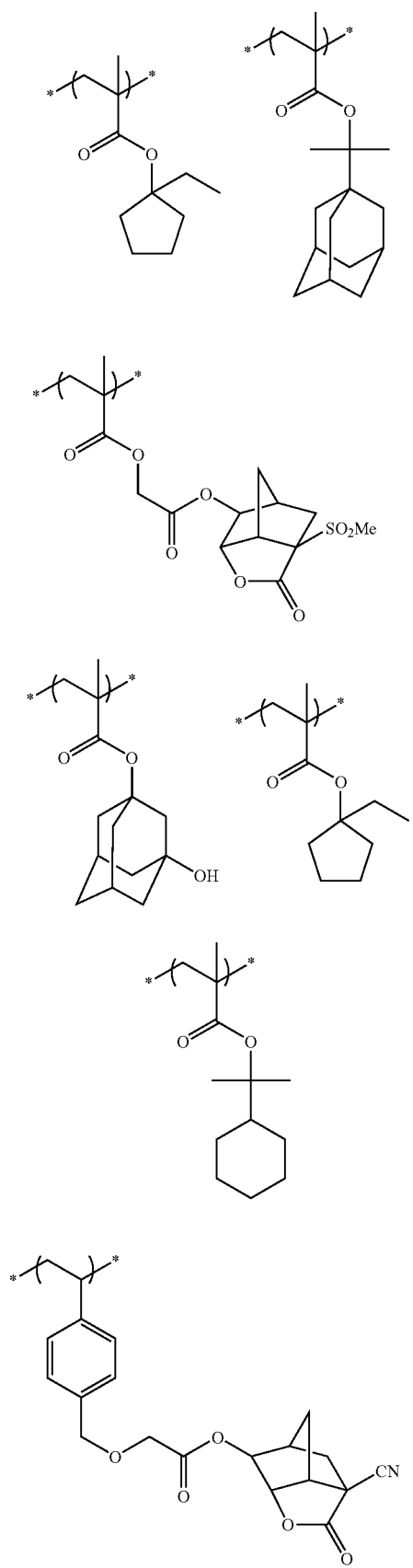
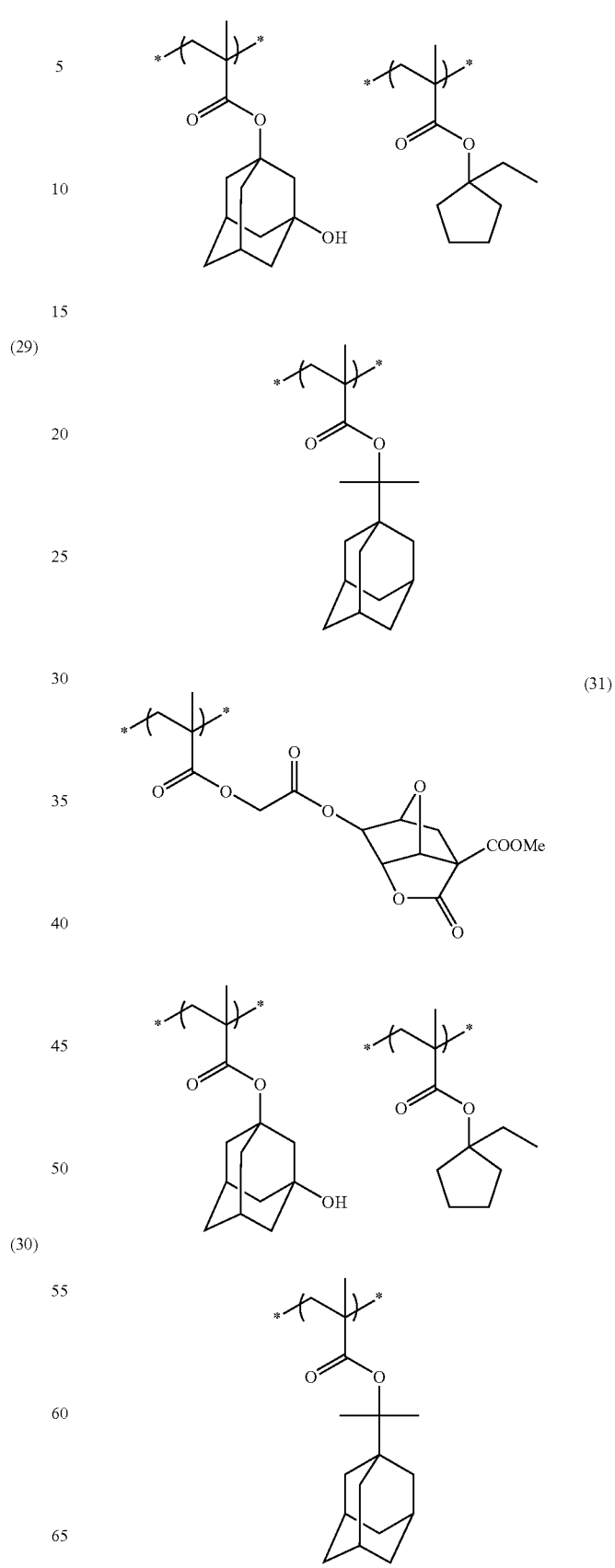

(32)
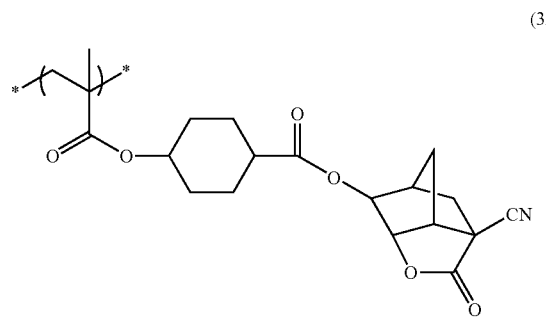
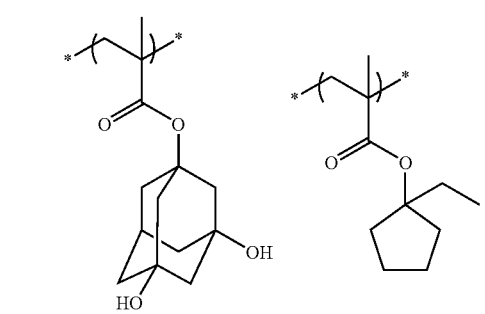
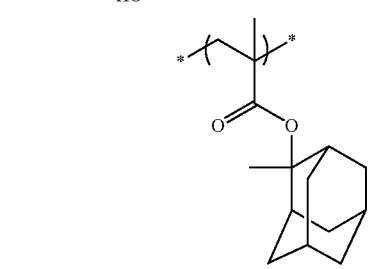
(33)
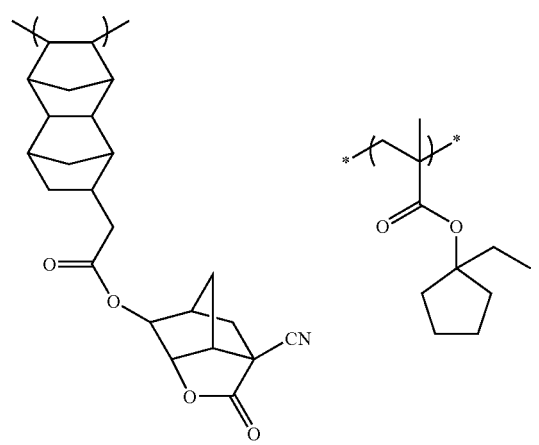
(34)
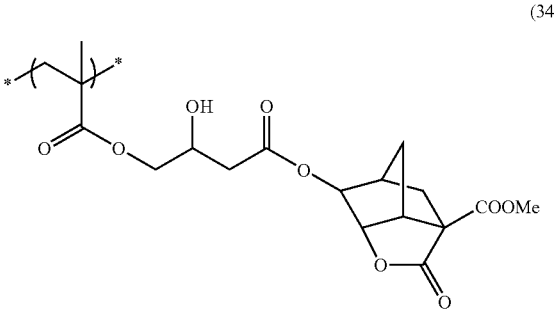
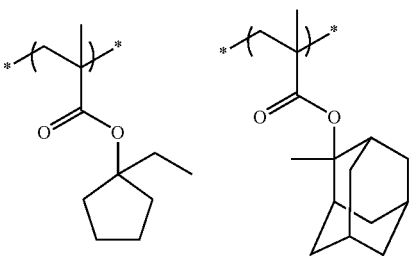
(35)
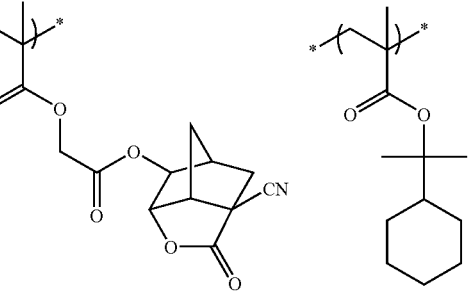
(36)
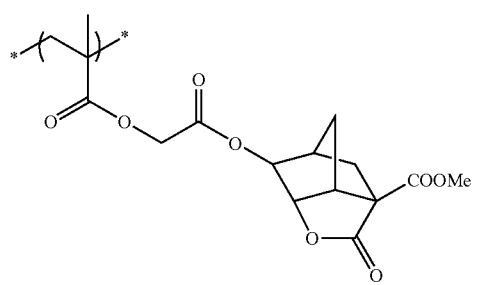
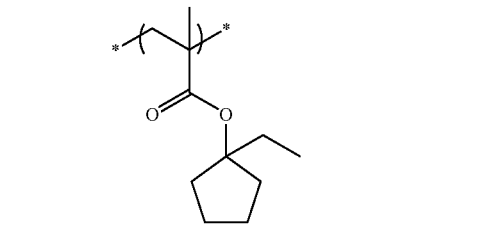
(37)
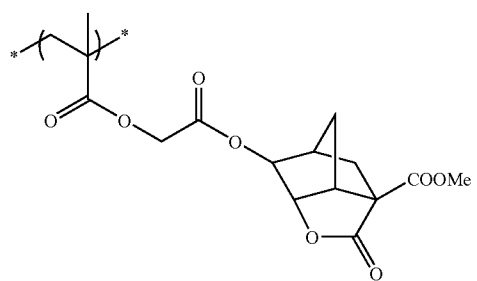
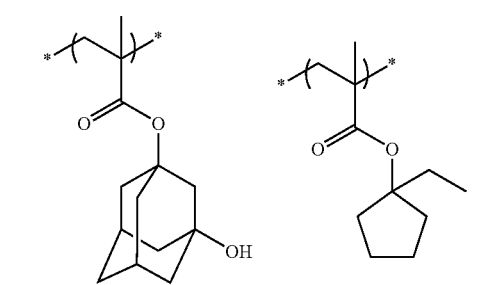

-continued

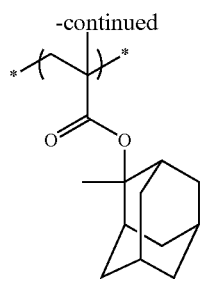

Examples 1 to 40 and Comparative Examples 1 and 2

<Preparation of Resist>

The components shown in Table 3 below were dissolved in a solvent to prepare a solution having a solid content concentration of 5 mass %, and the obtained solution was filtered through a polyethylene filter having a pore size of 0.1 μm to prepare an actinic ray-sensitive or radiation-sensitive resin composition. The prepared actinic ray-sensitive or radiation-sensitive resin composition was evaluated by the following methods, and the results are shown in Table 3. As for each component in Table 3, when a plurality of kinds were used, the ratio is a ratio by mass.

(Exposure Condition (1), ArF Dry Exposure)

An organic antireflection film ARC29A (produced by Nissan Chemical Industries, Ltd.) was coated on a silicon wafer and baked at 205° C. for 60 seconds to form a 78 nm-thick antireflection film. The actinic ray-sensitive or radiation-sensitive resin composition prepared was coated thereon and baked at 85° C. for 60 seconds to form a 120 nm-thick resist film. The obtained wafer was exposed using an ArF excimer laser scanner (PAS5500/1100, manufactured by ASML, NA: 0.75) through a 6% halftone mask having a 1:1 line-and-space pattern of 72 nm. Thereafter, the wafer was heated at 85° C. for 60 seconds, then developed with an aqueous tetramethylammonium hydroxide solution (2.38 mass %) for 30 seconds, rinsed with pure water and spin-dried to obtain a resist pattern.

[Evaluation of DOF]

The focal depth width for reproducing the line width of 72 nm±10% with an optimal exposure amount was observed. A larger value indicates a wider defocus latitude and is better.

[Evaluation of Development Defect]

The actinic ray-sensitive or radiation-sensitive resin composition was uniformly coated on a 8-inch hexamethyldisilazane-treated silicon substrate by a spin coater and dried under heating at 120° C. for 60 seconds on a hot plate to form a resist film of 0.10 μm in thickness. This resist film was heated on a hot plate at 110° C. for 90 seconds without performing exposure, developed with an aqueous tetramethylammonium hydroxide solution having a concentration of 2.38 wt % at 23° C. for 60 seconds, then rinsed with pure water for 30 seconds and dried. The thus-obtained sample wafer was measured for the number of development defects by means of KLA2360 (manufactured by KLA Tencol K.K.). At this time, the value obtained is shown after normalization by the number of defects in Comparative Example 1, that is taken as 1. A smaller numerical value indicates that the performance in terms of development defect is more excellent.

TABLE 3

| Example | Polymer No. (6.5 g) | (B) Photoacid Generator (g) | Basic Compound (g) | Surfactant (g) | Dissolution Inhibiting Compound (g) | Organic Solvent (by mass) | DOF (μm) | Development Defect (after normalization) |
|---|---|---|---|---|---|---|---|---|
| 1 | 1 | z2 (0.5) | DIA (0.07) | W-5 (0.02) | — | A1/B1 (6/4) | 0.6 | 0.053 |
| 2 | 2 | z38 (0.5) | DIA (0.05) | W-5 (0.02) | — | A1/B1 (6/4) | 0.6 | 0.071 |
| 3 | 3 | z2 (0.7) | DIA (0.1) | W-3 (0.02) | — | A1/B1 (7/3) | 0.5 | 0.155 |
| 4 | 4 | z38 (0.5) | DIA (0.05) | W-5 (0.02) | — | A1/B1 (7/3) | 0.5 | 0.133 |
| 5 | 5 | z2 (0.5) | DIA (0.05) | W-1 (0.02) | D-1 (0.1) | A1/B1 (7/3) | 0.4 | 0.230 |
| 6 | 6 | z2 (0.5) | DIA (0.1) | W-4 (0.02) | — | A1/B2 (9/1) | 0.6 | 0.058 |
| 7 | 7 | z38 (0.5) | PEA (0.05) | W-5 (0.02) | — | A1/B1 (7/3) | 0.5 | 0.080 |
| 8 | 8 | z38 (0.5) | DIA (0.05) | W-3 (0.04) | — | A1/B1 (7/3) | 0.5 | 0.066 |
| 9 | 9 | z38 (0.5) | DIA (0.1) | W-5 (0.02) | — | A1/B2 (9/1) | 0.4 | 0.097 |
| 10 | 10 | z38 (0.5) | PEA (0.05) | W-5 (0.02) | — | A2 | 0.4 | 0.128 |
| 11 | 11 | z2 (0.5) | DIA (0.05) | W-2 (0.02) | — | A1/B1 (7/3) | 0.6 | 0.080 |
| 12 | 12 | z2 (0.5) | DIA (0.1) | W-5 (0.02) | — | A1/B1 (6/4) | 0.6 | 0.093 |
| 13 | 13 | z2 (0.5) | DIA (0.07) | W-5 (0.02) | D-1 (0.1) | A1/B1 (3/7) | 0.4 | 0.150 |
| 14 | 13 | z2 (0.5) | DIA (0.04) | W-5 (0.02) | D-1 (0.1) | A1/B1 (3/7) | 0.4 | 0.128 |
| 15 | 14 | z2 (0.5) | TMEA (0.05) | W-5 (0.02) | — | A1/A3 (3/7) | 0.4 | 0.115 |
| 16 | 15 | z1 (0.5) | TBAH (0.1) | W-5 (0.02) | — | A1/B2 (9/1) | 0.4 | 0.199 |
| 17 | 16 | z2 (0.5) | DIA (0.01), PEA (0.04) | W-5 (0.02) | — | A1/B1 (7/3) | 0.4 | 0.171 |
| 18 | 17 | z2 (0.5) | DIA (0.05) | W-5 (0.02) | — | A1/B1 (3/7) | 0.5 | 0.155 |
| 19 | 18 | z1 (0.5) | DIA (0.05) | W-5 (0.02) | — | A1/A3 (3/7) | 0.4 | 0.186 |
| 20 | 19 | z2 (0.5) | DIA (0.05) | W-5 (0.02) | — | A2 | 0.4 | 0.208 |
| 21 | 21 | z66 (0.5) | DIA (0.05) | W-5 (0.02) | — | A1/B1 (6/4) | 0.6 | 0.086 |
| 22 | 22 | z66 (0.5) | TMEA (0.05) | W-5 (0.02) | — | A1/B1 (6/4) | 0.5 | 0.101 |
| 23 | 23 | z67 (0.5) | TMEA (0.05) | W-5 (0.02) | — | A1/B1 (6/4) | 0.5 | 0.106 |
| 24 | 24 | z69 (0.5) | TMEA (0.05) | W-5 (0.02) | — | A1/B1 (7/3) | 0.5 | 0.098 |
| 25 | 25 | z66 (0.5) | TMEA (0.05) | W-5 (0.02) | — | A1/B1 (6/4) | 0.5 | 0.113 |
| 26 | 26 | z72 (0.5) | DIA (0.05) | W-5 (0.02) | — | A1/B1 (6/4) | 0.5 | 0.135 |
| 27 | 27 | z69 (0.5) | DIA (0.05) | W-5 (0.02) | — | A1/B1 (6/4) | 0.4 | 0.153 |
| 28 | 28 | z78 (0.5) | DHA (0.05) | W-5 (0.02) | — | A1/B1 (6/4) | 0.4 | 0.145 |
| 29 | 29 | z90 (0.5) | DIA (0.05) | W-3 (0.02) | — | A1/B1 (6/4) | 0.4 | 0.146 |
| 30 | 30 | z68 (0.5) | DIA (0.05) | W-5 (0.02) | — | A1/B1 (6/4) | 0.5 | 0.125 |
| 31 | 31 | z73 (0.5) | DIA (0.05) | W-2 (0.02) | — | A1/B1 (7/3) | 0.5 | 0.136 |
| 32 | 32 | z67 (0.5) | TMEA (0.05) | W-4 (0.02) | — | A1/B1 (7/3) | 0.5 | 0.129 |
| 33 | 33 | z70 (0.5) | DIA (0.05) | W-1 (0.02) | — | A1/B1 (6/4) | 0.5 | 0.135 |
| 34 | 34 | z67 (0.5) | DHA (0.05) | W-3 (0.04) | — | A1/B1 (6/4) | 0.4 | 0.139 |

TABLE 3-continued

| Example | Polymer No. (6.5 g) | (B) Photoacid Generator (g) | Basic Compound (g) | Surfactant (g) | Dissolution Inhibiting Compound (g) | Organic Solvent (by mass) | DOF (μm) | Development Defect (after normalization) |
|---|---|---|---|---|---|---|---|---|
| 35 | 35 | z69 (0.5) | DHA (0.05) | W-5 (0.02) | — | A1/B1 (6/4) | 0.4 | 0.142 |
| 36 | 36 | z66 (0.5) | DIA (0.05) | W-5 (0.02) | — | A1/B1 (6/4) | 0.6 | 0.075 |
| 37 | 37 | z66 (0.5) | DIA (0.05) | W-5 (0.02) | — | A1/B1 (6/4) | 0.6 | 0.088 |
| 38 | 38 | z66 (0.5) | DIA (0.05) | W-5 (0.02) | — | A1/B1 (6/4) | 0.4 | 0.201 |
| 39 | 39 | z66 (0.5) | DIA (0.05) | W-5 (0.02) | — | A1/B1 (6/4) | 0.5 | 0.153 |
| 40 | 40 | z69 (0.5) | DIA (0.05) | W-5 (0.02) | — | A1/B1 (6/4) | 0.5 | 0.148 |
| Comparative Example 1 | Comparison 1 | z38 (0.5) | DIA (0.05) | W-5 (0.02) | — | A2/B1 (7/3) | 0.2 | 1.000 |
| Comparative Example 2 | Comparison 2 | z38 (0.5) | DIA (0.05) | W-5 (0.02) | — | A2/B1 (7/3) | 0.2 | 0.814 |

Abbreviations in the Table are as follows.
[Basic Compound]
DIA: 2,6-diisopropylaniline
TBAH: tetrabutylammonium hydroxide
TMEA: tris(methoxyethoxyethyl)amine
PEA: N-phenyldiethanolamine
DHA: N,N-dihexylaniline
[Surfactant]
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Troysol S-366 (produced by Troy Chemical)
W-4: PF656 (produced by OMNOVA, fluorine-containing)
W-5: PF6320 (produced by OMNOVA, fluorine-containing)
[Solvent]
A1: propylene glycol monomethyl ether acetate (PGMEA)
A2: cyclohexanone
A3: γ-butyrolactone
B1: propylene glycol monomethyl ether (PGME)
B2: ethyl lactate
[Dissolution Inhibiting Compound]
D-1: tert-butyl lithocholate As apparent from Table 3, the actinic ray-sensitive or radiation-sensitive resin composition of the present invention is improved in terms of DOF and development defect in the ArF dry exposure.

Examples 41 to 68 and Comparative Examples 3 and 4

<Preparation of Resist>

The components shown in Table 4 below were dissolved in a solvent to prepare a solution having a solid content concentration of 5 mass %, and the obtained solution was filtered through a polyethylene filter having a pore size of 0.1 μm to prepare an actinic ray-sensitive or radiation-sensitive resin composition. The prepared actinic ray-sensitive or radiation-sensitive resin composition was evaluated by the following methods, and the results are shown in Table 4. As for each component in Table 4, when a plurality of kinds were used, the ratio is a ratio by mass.

Incidentally, in Table 4, when the actinic ray-sensitive or radiation-sensitive resin composition contained a hydrophobic resin (HR), the mode of addition is denoted by "added", and when the actinic ray-sensitive or radiation-sensitive resin composition did not contain a hydrophobic resin (HR) and after the formation of a resist film, a topcoat protective film containing a hydrophobic resin (HR) was formed as an overlayer of the resist film, the mode of addition is denoted by "TC".

(Exposure Condition (2), Arf Immersion Exposure)

An organic antireflection film ARC29A (produced by Nissan Chemical Industries, Ltd.) was coated on a silicon wafer and baked at 205° C. for 60 seconds to form a 98 nm-thick antireflection film. The actinic ray-sensitive or radiation-sensitive resin composition prepared was coated thereon and baked at 130° C. for 60 seconds to form a 120 nm-thick resist film. The obtained wafer was exposed using an ArF excimer laser immersion scanner (XT1250i, manufactured by ASML, NA: 0.85) through a 6% halftone mask having a 1:1 line-and-space pattern of 65 nm. For the immersion liquid, ultrapure water was used. Thereafter, the wafer was heated at 130° C. for 60 seconds, developed with an aqueous tetramethylammonium hydroxide solution (2.38 mass %) for 30 seconds, rinsed with pure water and spin-dried to obtain a resist pattern. The DOF and development defect were evaluated in the same manner.

When the mode of addition of the hydrophobic resin (HR) is "TC", the following operation was performed after the formation of the resist film.

<Formation Method of Topcoat>

The hydrophobic resin (HR) shown in Table 4 was dissolved in a solvent, and the resulting solution was coated on the resist film by a spin coater. The wafer was dried under heating at 115° C. for 60 seconds to form a 0.05 nm-thick topcoat layer. At this time, the topcoat was observed for uneven coating and confirmed to be uniformly coated without coating unevenness.

The abbreviation of the solvent is as follows.
S-1: 2-ethylbutanol

TABLE 4

| Example | Polymer No (6.5 g) | (B) Photoacid Generator (g) | Basic Compound (g) | Surfactant (g) | Dissolution Inhibiting Compound (g) | Organic Solvent (by mass) |
|---|---|---|---|---|---|---|
| 41 | 1 | z2 (0.5) | DIA (0.07) | W-5 (0.02) | — | A1/B1 (6/4) |
| 42 | 7 | z38 (0.5) | PEA (0.05) | W-5 (0.02) | — | A1/B1 (7/3) |

TABLE 4-continued

| | | | | | | | |
|---|---|---|---|---|---|---|---|
| 43 | 12 | z2 (0.5) | | DIA (0.1) | W-5 (0.02) | — | A1/B1 (6/4) |
| 44 | 6 | z2 (0.5) | | DIA (0.1) | W-4 (0.02) | — | A1/B2 (9/1) |
| 45 | 9 | z38 (0.5) | | DIA (0.1) | W-5 (0.02) | — | A1/B2 (9/1) |
| 46 | 21 | z66 (0.5) | | DIA (0.05) | W-5 (0.02) | — | A1/B1 (6/4) |
| 47 | 22 | z66 (0.5) | | TMEA (0.05) | W-5 (0.02) | — | A1/B1 (6/4) |
| 48 | 23 | z67 (0.5) | | TMEA (0.05) | W-5 (0.02) | — | A1/B1 (6/4) |
| 49 | 24 | z69 (0.5) | | TMEA (0.05) | W-5 (0.02) | — | A1/B1 (7/3) |
| 50 | 25 | z66 (0.5) | | TMEA (0.05) | W-5 (0.02) | — | A1/B1 (6/4) |
| 51 | 26 | z72 (0.5) | | DIA (0.05) | W-5 (0.02) | — | A1/B1 (6/4) |
| 52 | 27 | z69 (0.5) | | DIA (0.05) | W-5 (0.02) | — | A1/B1 (6/4) |
| 53 | 28 | z78 (0.5) | | DHA (0.05) | W-5 (0.02) | — | A1/B1 (6/4) |
| 54 | 29 | z90 (0.5) | | DIA (0.05) | W-3 (0.02) | — | A1/B1 (6/4) |
| 55 | 30 | z68 (0.5) | | DIA (0.05) | W-5 (0.02) | — | A1/B1 (6/4) |
| 56 | 31 | z73 (0.5) | | DIA (0.05) | W-2 (0.02) | — | A1/B1 (7/3) |
| 57 | 32 | z67 (0.5) | | TMEA (0.05) | W-4 (0.02) | — | A1/B1 (7/3) |
| 58 | 33 | z70 (0.5) | | DIA (0.05) | W-1 (0.02) | — | A1/B1 (6/4) |
| 59 | 34 | z67 (0.5) | | DHA (0.05) | W-3 (0.04) | — | A1/B1 (6/4) |
| 60 | 35 | z69 (0.5) | | DHA (0.05) | W-5 (0.02) | — | A1/B1 (6/4) |
| 61 | 36 | z66 (0.5) | | DIA (0.05) | W-5 (0.02) | — | A1/B1 (6/4) |
| 62 | 37 | z66 (0.5) | | DIA (0.05) | W-5 (0.02) | — | A1/B1 (6/4) |
| 63 | 38 | z66 (0.5) | | DIA (0.05) | W-5 (0.02) | — | A1/B1 (6/4) |
| 64 | 39 | z66 (0.5) | | DIA (0.05) | W-5 (0.02) | — | A1/B1 (6/4) |
| 65 | 40 | z69 (0.5) | | DIA (0.05) | W-5 (0.02) | — | A1/B1 (6/4) |
| 66 | 20 | z1 (0.25), z66 (0.25) | | DIA (0.05) | W-5 (0.02) | — | A1/B1 (6/4) |
| 67 | 36 | z2 (0.25), z69 (0.25) | | DIA (0.05) | W-5 (0.02) | — | A1/B1 (6/4) |
| 68 | 37 | z1 (0.25), z90 (0.25) | | DIA (0.05) | W-5 (0.02) | — | A1/B1 (6/4) |
| Comparative Example 3 | Comparison 1 | z38 (0.5) | | DIA (0.05) | W-5 (0.02) | — | A2/B1 (7/3) |
| Comparative Example 4 | Comparison 2 | z38 (0.5) | | DIA (0.05) | W-5 (0.02) | — | A2/B1 (7/3) |

| Example | Hydrophobic Resin (g) | Mode of Addition | Solvent in Case of TC | DOF (µm) | Development Defect (after normalization) |
|---|---|---|---|---|---|
| 41 | HR-22 | TC | S-1 | 0.6 | 0.132 |
| 42 | HR-26 (0.1) | added | — | 0.4 | 0.148 |
| 43 | HR-8 (0.5) | added | — | 0.5 | 0.141 |
| 44 | HR-68 (0.5) | added | — | 0.6 | 0.075 |
| 45 | HR-68 (0.5) | added | — | 0.4 | 0.113 |
| 46 | HR-68 (0.5) | added | — | 0.6 | 0.135 |
| 47 | HR-70 (0.5) | added | — | 0.5 | 0.146 |
| 48 | HR-74 (0.5) | added | — | 0.4 | 0.135 |
| 49 | HR-78 (0.5) | added | — | 0.5 | 0.142 |
| 50 | HR-83 (0.5) | added | — | 0.4 | 0.143 |
| 51 | HR-29 (0.5) | added | — | 0.5 | 0.165 |
| 52 | HR-11 (0.5) | added | — | 0.4 | 0.163 |
| 53 | HR-71 (0.5) | added | — | 0.5 | 0.153 |
| 54 | HR-76 (0.5) | added | — | 0.4 | 0.175 |
| 55 | HR-78 (0.5) | added | — | 0.5 | 0.135 |
| 56 | HR-83 (0.5) | added | — | 0.4 | 0.154 |
| 57 | HR-11 (0.5) | added | — | 0.5 | 0.134 |
| 58 | HR-78 (0.5) | added | — | 0.6 | 0.145 |
| 59 | HR-68 (0.5) | added | — | 0.4 | 0.165 |
| 60 | HR-83 (0.5) | added | — | 0.4 | 0.154 |
| 61 | HR-11 (0.5) | added | — | 0.6 | 0.122 |
| 62 | HR-68 (0.5) | added | — | 0.6 | 0.113 |
| 63 | HR-11 (0.5) | added | — | 0.4 | 0.256 |
| 64 | HR-78 (0.5) | added | — | 0.5 | 0.189 |
| 65 | HR-83 (0.5) | added | — | 0.6 | 0.168 |
| 66 | HR-41 (0.5) | added | — | 0.5 | 0.141 |
| 67 | HR-41 (0.5) | added | — | 0.5 | 0.139 |
| 68 | HR-68 (0.5) | added | — | 0.5 | 0.146 |
| Comparative Example 3 | HR-22 | TC | S-1 | 0.2 | 1.000 |
| Comparative Example 4 | HR-26 (0.5) | added | — | 0.2 | 0.850 |

As apparent from Table 4, the actinic ray-sensitive or radiation-sensitive resin composition of the present invention is improved in terms of DOF and development defect in the ArF immersion exposure.

According to the present invention, an actinic ray-sensitive or radiation-sensitive resin composition improved in the DOF and development defect, a pattern forming method using the composition, a polymer compound which is used for fine pattern formation in the production of a semiconductor and excellent in the solvent solubility and affinity for developer, and a novel polymerizable compound for the production of the polymer compound, can be provided. The actinic ray-sensitive or radiation-sensitive resin composition of the present invention is suitable particularly as a positive photosensitive composition, for example, a positive resist composition containing a resin capable of increasing the solubility in an alkali developer by the action of an acid (so-called, an acid-decomposable resin) and a compound capable of generating an acid upon irradiation with an actinic ray or radiation (so-called a photoacid generator).

The entire disclosure of each and every foreign patent application from which the benefit of foreign priority has been claimed in the present application is incorporated herein by reference, as if fully set forth.

What is claimed is:

1. An actinic ray-sensitive or radiation-sensitive resin composition, comprising:
(A) a resin capable of increasing a solubility of the resin in an alkali developer by an action of an acid; and
(B) a compound capable of generating an acid upon irradiation with an actinic ray or radiation,
wherein the resin (A) contains a repeating unit represented by the following formula:

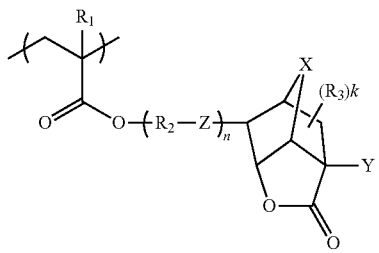

wherein $R_1$ represents a hydrogen atom, an alkyl group which may have a substituent, or a halogen atom;
$R_2$ represents a chain alkylene group which may have a substituent, and when a plurality of $R_2$'s are present, the plurality of $R_2$'s are the same or different;
$R_3$ represents an alkyl group which may have a substituent or a cycloalkyl group which may have a substituent, and when a plurality of $R_3$'s are present, the plurality of $R_3$'s are the same or different, and two $R_3$'s may combine to form a ring:
X represents an alkylene group which may have a substituent, an oxygen atom or a sulfur atom;
Y represents an electron-withdrawing group:
Z represents an ester bond;
k is the number of substituents and represents an integer of 0 to 8; and
n is the number of repetitions and represents an integer of 1 to 5;
and further wherein the resin (A) contains a repeating unit having an acid-decomposable group represented by the following formula (A):

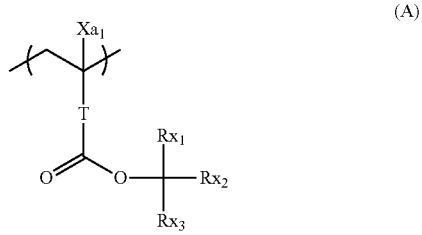

wherein Xa1 represents a hydrogen atom, a methyl group, a trifluoromethyl group or a hydroxymethyl group,
T represents a single bond or a divalent linking group, and
Rx1 to Rx3 each independently represent a linear or branched alkyl group or a mono- or poly-cyclic cycloalkyl group, provided that at least two of Rx1 to Rx3 combine to form a monocyclic cycloalkyl group,
and further wherein the resin (A) contains no fluorine atom and no silicon atom.

2. The actinic ray-sensitive or radiation-sensitive resin composition according to claim 1,
wherein the resin as the component (A) contains a repeating unit represented by formula:

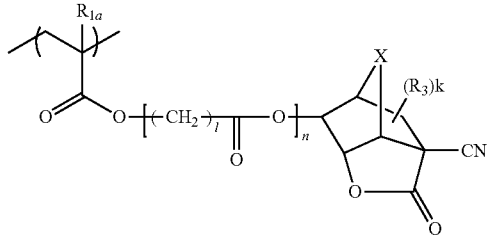

wherein $R_{1a}$ represents a hydrogen atom, an alkyl group which may have a substituent;
$R_3$ represents an alkyl group which may have a substituent or a cycloalkyl group which may have a substituent, and when a plurality of $R_3$'s are present, the plurality of $R_3$'s are the same or different, and two $R_3$'s may combine to form a ring;
X represents an alkylene group which may have a substituent, an oxygen atom or a sulfur atom;
k is the number of substituents and represents an integer of 0 to 8;
l is the number of repetitions and represents an integer of 1 to 5; and
n is the number of repetitions and represents an integer of 1 to 5.

3. A pattern forming method, comprising:
forming a film from the actinic ray-sensitive or radiation-sensitive resin composition according to claim 1; and
exposing and developing the film.

4. The actinic ray-sensitive or radiation-sensitive resin composition according to claim 1, wherein $R_2$ is a methylene group, and n is 1.

5. The actinic ray-sensitive or radiation-sensitive resin composition according to claim 1, wherein Y is a cyano group.

6. The actinic ray-sensitive or radiation-sensitive resin composition according to claim 1, wherein the monocyclic cycloalkyl group formed by combining at least two of Rx1 to Rx3 is cyclopentyl group.

7. The actinic ray-sensitive or radiation-sensitive resin composition according to claim 1, wherein the resin (A) contains at least two kinds of repeating units having a lactone group.

8. The actinic ray-sensitive or radiation-sensitive resin composition according to claim 7, wherein the resin (A) contains another repeating unit containing a group having a lactone structure other than the repeating unit containing a group having a lactone structure defined in claim 1 in an amount of 15 to 60 mol %.

9. The actinic ray-sensitive or radiation-sensitive resin composition according to claim 7, wherein the resin (A) contains another repeating unit containing a group having a lactone structure other than the repeating unit containing a group having a lactone structure defined in claim 1 in an amount of 20 to 50 mol %.

10. The actinic ray-sensitive or radiation-sensitive resin composition according to claim 7, wherein the resin (A) contains another repeating unit containing a group having a lactone structure other than the repeating unit containing a group having a lactone structure defined in claim 1 in an amount of 30 to 50 mol %.

11. The actinic ray-sensitive or radiation-sensitive resin composition according to claim 1, wherein the resin composition further contains a hydrophobic resin.

12. The actinic ray-sensitive or radiation-sensitive resin composition according to claim 11, wherein the hydrophobic resin contains at least either one of a fluorine atom and a silicon atom.

13. The actinic ray-sensitive or radiation-sensitive resin composition according to claim 12, wherein the amount of hydrophobic resin is 0.1 to 10 mass %, based on the entire solids content of the resin composition.

14. The actinic ray-sensitive or radiation-sensitive resin composition according to claim 13, wherein the amount of hydrophobic resin is 0.1 to 5 mass %, based on the entire solids content of the resin composition.

15. The actinic ray-sensitive or radiation-sensitive resin composition according to claim 1, wherein the resin (A) contains at least two repeating units represented by the formula (A).

16. The actinic ray-sensitive or radiation-sensitive resin composition according to claim 1, wherein the resin (A) contains the repeating unit containing a group having a lactone structure defined in claim 1 in an amount of 15 to 75 mol %, based on all repeating units in the resin (A).

17. The actinic ray-sensitive or radiation-sensitive resin composition according to claim 1, wherein the resin (A) contains the repeating unit containing a group having a lactone structure defined in claim 1 in an amount of 15 to 50 mol %, based on all repeating units in the resin (A).

18. The actinic ray-sensitive or radiation-sensitive resin composition according to claim 1, wherein the resin (A) contains another repeating unit containing a group having a lactone structure other than the repeating unit containing a group having a lactone structure defined in claim 1 in an amount of 30 to 50 mol %.

* * * * *